United States Patent [19]
Nakajima

[11] Patent Number: 6,088,261
[45] Date of Patent: Jul. 11, 2000

[54] SEMICONDUCTOR STORAGE DEVICE

[75] Inventor: Tatsuo Nakajima, Tokyo, Japan

[73] Assignee: Nippon Steel Corporation, Tokyo, Japan

[21] Appl. No.: 09/132,502

[22] Filed: Aug. 11, 1998

[30] Foreign Application Priority Data

| Aug. 12, 1997 | [JP] | Japan | 9-230273 |
| Dec. 9, 1997 | [JP] | Japan | 9-356229 |
| Dec. 9, 1997 | [JP] | Japan | 9-356230 |
| Dec. 9, 1997 | [JP] | Japan | 9-356232 |

[51] Int. Cl.[7] ................................................. G11C 13/00
[52] U.S. Cl. ................................. 365/185.01; 365/185.1
[58] Field of Search ........................... 365/185.01, 185.1, 365/189.01, 230.01, 230.03

[56] References Cited

U.S. PATENT DOCUMENTS 4,527,257  7/1985  Cricchi ............................. 365/185.01

FOREIGN PATENT DOCUMENTS

| 2-146200 | 6/1990 | Japan . |
| 3-248251 | 11/1990 | Japan . |
| 6-282992 | 10/1994 | Japan . |

*Primary Examiner*—Terrell W. Fears
*Attorney, Agent, or Firm*—Pollock, Vande Sande & Amernick

[57] ABSTRACT

In a write operation, input data sequences "00", "01", "10", and "11" are converted into identification number groups "00", "02", "20", and "22", respectively, and the individual figures are stored in a pair of three-level memory cells. If a data error occurs during a read operation, the probable transition is only a transition from an upper state in which electric charge is stored in a memory cell to a lower state in which electric charge is reduced, i.e., only a first transition of only one of the identification numbers from state "2" to state "1" or from state "1" to state "0". Error correction is performed by taking account of this property, and a correct data sequence is output. This allows very efficient and accurate error correction when multi-level data using three or more values is written or read out.

3 Claims, 27 Drawing Sheets

DATA SEQUENCE

CONNECTED TO EEPROM

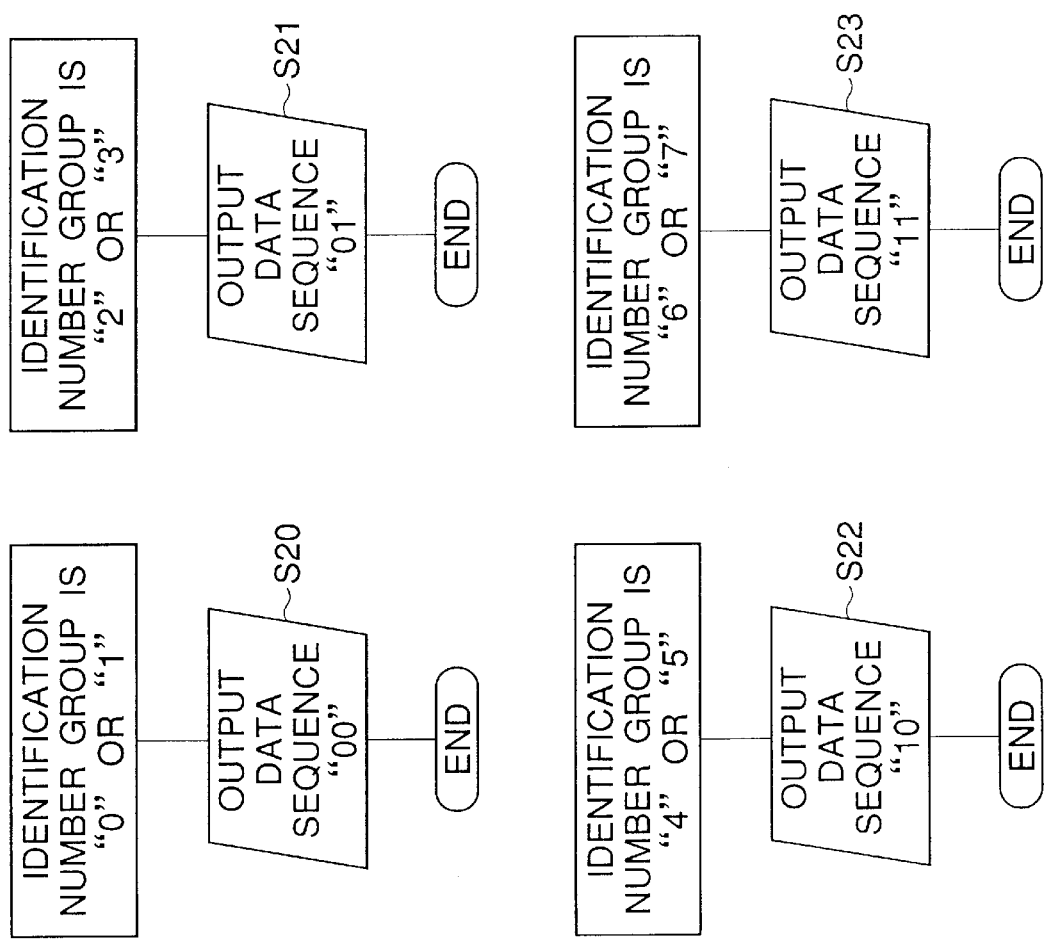

SEMICONDUCTOR STORAGE DEVICE

BACKGROUND OF THE INVENTION

1. Field of the Invention

The present invention relates to a semiconductor memory for storing a data sequence formed by adding redundancy bits identical with information bits to the information bits, methods of using and reading the semiconductor memory, and a storage medium storing the using and reading methods.

2. Description of the Related Art

Generally, when storage data is written in a memory cell array of a semiconductor memory including a nonvolatile semiconductor memory, error correction data of the storage data is added as redundancy bits. In reading out the storage data from the memory cell array, whether the contents have an error is checked. If an error is found, this error is corrected, and the corrected data is output as readout data. In this error correction, to be able to correct a t-bit error by adding m-bit error correction data to n-bit storage data, $$\sum_{t=1_{m+n}}^{t} C_t + 1 \le 2^m \quad (1)$$

must be satisfied.

According to this expression (1), to correct a 1-bit error which occurs most frequently, it is necessary to add m-bit error correction data meeting $$m+n+1 \le 2^m \quad (2)$$

for t=1

According to this expression (2), to correct a 1-bit error for 1-bit storage data, error correction data having two or more bits is necessary. To correct 1-bit error for two bits storage data, error correction data having three or more bits is necessary.

As described above, to correct a 1-bit error for storage data, error correction data longer than the storage data is necessary. Therefore, the above method is extremely inefficient as an error correction method.

Additionally, for semiconductor memories in which 1-bit data, i.e., "0" or "1" is stored in each memory cell, a method of performing error correction with certain high efficiency has been developed. However, the development of multi-level (multi-valued) semiconductor memories in which data to be stored in each memory cell has two or more bits has not been accomplished yet, so no error correction method for these memories is known. Even if a certain correction method may have been proposed, the method is presumably inferior in efficiency to Hamming correction and the like because one element of a multi-level semiconductor memory stores a larger amount of information than that stored in one element of a single-level semiconductor memory.

Japanese Patent Laid-Open No. 6-282992 has disclosed a nonvolatile semiconductor memory which stores storage information together with a parity bit in a memory cell and thereby increases the capacity of the memory and improves the reliability of data. Also, Japanese Patent Laid-Open Nos. 2-146200 and 3-248251 have disclosed nonvolatile semiconductor memories with an error correction function. However, these methods require tedious operation of generating error vectors in error detection. In addition, these methods are techniques applicable only to common nonvolatile semiconductor memories. None of the patent specifications cited above refer to multi-level semiconductor memories.

SUMMARY OF THE INVENTION

It is an object of the present invention to provide a semiconductor memory capable of efficiently and accurately performing error correction by adding very short redundancy bits to information bits and suitably applicable particularly to a memory cell capable of storing one of selectable data having three or more values, methods of using and reading the semiconductor memory, and a storage medium storing the using and reading methods.

A semiconductor memory of the present invention is a semiconductor memory comprising a plurality of semiconductor memory cells each having a charge storage layer and a gate electrode to write an information bit by storing or emitting (extracting) electric charge in or from said charge storage layer by applying a predetermined voltage to said gate electrode and read out the information bit by checking a charge storage state in said charge storage layer, wherein bits forming a data sequence obtained by adding a redundancy bit identical with the information bit to the information bit are written in and read out from corresponding semiconductor memory cells, the data sequence is read out by using a property that a probability of a second transition from a state in which electric charge is emitted from said charge storage layer to a state in which electric charge is stored therein is negligibly small compared to a probability of a first transition from the state in which electric charge is stored in said charge storage layer to the state in which electric charge is emitted therefrom, and error correction is performed assuming that an error has occurred due to the first transition if it is determined that the number of bits corresponding to the state in which electric charge is stored in said charge storage layer or the state in which electric charge is emitted therefrom is an odd number in the data sequence.

Preferably, by using a property that, similar to the second transition, a probability of a third transition of not less than two bits in the data sequence from the state in which electric charge is emitted from said charge storage layer to the state in which electric charge is stored therein is negligibly small compared to the probability of the first transition, error correction is performed assuming that an error has occurred only in one bit due to the first transition if it is determined that the number of bits corresponding to the state in which electric charge is stored in said charge storage layer or the state in which electric charge is emitted therefrom is an odd number in the data sequence.

Preferably, said semiconductor memory cell comprises a floating gate as said charge storage layer and a control gate as said gate electrode.

Another aspect of the semiconductor memory of the present invention comprises storage means in which a plurality of memory cells each having a charge storage layer and a gate electrode are arranged in a matrix manner, and bits forming a data sequence obtained by adding a redundancy bit identical with an information bit having a predetermined value to the information bit are stored in said memory cells, and reading means for selecting a predetermined memory cell from said storage means, detecting the bits stored in said memory cells to form the data sequence, and, by using a property that a probability of a second transition from a state in which electric charge is emitted from said charge storage layer to a state in which electric charge is stored therein is negligibly small compared to a probability of a first transition from the state in which electric charge is stored in said charge storage layer to the state in which electric charge is emitted therefrom, performing error correction assuming that an error has occurred due to the first transition if it is determined that the number of bits corresponding to the state in which electric charge is stored in said charge storage layer or the state in which electric charge is emitted therefrom is an odd number in the data sequence.

Preferably, by using a property that, similar to the second transition, a probability of a third transition of not less than two bits in the data sequence from the state in which electric charge is emitted from said charge storage layer to the state in which electric charge is stored therein is negligibly small compared to the probability of the first transition, said reading means performs error correction assuming that an error has occurred only in one bit in accordance with the first transition if it is determined that the number of bits corresponding to the state in which electric charge is stored in said charge storage layer or the state in which electric charge is emitted therefrom is an odd number in the data sequence.

Preferably, said semiconductor memory cell has a semiconductor device comprising a floating gate as said charge storage layer and a control gate as said gate electrode.

Preferably, said semiconductor device further comprises switching means capable of switching said memory cell for storing the redundancy bit from a redundancy bit memory cell to an information bit memory cell and vice versa, said memory cell being used as a memory cell for storing only the information bit.

A method of reading a semiconductor memory according to the present invention is a method of reading a semiconductor memory comprising a plurality of semiconductor memory cells each having a charge storage layer and a gate electrode to write an information bit by storing or emitting electric charge in or from said charge storage layer by applying a predetermined voltage to said gate electrode and read out the information bit by checking a charge storage state in said charge storage layer, wherein a predetermined one of bits forming a data sequence obtained by adding a redundancy bit identical with the information bit to the information bit is stored in each semiconductor memory cell, the stored data sequence is read out by using a property that a probability of a second transition from a state in which electric charge is emitted from said charge storage layer to a state in which electric charge is stored therein is negligibly small compared to a probability of a first transition from the state in which electric charge is stored in said charge storage layer to the state in which electric charge is emitted therefrom, and error correction is performed assuming that an error has occurred due to the first transition if it is determined that the number of bits corresponding to the state in which electric charge is stored in said charge storage layer or the state in which electric charge is emitted therefrom is an odd number in the data sequence.

Preferably, by using a property that, similar to the second transition, a probability of a third transition of not less than two bits in the data sequence from the state in which electric charge is emitted from said charge storage layer to the state in which electric charge is stored therein is negligibly small compared to the probability of the first transition, error correction is performed assuming that an error has occurred only in one bit due to the first transition if it is determined that the number of bits corresponding to the state in which electric charge is stored in said charge storage layer or the state in which electric charge is emitted therefrom is an odd number in the data sequence.

Preferably, said semiconductor memory cell comprises a floating gate as said charge storage layer and a control gate as said gate electrode.

Another aspect of the method of reading a semiconductor memory according to the present invention is a method of reading a semiconductor memory comprising a plurality of semiconductor memory cells each having a charge storage layer and a gate electrode to write an information bit by storing or emitting electric charge in or from said charge storage layer by applying a predetermined voltage to said gate electrode and read out the information bit by checking a charge storage state in said charge storage layer, wherein states in which electric charge is stored in and emitted from said charge storage layer of said semiconductor memory cell are defined as "1" and "0", respectively, and said semiconductor memory cell stores a predetermined one of bits forming a data sequence obtained by adding a redundancy bit identical with the information bit to the information bit, comprising the first step of reading out the bits from said semiconductor memory cells to form the data sequence, the second step of counting "0"s or "1"s in the data sequence, the third step of checking whether the counted number is an even number or an odd number, the fourth step of outputting the data sequence without correcting the data sequence if the counted number is found to be an even number in the third step, the fifth step of checking whether the information bit and the redundancy bit in the data sequence are different bits if the counted number is found to be an odd number in the third step, and the sixth step of outputting the bits checked in the fifth step by correcting "0" to "1".

A storage medium of the present invention is a storage medium storing the first to sixth steps of said method in a computer readable form.

Still another aspect of the method of reading a semiconductor memory according to the present invention is a method of reading a semiconductor memory comprising a plurality of semiconductor memory cells each having a charge storage layer and a gate electrode to write an information bit by storing or emitting electric charge in or from said charge storage layer by applying a predetermined voltage to said gate electrode and read out the information bit by checking a charge storage state in said charge storage layer, wherein states in which electric charge is stored in and emitted from said charge storage layer are defined as "1" and "0", respectively, and said semiconductor memory cell stores a predetermined one of bits forming a data sequence obtained by adding a redundancy bit identical with the information bit to the information bit, comprising the first step of reading out the bits from said semiconductor memory cells to form the data sequence, the second step of counting "0"s or "1"s in the data sequence the third step of checking whether the counted number is an even number or an odd number the fourth step of outputting the data sequence without correcting the data sequence if the counted number is found to be an even number in the third step, and the fifth step of outputting the data sequence by correcting the data sequence to "11" if the counted number is found to be an odd number in the third step.

A storage medium of the present invention is a storage medium storing the first to fifth steps of said method in a computer readable form.

Still another aspect of the method of reading a semiconductor memory according to the present invention is a method of reading a semiconductor memory comprising a plurality of semiconductor memory cells each having a charge storage layer and a gate electrode to write two information bits by storing or emitting electric charge in or from said charge storage layer by applying a predetermined voltage to said gate electrode and read out the information bits by checking a charge storage state in said charge storage layer, wherein states in which electric charge is stored in and emitted from said charge storage layer of said semiconductor memory cell are defined as "1" and "0", respectively, and said semiconductor memory cell stores a predetermined one of bits forming a four bits data sequence obtained by adding two redundancy bits identical with the two information bits to the information bits, comprising the first step of reading out the data sequence, the second step of counting "1"s in the data sequence, the third step of checking whether the counted number is an even number or an odd number, the fourth step of outputting the data sequence without correcting the data sequence if the counted number is found to be an even number in the third step, the fifth step of checking whether the counted number is one or three if the counted number is found to be an odd number in the third step, the sixth step of outputting the data sequence by correcting the data sequence to "1111" if the counted number is found to be three in the third step, the seventh step of checking whether a bit position is an even-numbered position or an odd-numbered position from a most significant bit in the data sequence if the counted number is found to be one in the fifth step, the eighth step of outputting the data sequence by correcting the data sequence to "1010" if the bit position is found to be an even-numbered position in the seventh step, and the ninth step of outputting the data sequence by correcting the data sequence to "0101" if the bit position is found to be an odd-numbered position in the seventh step.

Preferably, said semiconductor memory cell comprises a floating gate as said charge storage layer and a control gate as said gate electrode.

A storage medium of the present invention is a storage medium storing the first to ninth steps of said method in a computer readable form.

Still another aspect of the semiconductor memory of the present invention is a semiconductor memory comprising a plurality of memory cells having a charge storage layer, a gate electrode, and a source/drain to change a charge storage state step by step in said charge storage layer by applying a predetermined voltage to at least said gate electrode and said source/drain, identification numbers defined in a one-to-one correspondence with the storage states being written and read out by checking a charge storage state in said charge storage layer, wherein a possible number of identification numbers is set to be larger than a possible number of input data sequences, at least alternate ones of predetermined identification numbers are assigned to the data sequences and stored in corresponding memory cells, a property that a probability of a second transition from a lower state in which electric charge is emitted from said charge storage layer to an upper state in which electric charge is stored therein is negligibly small compared to a probability of a first transition from the upper state in which electric charge is stored in said charge storage layer to the lower state in which electric charge is emitted therefrom is used, if an error occurs when the identification numbers are read out from said memory cells, error correction is performed by regarding the error as occurring in accordance with the first transition, and the data sequences are output on the basis of the assignment.

Preferably, a property that a probability of a third transition of not less than two steps from the upper state in which electric charge is stored in said charge storage layer to the lower state in which electric charge is reduced in said memory cells corresponding to the identification numbers is negligibly small compared to the probability of the first transition of only one of said memory cells is used.

Preferably, each figure of the data sequence is binary information data.

Preferably, the identification number corresponding to the data sequence is an identification number group including a plurality of identification numbers, and each identification number is written in/read out from a corresponding memory cell.

Preferably, a property that a probability of a fourth transition of not less than two memory cells of said memory cells corresponding to the identification numbers of the identification number group from the upper state in which electric charge is stored in said charge storage layer to the lower state in which electric charge is reduced is negligibly small compared to the probability of the first transition of only one of said memory cells is used.

Preferably, said memory cell comprises a floating gate as said charge storage layer and a control gate as said gate electrode.

Preferably, a possible number of identification numbers is set to be twice a possible number of input data sequences, and alternate ones of predetermined identification numbers are assigned to the data sequences and stored in corresponding memory cells.

Still another aspect of the semiconductor memory of the present invention is a semiconductor memory comprising a plurality of memory cells having a charge storage layer, a gate electrode, and a source/drain to change a charge storage state step by step in said charge storage layer by applying a predetermined voltage to at least said gate electrode and said source/drain, identification numbers defined in a one-to-one correspondence with the storage states being written and read out by checking a charge storage state in said charge storage layer, comprising encoding means for converting input data sequences into at least alternate predetermined ones of identification numbers more than a possible number of data sequences, storage means having said memory cells arranged in a matrix manner to store the identification numbers in corresponding memory cells, and decoding means for detecting an identification number stored in a selected predetermined memory cell, reading out the identification number from said memory cell by performing error correction, if an error occurs in the identification number, assuming that the error has occurred due to a first transition from an upper state in which electric charge is stored in said charge storage layer to a lower state in which electric charge is emitted therefrom by using a property that a probability of a second transition from the lower state in which electric charge is emitted from said charge storage layer to the upper state in which electric charge is stored therein is negligibly small compared to a probability of the first transition, decoding the identification number into the data sequence on the basis of the conversion, and outputting the data sequence.

Preferably, a property that a probability of a third transition of not less than two steps from the upper state in which electric charge is stored in said charge storage layer to the lower state in which electric charge is reduced in said memory cells corresponding to the identification numbers is negligibly small compared to the probability of the first transition of only one of said memory cells.

Preferably, each figure of the data sequence is binary information data.

Preferably, the identification number corresponding to the data sequence is an identification number group including a plurality of identification numbers, and each identification number is written in/read out from a corresponding memory cell.

Preferably, a property that a probability of a fourth transition of not less than two memory cells of said memory cells corresponding to the identification numbers of the identification number group from the upper state in which electric charge is stored in said charge storage layer to the lower state in which electric charge is reduced is negligibly small compared to the probability of the first transition of only one of said memory cells is used.

Preferably, said memory cell comprises a floating gate as said charge storage layer and a control gate as said gate electrode.

Preferably, said semiconductor device further comprises switching means for using said memory cell as a memory cell for storing only the data sequence.

A method of using a semiconductor memory according to the present invention is a method of using a semiconductor memory comprising a plurality of memory cells having a charge storage layer, a gate electrode, and a source/drain to change a charge storage state step by step in said charge storage layer by applying a predetermined voltage to at least said gate electrode and said source/drain, identification numbers defined in a one-to-one correspondence with the storage states being written and read out by checking a charge storage state in said charge storage layer, comprising the first step of converting input data sequences into at least alternate predetermined ones of identification numbers more than a possible number of data sequences, the second step of writing the identification numbers in corresponding memory cells, and the third step of detecting an identification number stored in a selected predetermined memory cell, reading out the identification number from said memory cell by performing error correction, if an error occurs in the identification number, assuming that the error has occurred due to a first transition from an upper state in which electric charge is stored in said charge storage layer to a lower state in which electric charge is emitted therefrom by using a property that a probability of a second transition from the lower state in which electric charge is emitted from said charge storage layer to the upper state in which electric charge is stored therein is negligibly small compared to a probability of the first transition, setting a possible number of identification numbers to be larger than a possible number of input data sequences, assigning the predetermined identification numbers to the data sequences, decoding the identification number into the data sequence on the basis of the conversion, and outputting the data sequence.

Preferably, a property that a probability of a third transition of not less than two steps from the upper state in which electric charge is stored in said charge storage layer to the lower state in which electric charge is reduced in said memory cells corresponding to the identification numbers is negligibly small compared to the probability of the first transition of only one of said memory cells is used.

Preferably, each figure of the data sequence is binary information data.

Preferably, the identification number corresponding to the data sequence is an identification number group including a plurality of identification numbers, and each identification number is written in/read out from a corresponding memory cell.

Preferably, a property that a probability of a fourth transition of not less than two memory cells of said memory cells corresponding to the identification numbers of the identification number group from the upper state in which electric charge is stored in said charge storage layer to the lower state in which electric charge is reduced is negligibly small compared to the probability of the first transition of only one of said memory cells is used.

Preferably, said memory cell comprises a floating gate as said charge storage layer and a control gate as said gate electrode.

A storage medium of the present invention is a storage medium storing the first to third steps of the method mentioned above in a computer readable form.

Still another aspect of the semiconductor memory of the present invention is a semiconductor memory comprising a plurality of semiconductor memory cells having a charge storage layer, a gate electrode, and a source/drain to change a charge storage state step by step in said charge storage layer by applying a predetermined voltage to at least said gate electrode and said source/drain, identification numbers defined in a one-to-one correspondence with the storage states being written and read out by checking a charge storage state in said charge storage layer, wherein bits forming a data sequence obtained by adding a redundancy bit identical with the information bit to the information bit are written in and read out from corresponding semiconductor memory cells, the data sequence is read out by using a property that a probability of a second transition from a state in which electric charge is emitted from said charge storage layer to a state in which electric charge is stored therein is negligibly small compared to a probability of a first transition from the state in which electric charge is stored in said charge storage layer to the state in which electric charge is emitted therefrom, and ORs of corresponding bits of the information bit and the redundancy bit forming the readout data sequence are calculated to reconstruct a data sequence, and the reconstructed data sequence is output assuming that the reconstructed data sequence is equal to the information bit.

Preferably, a property that, similar to the second transition, a probability of a third transition of not less than two bits in the data sequence from the state in which electric charge is emitted from said charge storage layer to the state in which electric charge is stored therein is negligibly small compared to the probability of the first transition is used, and ORs of corresponding bits of the information bit and the redundancy bit forming the readout data sequence are calculated to reconstruct a data sequence, and the reconstructed data sequence is output assuming that the reconstructed data sequence is equal to the information bit.

Preferably, said semiconductor memory cell comprises a floating gate as said charge storage layer and a control gate as said gate electrode.

Still another aspect of the semiconductor memory of the present invention comprises converting means for forming a data sequence by adding a redundancy bit identical with an information bit having a predetermined number to the information bit, storage means in which a plurality of memory cells each including a charge storage layer and a gate electrode are arranged in a matrix manner and bits forming the data sequence are stored in corresponding memory cells, and correcting means for selecting predetermined memory cells from said storage means, detecting the bits stored in said memory cells to form the data sequence, calculating ORs of corresponding bits of the information bit and the redundancy bit of the data sequence to reconstruct a data sequence by using a property that a probability of a second transition from a state in which electric charge is emitted from said charge storage layer to a state in which electric charge is stored therein is negligibly small compared to a probability of a first transition from the state in which electric charge is stored in said charge storage layer to the state in which electric charge is emitted therefrom, and outputting the reconstructed data sequence assuming that the reconstructed data sequence is equal to the information bit.

Preferably, said correcting means calculates ORs of corresponding bits of the information bit and the redundancy bit forming the readout data sequence to reconstruct a data sequence by using a property that, similar to the second transition, a probability of a third transition of not less than two bits in the data sequence from the state in which electric charge is emitted from said charge storage layer to the state in which electric charge is stored therein is negligibly small compared to the probability of the first transition, and outputting the reconstructed data sequence assuming that the reconstructed data sequence is equal to the information bit.

Preferably, said memory cell has a semiconductor device comprising a floating gate as said charge storage layer and a control gate as said gate electrode.

Preferably, said semiconductor device further comprises switching means capable of switching said memory cell for storing the redundancy bit from a redundancy bit memory cell to an information bit memory cell and vice versa, said memory cell being used as a memory cell for storing only the information bit.

Another aspect of the method of using a semiconductor memory according to the present invention is a method of using a semiconductor memory comprising a plurality of semiconductor memory cells having a charge storage layer, a gate electrode, and a source/drain to change a charge storage state step by step in said charge storage layer by applying a predetermined voltage to at least said gate electrode and said source/drain, identification numbers defined in a one-to-one correspondence with the storage states being written and read out by checking a charge storage state in said charge storage layer, wherein said semiconductor memory cells store a data sequence formed by adding a redundancy bit identical with the information bit to the information bit, the stored data sequence is read out by using a property that a probability of a second transition from a state in which electric charge is emitted from said charge storage layer to a state in which electric charge is stored therein is negligibly small compared to a probability of a first transition from the state in which electric charge is stored in said charge storage layer to the state in which electric charge is emitted therefrom, and ORs of corresponding bits of the information bit and the redundancy bit forming the readout data sequence are calculated to reconstruct a data sequence, and the reconstructed data sequence is output assuming that the reconstructed data sequence is equal to the information bit.

Preferably, a property that, similar to the second transition, a probability of a third transition of not less than two bits in the data sequence from the state in which electric charge is emitted from said charge storage layer to the state in which electric charge is stored therein is negligibly small compared to the probability of the first transition is used, and ORs of corresponding bits of the information bit and the redundancy bit forming the readout data sequence are calculated to reconstruct a data sequence, and the reconstructed data sequence is output assuming that the reconstructed data sequence is equal to the information bit.

Preferably, said semiconductor memory cell comprises a floating gate as said charge storage layer and a control gate as said gate electrode.

Preferably, the information bit and the redundancy bit corresponding to the information bit are stored by the same number of figures.

Still another aspect of the method of using a semiconductor memory according to the present invention is a method of using a semiconductor memory comprising a plurality of semiconductor memory cells having a charge storage layer, a gate electrode, and a source/drain to change a charge storage state step by step in said charge storage layer by applying a predetermined voltage to at least said gate electrode and said source/drain, identification numbers defined in a one-to-one correspondence with the storage states being written and read out by checking a charge storage state in said charge storage layer, wherein said semiconductor memory cells store a data sequence formed by adding a redundancy bit identical with the information bit to the information bit, comprising the first step of reading out the bits from said semiconductor memory cells to form the data sequence, and the second step of calculating ORs of bits in corresponding positions of the information bit and the redundancy bit forming the readout data sequence to reconstruct a data sequence, and outputting the reconstructed data sequence assuming that the reconstructed data sequence is equal to the information bit.

Preferably, said semiconductor memory cell comprises a floating gate as said charge storage layer and a control gate as said gate electrode.

A storage medium of the present invention is a storage medium storing the first and second steps of said method in a computer readable form.

Still another aspect of the semiconductor memory of the present invention is a nonvolatile semiconductor device comprising multi-level nonvolatile memory cells each settable at a threshold level selected at least among a first, a second and a third threshold levels, said multi-level nonvolatile memory cell comprising a control gate, charge storage layer and source/drain, said charge storage layer being capable of storing electric charges, said threshold levels and said electric charges having relations, first charges corresponding to said first threshold level, second charges corresponding to said second threshold level, third charges corresponding to said third threshold level, said third charges being larger than the second charges, and said first charges being smaller than the second charges, the probability of transition from said second charges to said third charges being smaller than the probability of transition from said third charges to said second charges, and the probability of transition from said first charges to said second charges being smaller than the probability of transition from said second charges to said first charges, said device further comprising setting means for setting said multi-level nonvolatile memory cell at a predetermined threshold level and means for identifying said threshold level in order of higher probability of transition when said threshold level set by said setting means has transferred to another threshold level.

In volatile semiconductor memories such as a DRAM, the probability that a first transition from a state wherein electric charge is stored in a charge storage layer of each semiconductor memory cell to a state wherein electric charge is emitted therefrom will occur is usually almost equal to the probability that a second transition from the charge emitted state to the charge stored state will occur. On the other hand, in nonvolatile semiconductor memories such as an EEPROM, the probability that the second transition will occur is negligibly small compared to the probability that the first transition will occur. In addition, the probability that a third transition of two or more bits in a data sequence from the charge stored state to the charge emitted state will take place is negligibly small, like the probability of the second transition, compared to the probability of the first transition. The present invention positively uses this property.

More specifically, redundancy bits identical with information bits are added to the information bits, and writes and reads are performed by using a data sequence having a number of bits twice the number of information bits. To read out this data sequence, an error that has occurred in this data sequence is assumed to have resulted from the first transition and corrected by preferably also taking account of the third transition. That is, the possibilities of the second and third transitions are excluded, and only the possibility of the first transition is taken into consideration. Of the bits forming the data sequence, if the number of bits (the number of "1"s or "0"s) corresponding to a state (e.g., "1") wherein electric charge is stored in a charge storage layer of each semiconductor memory cell or a state (e.g., "0") wherein electric charge is emitted therefrom is an odd number, it is determined that an error has occurred in the data sequence. Accordingly, bits corresponding to the first transition are corrected (from "0" to "1" in this example), and the corrected data is output.

Also, in the present invention only the possibility of the first transition is considered by excluding the possibilities of the second and third transitions. That is, if a data error occurs, presumably a change of only one bit in a data sequence from "1" to "0" occurs. If this is the case, even if a data error occurs in one of an information bit and a redundancy bit forming a data sequence, the other bit corresponding to the bit having the data error is read out as "1" without any data error. If no data error occurs, one of two corresponding bits is naturally "1" or "0" if the other bit is "1" or "0", respectively. Therefore, if these two corresponding bits are "1" and "0" or "0" and "1", the correct bit is "1". If the two bits are "1" and "1", the correct bit is "1". If the two bits are "0" and "0", the correct bit is "0". This amounts to the OR of the two corresponding bits. In the present invention, these ORs are calculated, and the calculated bits are arranged to reconstruct a data sequence. This data sequence is assumed to have correct information bits and output.

In the present invention as described above, a data sequence is formed by adding redundancy bits identical with information bits to the information bits. This data sequence is used to write/read to/from a semiconductor memory. When a read operation is performed, error correction can be simply and accuracy performed by taking account only of the first transition.

Also, a possible number of identification numbers is set to be larger than a possible number of input data sequences. Predetermined identification numbers are assigned to the data sequences and written in and read out from corresponding memory cells. When a data sequence is to be read out, an error that has occurred in the identification number is assumed to have resulted from the first transition and corrected by preferably also taking account of the third transition. That is, the possibilities of the second and third transitions are excluded, and only the possibility of the first transition is taken into consideration. If an identification number changes, this change is only a one-step change from a state wherein the amount of electric charge in a charge storage layer is large to a state wherein the electric charge amount is small. By using this property, the aforementioned assignment is performed such that no identification numbers duplicate (have the same value) when an identification number changes due to such one-step change. Consequently, the original correct data is uniquely determined from the identification numbers changing on the basis of this assignment rule.

In the present invention as described above, an input data sequence is converted into identification numbers in accordance with the above assignment rule and read out by taking account only of the first transition. Consequently, it is possible to simply and accuracy perform error correction and obtain a correct data sequence with high probability.

In the present invention, it is possible to extremely shorten redundancy bits to be added to information bits and efficiently and accurately perform error correction. More specifically, redundancy bits for error correction identical with information bits are added to the information bits to allow easy and reliable error correction.

Additionally, in the present invention, only by adding redundancy bits identical with information bits to the information bits, error correction can be performed very easily and reliably regardless of the number of information bits.

Furthermore, in the present invention, when writes and reads are performed for multi-level data using three or more values, error correction can be done very efficiently and accurately even if the integration degree is further increased.

BRIEF DESCRIPTION OF THE DRAWINGS

FIG. 38 is a continuation of FIG. 37, and shows the method of using the EEPROM in the eighth embodiment of the present invention.

DETAILED DESCRIPTION OF THE PREFERRED EMBODIMENTS

Several preferred embodiments of the present invention will be described in detail below with reference to the accompanying drawings.

First Embodiment

Figure 1:
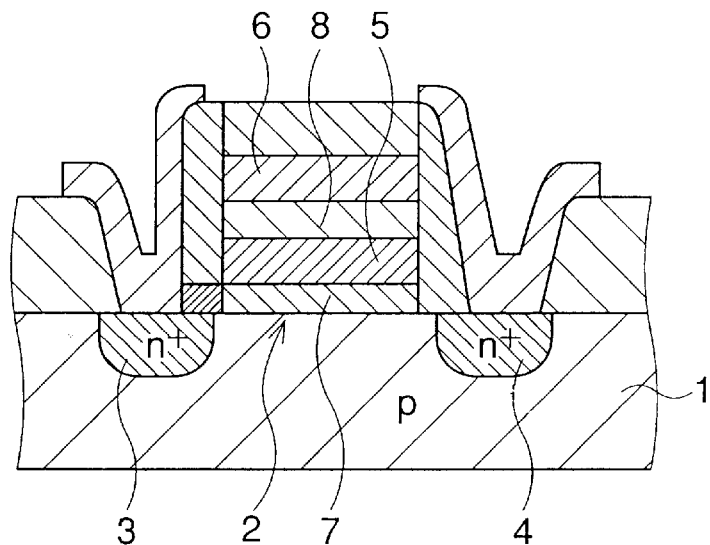
FIG. 1 is a schematic sectional view showing the major components of a memory cell constructing an EEPROM according to the first to eighth embodiments of the present invention.
Figure 2:
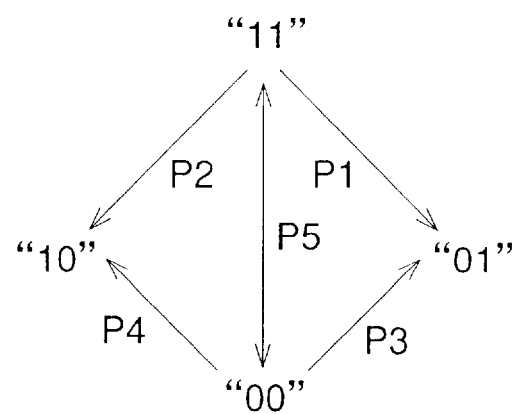
FIG. 2 is a schematic view showing the way an error occurs on the basis of transition probabilities in the first embodiment of the present invention.
Figure 3:
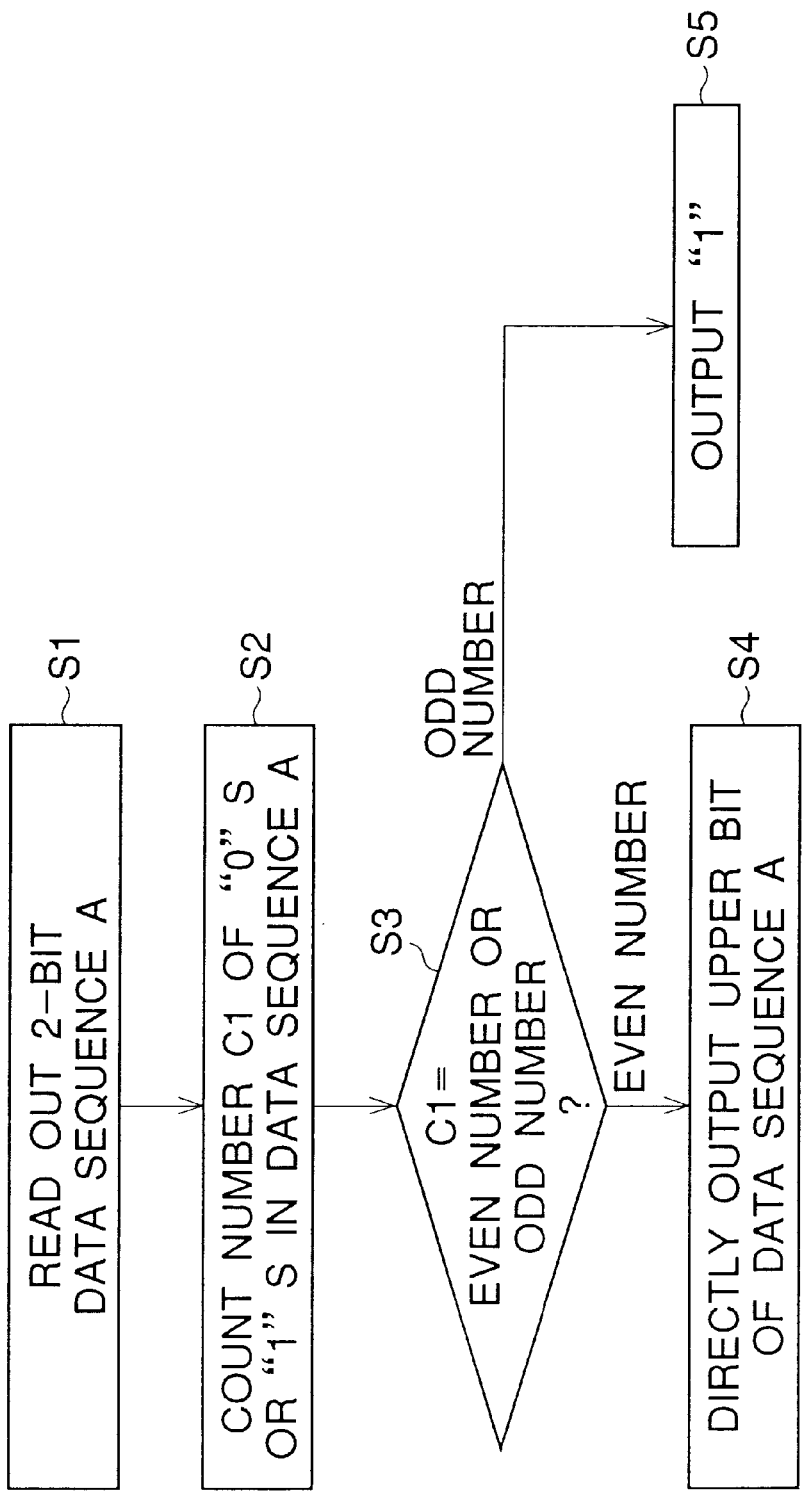
FIG. 3 is a flow chart for performing error correction during a read operation in the first embodiment of the present invention.
Figure 4:
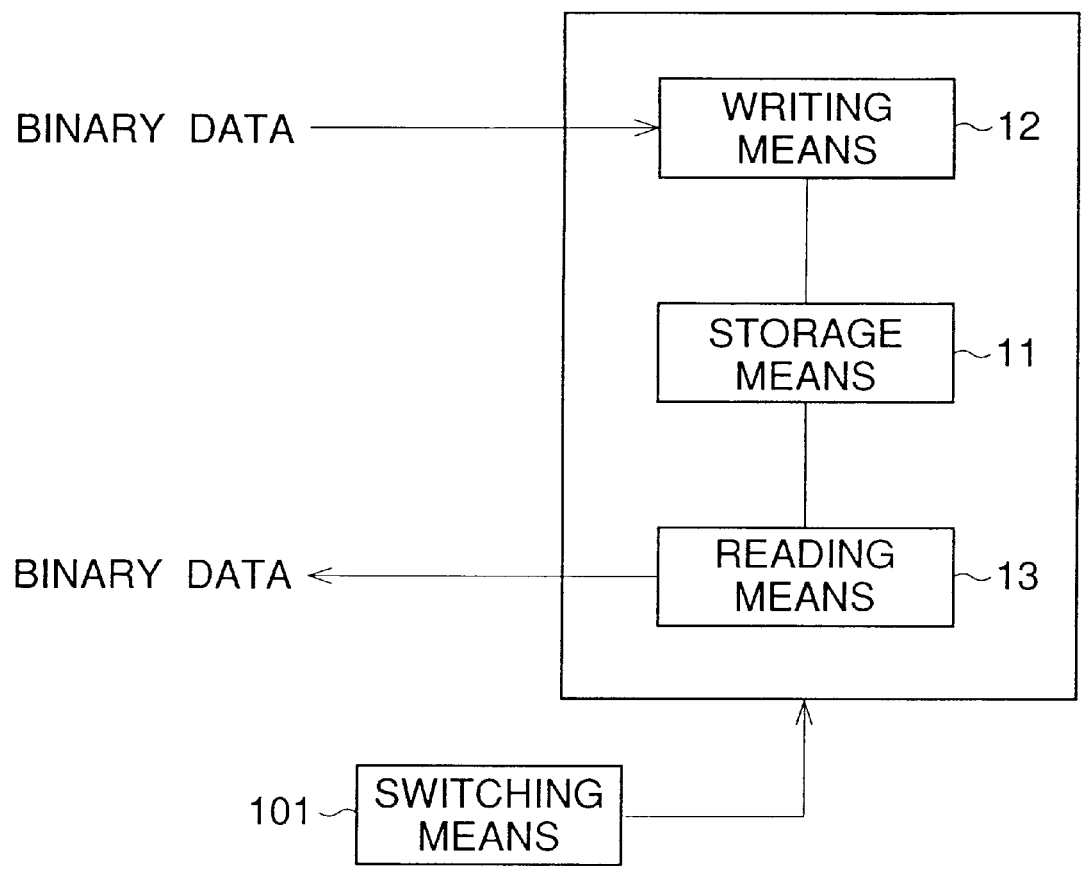
FIG. 4 is a block diagram showing the main parts of the EEPROM according to the first and second embodiments of the present invention.

The first embodiment of the present invention will be described below. In this first embodiment, an EEPROM as a nonvolatile semiconductor memory capable of storing two-level(two-valued)(1-bit) information in each memory cell is used to perform writes and reads of a data sequence (two bits) obtained by adding a two-level (1-bit) redundancy bit for error correction to a two-level (1-bit) information bit. FIG. 1 is a schematic sectional view showing the main components of each memory cell as a building unit of the EEPROM of the first embodiment. FIG. 2 is a schematic view showing the way an error occurs on the basis of transition probabilities. FIG. 3 is a flow chart for performing error correction during a read operation. FIG. 4 is a block diagram of this EEPROM.

As shown in FIG. 4, the EEPROM of the first embodiment includes a storage means 11, a writing means 12, and a reading means 13. In the storage means 11, a plurality of memory cells are arranged in a matrix manner. The writing means 12 selects two predetermined memory cells from the storage means 11. The writing means 12 stores an information bit in one of these two memory cells as an information memory cell. The writing means stores a redundancy bit identical with the information data in the other memory cell as a redundancy memory cell. The reading means 13 detects the binary data stored in these memory cells and forms a data sequence. If the data sequence has an error as will be described later, the reading means 13 corrects this error and outputs the corrected data sequence.

Each memory cell making up the storage means 11 has a structure as shown in FIG. 1. That is, on a p-type silicon semiconductor substrate 1, a source 3 and a drain 4 as a pair of impurity diffusion layers are formed by ion-implanting an n-type impurity such as phosphorus (P) or arsenic (As) into a surface region of an element active region 2 defined by an element isolation structure made from, e.g., a field oxide film. A floating gate electrode 5 as an electron capture layer is formed by patterning on a channel region C between the source 3 and the drain 4 via a tunnel oxide film 7. A control gate electrode 6 is formed by patterning on the floating gate electrode 5 via a dielectric film 8.

The writing means 12 applies a predetermined voltage to the source 3, the drain 4, and the control gate electrode 6 of a selected memory cell. Accordingly, electric charge is stored in or emitted from the floating gate electrode 5 to change the storage state.

In each memory cell, a state wherein electric charge is stored in the floating gate electrode 5 is defined as "1", and a state wherein electric charge is emitted from the floating gate electrode 5 is defined as "0". It is possible to write data sequences having two values ("00" and "11") in this EEPROM and read out data sequences having four values ("00", "01", "10", and "11") from this EEPROM by using two memory cells M1 and M2 as one unit. That is, of this one unit, storage data "0" or "1" is written for an information bit in the memory cell M1 and defined as an upper bit. A redundancy bit identical with the storage data is written for error correction in the other memory cell M2 and defined as a lower bit. One of data sequences ("00" and "11") is formed from the two memory cells M1 and M2 defining one unit. In a read operation, data sequences ("00", "01", "10", and "11") can be read out while a case wherein an error has occurred in a bit forming a data sequence as will be described later is taken into consideration. If an error is found, this error is corrected as will be described later, and the corrected data is output.

If a memory cell deteriorates after the EEPROM is used for long time periods, a data error sometimes occurs in this memory cell. The probability of transition from a state wherein electric charge is emitted from the floating gate electrode 5 to a state wherein electric charge is stored therein is much smaller than the probability of transition from the state wherein electric charge is stored in the floating gate electrode 5 to the state wherein electric charge is emitted therefrom. That is, the probability of transition from state "0" to state "1" is negligibly small compared to the probability of transition from state "0" to state "1". In addition, the probability of data errors occurring in both bits stored in the two memory cells M1 and M2, i.e., the probability of transition from state "1" to state "0" of both upper and lower bits of a data sequence is negligibly small compared to the probability of transition from state "1" to state "0" of one of the upper and lower bits. In the first embodiment, error correction is performed for a readout data sequence by using this inherent property of nonvolatile semiconductor memories represented by an EEPROM.

More specifically, as shown in FIG. 2, compared to probability P1 or P2 that a written data sequence "11" will change into a data sequence "01" or "10" when read out, probability P3 or P4 that a written data sequence "00" will change into a data sequence "01" or "10" when read out and probability P5 that a written data sequence "11" will change into a data sequence "00" when read out are very small and negligible.

Accordingly, if a readout data sequence is "01" or "10", this means that this data sequence has an error. This implies that the number of "0"s or "1"s in the data sequence is an odd number, when the fact that an information bit (upper bit) and a redundancy bit (lower bit) written in a unit of (two) memory cells are identical is taken into consideration. From the property of transition probability described above, the correct data sequence in this case is "11", the correct information bit is "1". Also, naturally, if a readout data sequence is "11" or "00", each data is the correct data sequence, the correct information bit is "1" or "0" in order.

A method of reading out a data sequence from the EEPROM while performing error correction by using the above property will be described below with reference to FIG. 3.

First, bits stored in memory cells are read out to form a two bits data sequence A (step S1).

A number C1 of "0"or "1"s in the readout data sequence A is counted (step S2).

Whether the number C1 counted in step S2 is an even number or odd number is checked (step S3).

If it is determined in step S3 that the number C1 is an even number, i.e., if the data sequence A is "00" or "11", the data sequence A has no error. Therefore, an upper bit (information bit) of this data sequence A is directly output (step S4).

On the other hand, if it is determined in step S3 that the number C1 is an odd number, i.e., if the data sequence A is "01" or "10", "1" is output (step S5).

In the EEPROM of the first embodiment as described above, error correction can be easily and reliably performed by adding 1-bit redundancy data to 1-bit information. In contrast, no conventional error correction techniques can do this without adding redundancy data having two or more bits to 1-bit information.

Note that this EEPROM includes a switching means 101 as shown in FIG. 4. This switching means 101 is used to switch between a case wherein a fixed number of memory cells (e.g., half) making up the storage means 11 are used for redundancy bits and a case wherein all of the memory cells are used for common information bits. That is, it is sometimes necessary to attach importance to the accuracy of information even at the sacrifice of the storage capacity to some extent. Conversely, the storage capacity must be fully utilized in some instances. The switching means 101 achieves such various purposes of the EEPROM.

Second Embodiment

Figure 5:
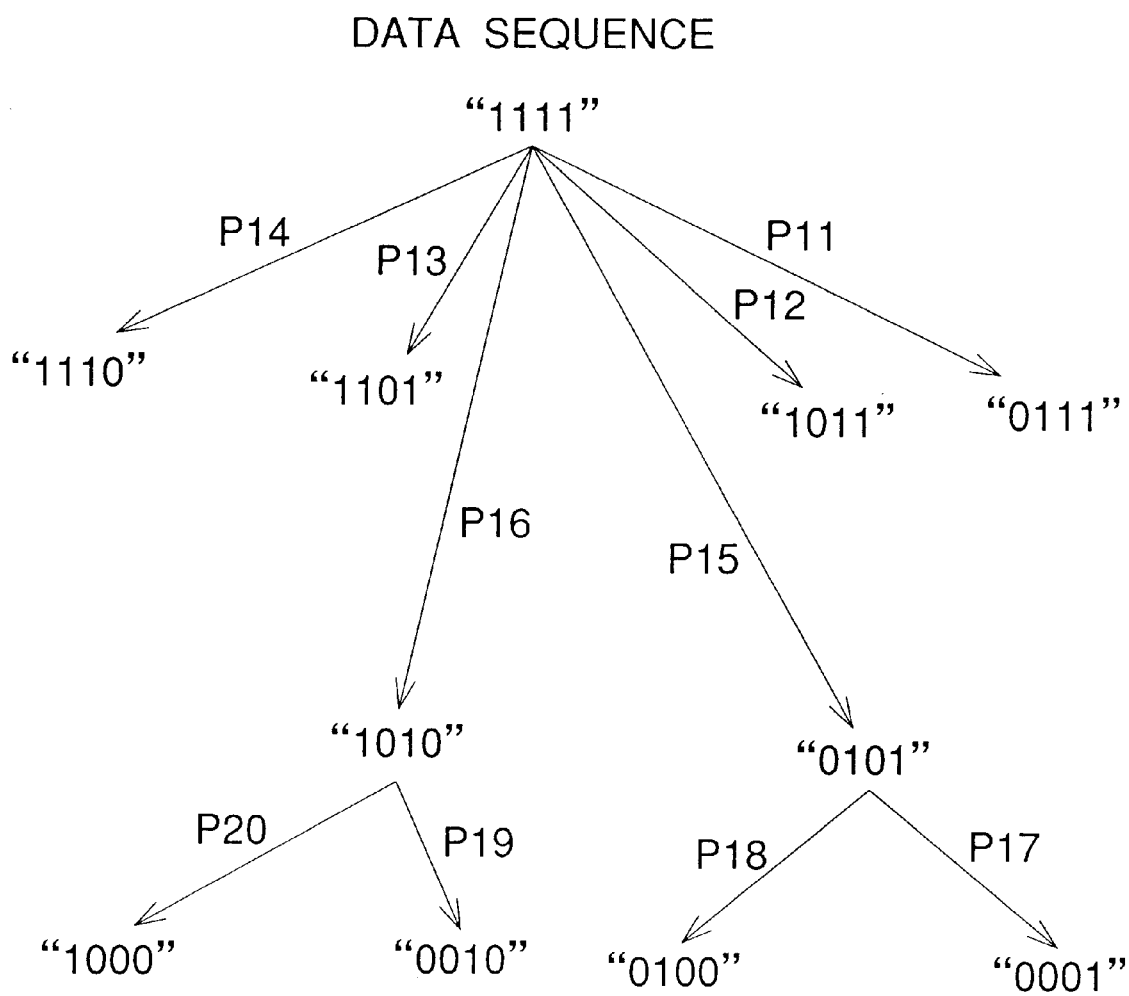
FIG. 5 is a schematic view showing the way an error occurs on the basis of transition probabilities in the second embodiment of the present invention.
Figure 6:
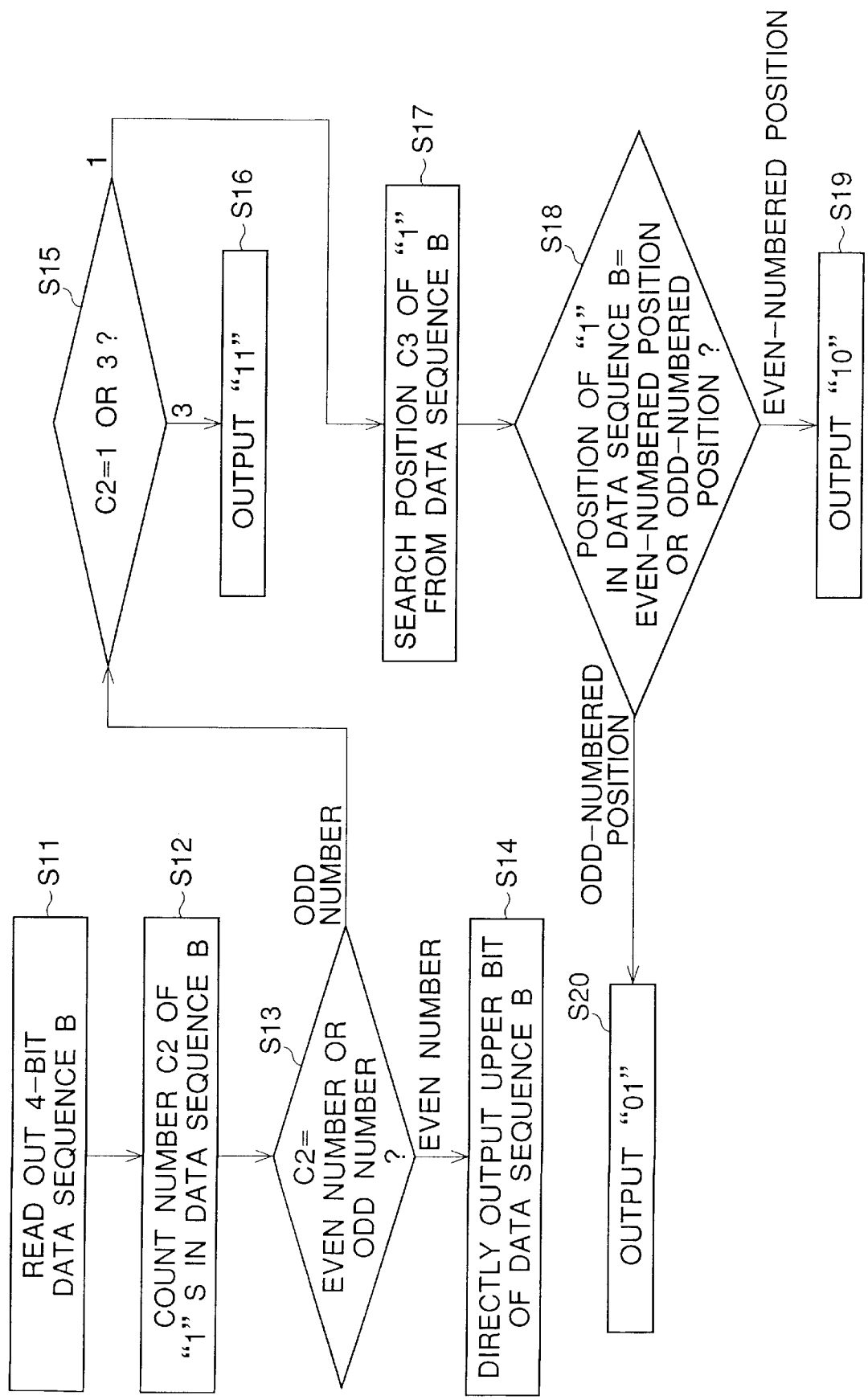
FIG. 6 is a flow chart for performing error correction during a read operation in the second embodiment of the present invention.

The second embodiment of the present invention will be described below. In this second embodiment, an EEPROM as a nonvolatile semiconductor memory capable of storing two-level (1-bit) information in each memory cell is used to write and read a data sequence (four bits) obtained by adding four-level (two bits) redundancy bits for error correction to four-level (two bits) information bits. FIG. 5 is a schematic view showing the way an error occurs on the basis of transition probabilities. FIG. 6 is a flow chart for performing error correction during a read operation. Note that outlines of the arrangements of the EEPROM and each memory cell in the second embodiment are the same as those shown in FIGS. 4 and 1 of the first embodiment.

In each memory cell, a state wherein electric charge is stored in a floating gate electrode 5 is defined as "1", and a state wherein electric charge is emitted from the floating gate electrode 5 is defined as "0". It is possible to write data sequences having four values ("0000", "0101", "1010", and "1111") in this EEPROM and read out data sequences having 16 values ("0000", "0001", "0010", "0011", "0100", "0101", "0110", "0111", "1000", "1001", "1010", "1011", "1100", "1101", "1110", "1111") from this EEPROM.

That is, of two memory cells M1 and M2 out of four memory cells M1 to M4 forming one unit, storage data "0" or "1" written in the memory cell M1 is defined as a most significant bit. Storage data "0" or "1" written in the other memory cell M2 is defined as a second most significant bit. One of four information bit values ("00", "01", "10", and "11") is formed from the most significant bit and the second most significant bit stored in these two memory cells M1 and M2.

Of the remaining two memory cells M3 and M4, the same bit as the storage data in the memory cell M1 is written in the memory cell M3. The same bit as the storage data in the memory cell M2 is written in the other memory cell M4. The bit stored in the memory cell M3 is defined as a third most significant bit (second least significant bit). The bit stored in the memory cell M4 is defined as a least significant bit. If this is the case, the third most significant bit and the least significant bit stored in these two memory cells M3 and M4 form the redundancy bits identical with the aforementioned information bits.

The bits from the most significant bit to the least significant bit stored in the memory cells M1 to M4 form data sequences having four values ("0000", "0101", "1010", and "1111").

In a read operation, data sequences having 16 values ("0000", "0001", "0010", "0011", "0100", "0101", "0110", "0111", "1000", "1001", "1010", "1011", "1100", "1101", "1110", "1111") can be formed from the bits read out from the memory cells M1 to M4, as an error might have occurred in a bit forming a data sequence as will be described later. If an error is found, this error is corrected as will be described later, and the corrected data is output.

In this second embodiment, as in the first embodiment, the probability of a transition from state "0" wherein electric charge is emitted from the floating gate electrode 5 to state "1" wherein electric charge is stored therein is much smaller than the probability of a transition from state "1" wherein electric charge is stored in the floating gate electrode 5 to state "0" wherein electric charge is emitted therefrom. In addition, the probability of data errors occurring in both bits stored in two memory cells out of the four memory cells M1 to M4, i.e., the probability of a transition from state "1" to state "0" in two or more bits in a data sequence is also small. Error correction is performed for a readout data sequence by using this property.

FIG. 5 shows a practical error correction method. Referring to FIG. 5, probability P15 or P16 that a written data sequence "1111" will change into a data sequence "0101" or "1010" when read out is negligibly small compared to probability P11, P12, P13, or P14 that a written data sequence "1111" will change into a data sequence "0111", "1011", "1101", or "1110" when read out.

Analogously, when the written data sequence is "0101", only probability P17 or P18 that this data sequence will change into a data sequence "0001" or "1010" when read out need to be considered if the probability of data error from "0" to "1" is ignored.

Also, when the written data sequence is "1010", only probability P19 or P20 that this data sequence will change into a data sequenc e "0010" or "1000" when read out need to be considered if the probability of data error from "0" to "1" is ignored.

When the written data sequence is "0000", this data sequence can be considered to remain "0000" with no error when read out if the probability of data error from "0" to "1" is ignored.

Accordingly, if the readout data sequence is any of "0111", "1011", and "1101", this data sequence has an error. This suggests that the number of "1"s in the data sequence is three when the fact that the information bits (two upper bits) written in the memory cells M1 and M2 and the redundancy bits (two lower bits) written in the memory cells M3 and M4 are identical is taken into consideration. In view of the property of transition probability described above, the correct data sequence in this case is "1111", the correct information bits are "11".

Similarly, if the readout data sequence is "0001" or "0100", this data sequence has an error. From the property of transition probability, the correct data sequence in this case is "0101", the correct information bits are "01". If the readout data sequence is "0010" or "1000", this data sequence has an error. Again from the property of transition probability, the correct data sequence in this case is "1010", the correct information bits are "10". Also, naturally, if a readout data sequence is "1111", "1010", "0101" or "0000", each data is the correct data sequence, the correct information bit is "11", "10", "01 or "00" in order.

From the foregoing, if the number of "1"s in a data sequence is one, this means that this data sequence has an error. Whether the correct data sequence is "0101" or "1010" can be checked by searching for the positions of "1"s in the data sequence from the least significant bit. If the positions are even-numbered positions, the data sequence is corrected to "1010". If the positions are odd-numbered positions, the data sequence is corrected to "0101".

A method of reading out a data sequence from the EEPROM while performing error correction by using the above property will be described below with reference to FIG. 6.

First, bits stored in the memory cells M1 to M4 are read out to form a four bits data sequence B (step S11).

A number C2 of "1"s in the readout data sequence B is counted (step S12).

Whether the number C2 counted in step S12 is an even number or an odd number is checked (step S13).

If it is determined in step S13 that the number C2 is an even number, i.e., if the data sequence B is "0000", "0101", "1010", or "1111", the data sequence B has no error. Therefore, the two upper bits (the information bits) of this data sequence B is directly output (step S14).

On the other hand, if it is determined in step S13 that the number C2 is an odd number, whether the number C2 is one or three is checked (step S15).

If it is determined in step S15 that the number C2 is three, i.e., if the data sequence B is "0111", "1011", "1101", or "1110", "11" are output (step S16).

If it is determined in step S15 that the number C2 is one, a position C3 of "1" in the data sequence B is searched for (step S17).

Next, whether the position C3 found in step S17 is an even-numbered position or an odd-numbered position from the least significant bit is checked (step S18).

If it is determined in step S18 that the position C3 is an even-numbered position, i.e., if the data sequence B is "0010" or "1000", "10" are output (step S19).

On the other hand, if it is determined in step S18 that the position C3 is an odd-numbered position, i.e., the data sequence B is "0001" or "0100", "01" are output (step S20).

In the EEPROM of the second embodiment as described above, error correction can be easily and reliably performed by adding two bits redundancy data to two bits information. In contrast, no conventional error correction techniques can do this without adding redundancy data having three or more bits to two bits information.

Note that this EEPROM includes a switching means 101 as shown in FIG. 4. This switching means 101 is used to switch between a case wherein a fixed number of memory cells forming a memory cell array 11 are used for redundancy bits for error correction and a case wherein all of the memory cells are used for common information bits. That is, it is sometimes necessary to attach importance to the accuracy of information even at the sacrifice of the storage capacity to some extent. Conversely, the storage capacity must be fully utilized in some instances. The switching means 101 achieves such various purposes of the EEPROM.

Note also that in the second embodiment, a data sequence is formed by adding two redundancy bits identical with two information bits to these information bits. It is also possible to perform writes and reads by forming a data sequence by adding two redundancy bits, whose bit positions are opposite to those of two information bits, to these two information bits.

The present invention includes program codes for operating various devices to realize the functions of the write and read methods explained with reference to FIGS. 3 and 5 in the first and second embodiments, and means for supplying the program codes to a computer, e.g., a storage medium storing the program codes. As a storage medium for storing the program codes, it is possible to use a floppy disk, a hard disk, an optical disk, a magnetooptical disk, a CD-ROM, a magnetic tape, a nonvolatile memory card, or a ROM.

Also, not only when the functions of the first and second embodiments are realized by executing supplied program codes by a computer, but also when the program codes cooperate with an OS (Operating System) or some other application software running on the computer and realize the functions of the first and second embodiments, the present invention includes these program codes.

Furthermore, the present invention also includes a system wherein, after supplied program codes are written in a function extension board of a computer or in a memory of a function extension unit connected to the computer, a CPU or the like incorporated into the function extension board or the function extension unit partially or entirely performs an actual process in accordance with instructions from the program codes and realizes the functions of the first and second embodiments.

Third Embodiment

Figure 7:
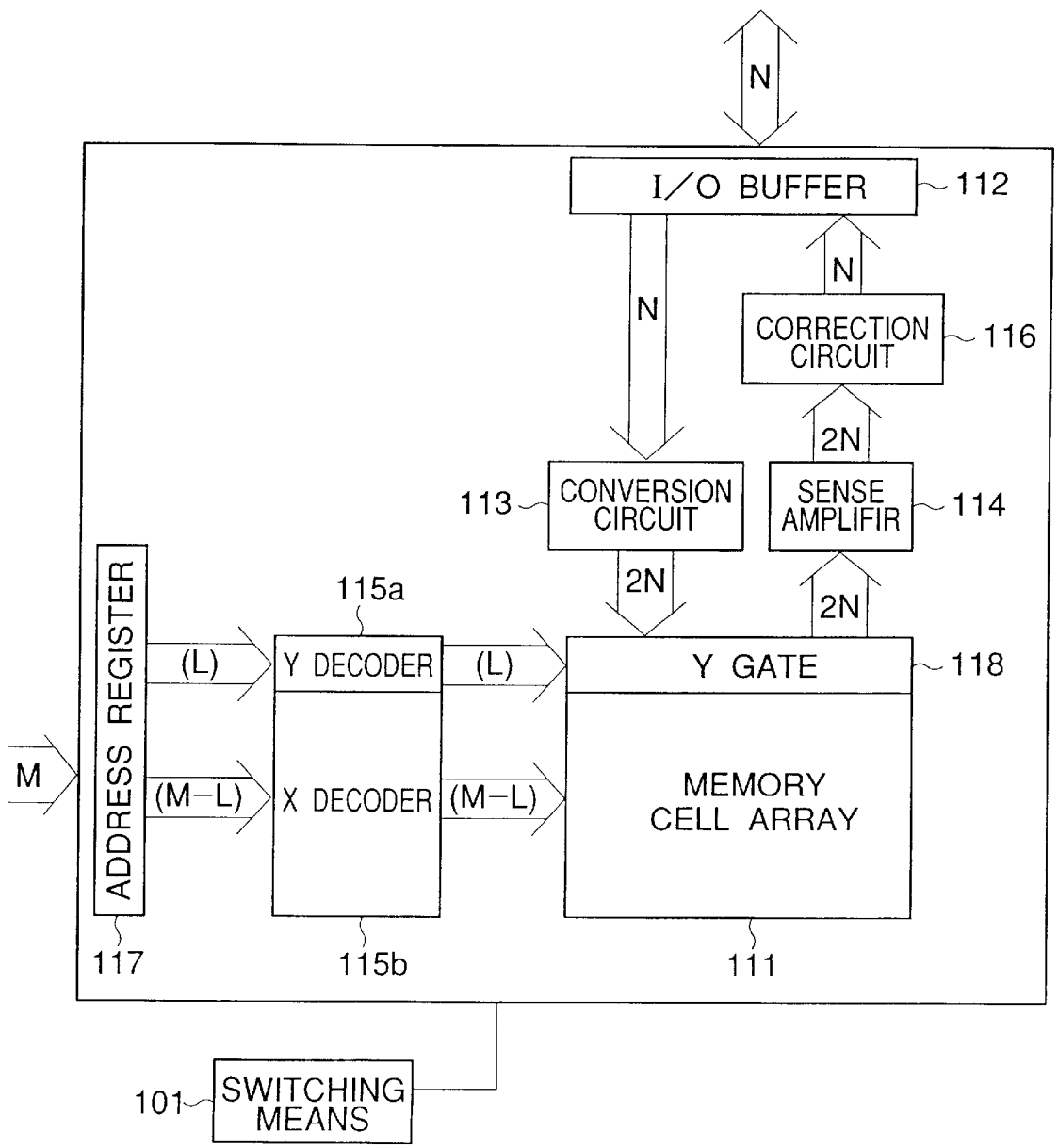
FIG. 7 is a block diagram showing the main components of an EEPROM according to the third embodiment of the present invention.
Figure 8:
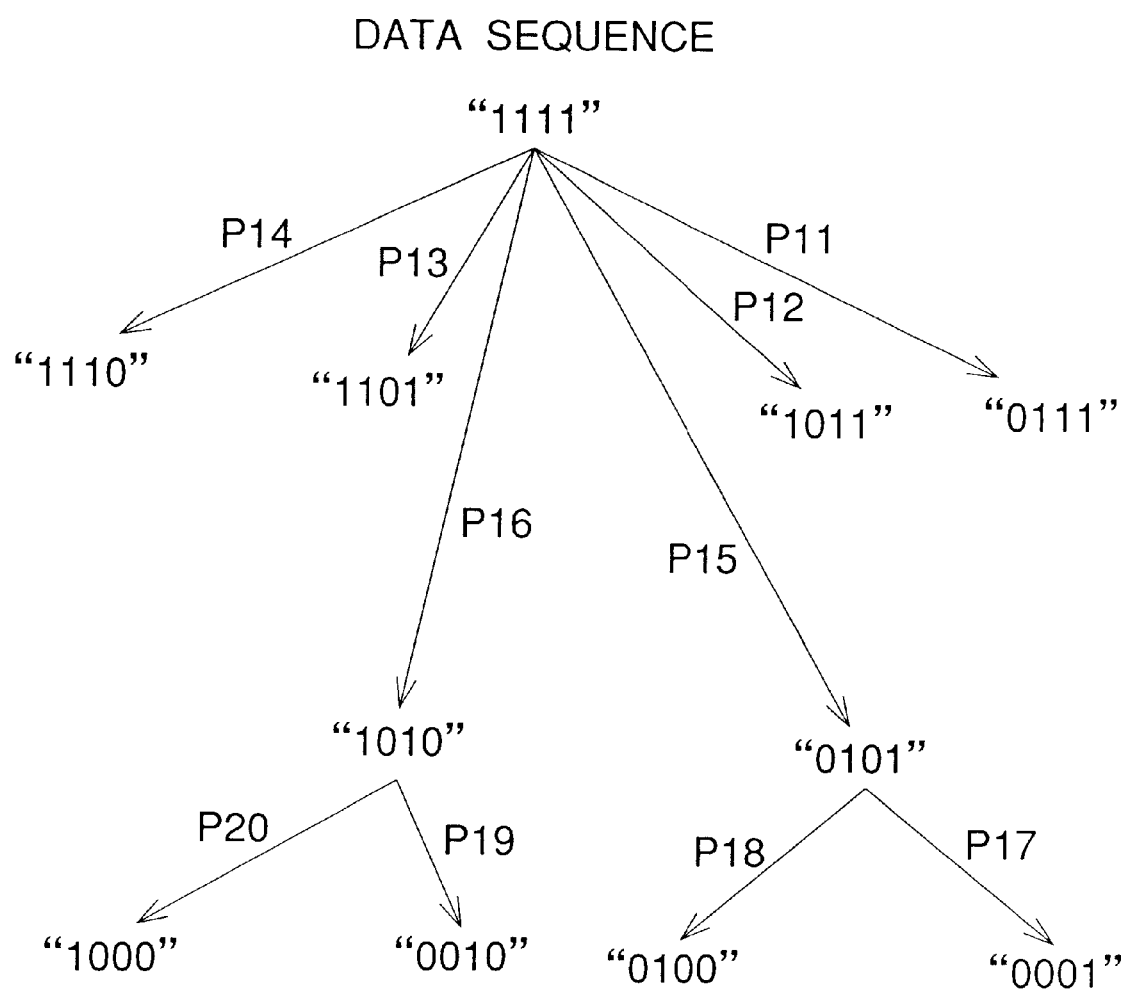
FIG. 8 is a schematic view showing the way an error occurs on the basis of transition probabilities in the third embodiment of the present invention.
Figure 9:
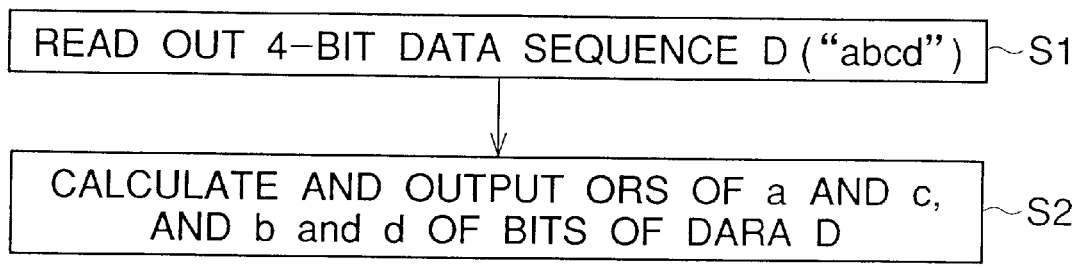
FIG. 9 is a flow chart for performing error correction during a read operation in the third embodiment of the present invention.

The third embodiment of the present invention will be described below. In this third embodiment, an EEPROM as a nonvolatile semiconductor memory capable of storing two-level (1-bit) information in each memory cell is used to write and read a data sequence (four bits) obtained by adding four-level (two bits) redundancy bits for error correction to four-level (two bits) information bits. FIG. 7 is a block diagram showing the major components of the EEPROM of this embodiment. FIG. 8 is a schematic view showing the way an error occurs on the basis of transition probabilities. FIG. 9 is a flow chart for performing error correction during a read operation.

As shown in FIG. 7, the EEPROM of this embodiment comprises a memory cell array 111, an I/O buffer 112, a conversion circuit 113, an address register 117, a Y decoder 115a, an X decoder 115b, a sense amplifier 114, and a correction circuit 116. The memory cell array 111 is a storage means in which a plurality of memory cells are arranged in a matrix manner. The I/O buffer 112 is used to input and output information bits. The conversion circuit 113 forms a 2N-bit data sequence by adding redundancy bits identical with N output information bits from the I/O buffer 112 to the N information bits. The address register 117 receives an M-bit data sequence. The Y decoder 115a receives an L-bit data sequence from the address register 117. The X decoder 115b receives an (M-L)-bit data sequence from the address register 117. The sense amplifier 114 has an amplification function. The correction circuit 116 is a read correcting means for outputting N correct information bits to the I/O buffer 112 by unconditionally performing the same method without checking (as will be described later) whether an error has occurred in the 2N-bit data sequence including the N information bits read out from the memory cell array 111 and the N redundancy bits.

Each memory cell constructing the memory array 111 has the same structure as the memory cell of the first embodiment shown in FIG. 1. That is, on a p-type silicon semiconductor substrate 1, a source 3 and a drain 4 as a pair of impurity diffusion layers are formed by ion-implanting an n-type impurity such as phosphorus (P) or arsenic (As) into a surface region of an element active region 2 defined by an element isolation structure made from, e.g., a field oxide film. A floating gate electrode 5 as an electron capture layer is formed by patterning on a channel region C between the source 3 and the drain 4 via a tunnel oxide film 7. A control gate electrode 6 is formed by patterning on the floating gate electrode 5 via a dielectric film 8.

A writing means applies a predetermined voltage to the source 3, the drain 4, and the control gate electrode 6 of a selected memory cell. Accordingly, electrons are stored in or emitted from the floating gate electrode 5 to change the storage state.

In the memory cell array 111, memory cells shown in FIG. 1 are arranged in a matrix manner. In each memory cell, a state wherein electrons are stored in the floating gate electrode 5 is defined as "1", and a state wherein electrons are emitted from the floating gate electrode 5 is defined as "0". It is possible to write data sequences having four values ("0000", "0101", "1010", and "1111") in this EEPROM and read out data sequences having 16 values ("0000", "0001", "0010", "0011", "0100", "0101", "0110", "0111", "1000", "1001", "1010", "1011", "1100", "1101", "1110", and "1111") from this EEPROM.

As shown in FIG. 7, output information bits containing N-bit storage data, in this embodiment two bits storage data, from the I/O buffer 112 are applied to the conversion circuit 113. The conversion circuit 113 adds redundancy bits identical with the storage data to form a four bits data sequence. Bits forming this data sequence are written in predetermined memory cells M1 to M4 in the memory cell array 111 through a Y gate 118.

That is, of the two memory cells M1 and M2 out of the four memory cells M1 to M4 forming one unit, storage data "0" or "1" written in the memory cell M1 is defined as a most significant bit. Storage data "0" or "1" written in the other memory cell M2 is defined as a second most significant bit. One of four information bit values ("00", "01", "10", and "11") is comprised of the most significant bit and the second most significant bit stored in these two memory cells M1 and M2.

Of the remaining two memory cells M3 and M4, the same bit as the storage data in the memory cell M3 is written in the memory cell M3. The same bit as the storage data in the memory cell M2 is written in the other memory cell M4. The bit stored in the memory cell M3 is defined as a third most significant bit (second least significant bit). The bit stored in the memory cell M4 is defined as a least significant bit. If this is the case, the third most significant bit and the least significant bit stored in these two memory cells M3 and M4 are the redundancy bits identical with the aforementioned information bits.

The bits from the most significant bit to the least significant bit stored in the memory cells M1 to M4 form data sequences having four values ("0000", "0101", "1010", and "1111").

In a read operation, data sequences having 16 values ("0000", "0001", "0010", "0011", "0100", "0101", "0110", "0111", "1000", "1001", "1010", "1011", "1100", "1101", "1110", and "1111") can be formed by the bits read out from the memory cells M1 to M4, while a case wherein an error occurs in a bit forming a data sequence as will be described later is taken into consideration. Without checking whether there is an error, data is unconditionally corrected and output.

In this embodiment, the probability of a transition from state "0" wherein electrons are emitted from the floating gate electrode 5 to state "1" wherein electrons are stored therein is much smaller than the probability of a transition from state "1" wherein electrons are stored in the floating gate electrode 5 to state "0" wherein electrons are emitted therefrom. In addition, the probability of data errors occurring in both bits stored in two memory cells out of the four memory cells M1 to M4, i.e., the probability of a transition from state "1" to state "0" of two or more bits in a data sequence is also small. Error correction is performed for a readout data sequence by using this property.

FIG. 8 shows a practical error correction method. Referring to FIG. 8, probability P15 or P16 that a written data sequence "1111" will change into a data sequence "0101" or "1010" when read out is negligibly small compared to probability P11, P12, P13, or P14 that a written data sequence "1111" will change into a data sequence "0111", "1011", "1101", or "1110" when read out.

Analogously, when the written data sequence is "0101", only probability P17 or P18 that this data sequence will change into a data sequence "0001" or "0100" when read out need to be considered if the probability of data error from "0" to "1" is ignored.

Also, when the written data sequence is "1010", only probability P19 and P20 that this data sequence will change into a data sequence "0010" or "1000" when read out need to be considered if the probability of data error from "0" to "1" is ignored.

When the written data sequence is "0000", this data sequence can be considered to remain "0000" with no error when read out if the probability of data error from "0" to "1" is ignored.

Accordingly, if the readout data sequence is any of "0111", "1011", and "1101", and "1110" this data sequence has an error. In view of the property of transition probability described above, the correct data sequence in this case is "1111" and correct information bits are "11".

Similarly, if the readout data sequence is "0001" or "0100", this data sequence has an error. Again from the property of transition probability, the correct data sequence in this case is "0101" and correct information bits are "01". If the readout data sequence is "0010" or "1000", this data sequence has an error. From the property of transition probability, the correct data sequence in this case is "1010" and correct information bits are "10". If the readout data sequences are "1111", "1010", "0101", and "0000", these are naturally correct data sequences, and correct information bits are "11", "10", "01", and "00", respectively.

In this embodiment, correct information bits are output by unconditionally performing the same method by using the property of transition probability described above, without checking whether an error has occurred in a readout data sequence. That is, if the readout data sequence is "abcd" (each of a to d is "0" or "1"), "ab" are information bits and "cd" are redundancy bits. The ORs of corresponding bits of the information and redundancy bits, i.e., the OR of "a" and "c" and a OR of "b" and "d" are calculated to reconstruct a two bits data sequence. This data sequence contains correct information bits. If "a" and "c" or "b" and "d" are "1" and "1", "1" and 0", or "0" or "1", the OR is "1". If "a" and "c" or "b" and "d" are "0" and "0", the OR is "0". Accordingly, the calculated reconstructed two bits data sequence always contains correct information bits regardless of whether the readout data sequence is correct. This is due to the property of transition probability, i.e., the property that a data error can occur only in 1 bit in a data sequence and this change is from "1" to "0".

More specifically, the correction circuit 116 converts a readout data sequence into a reconstructed data sequence by calculating the above OR and outputting the calculated data sequence as correct information bits.

A method of reading out a data sequence from the EEPROM while performing error correction by using the above property will be described below with reference to FIG. 9. This reading method is performed very simply as follows.

First, the bits stored in the memory cells M1 to M4 are read out to form a four bits data sequence D ("abcd") (step S1).

Next, in this readout four bits data sequence D, the OR of an upper bit a of information bits and an upper bit c of redundancy bits is calculated. Also, the OR of a lower bit b of the information bits and a lower bit d of the redundancy bits is calculated. The calculated ORs are arranged to reconstruct a two bits data sequence, and this data sequence is output (step S2).

In this embodiment, a case wherein information bits are two bits, i.e., a data sequence has four bits has been described for the sake of simplicity. However, the embodiment can be used (a read operation can be performed together with a write operation and correction) in exactly the same manner even when the number of information bits is increased to N bits (N is an integer of 1 or more). For example, in a write operation, the conversion circuit 113 forms a 2N-bit data sequence by adding redundancy bits identical with N information bits to the N information bits, and writes the 2N-bit data sequence in predetermined memory cells M(1) to M(N) of the memory cell array. In a read operation, the correction circuit 116 reads out the 2N-bit data sequence from the memory cells M(1) to M(N) in step S21. In step S22, the correction circuit 116 calculates the ORs of bits in the corresponding positions of the information bits and the redundancy bits of the data sequence, arranges the calculated ORs to reconstruct a data sequence, and outputs the reconstructed data sequence.

In the EEPROM of this embodiment as described above, it is only necessary to add redundancy bits identical with information bits to the information bits. Consequently, error correction can be accurately performed by a very simple method of unconditionally calculating the ORs of corresponding bits of the information bits and the redundancy bits regardless of the number of information bits and without checking whether the data sequence has an error.

Note that this EEPROM includes a switching means 101 as shown in FIG. 7. This switching means 101 is used to switch between a case wherein a fixed number of memory cells (e.g., half) making up the memory cell array 111 are used for parity bits for error correction and a case wherein all of the memory cells 10 are used for common information bits. That is, it is sometimes necessary to attach importance to the accuracy of information even at the sacrifice of the storage capacity to some extent. Conversely, the storage capacity must be fully utilized in some instances. The switching means 101 achieves such various purposes of the EEPROM.

Note also that this embodiment has been explained by taking an EEPROM as an example of a nonvolatile semiconductor memory. However, the present invention is not limited to this embodiment. That is, the present invention is applicable to any device having a storage electrode layer. Examples are an EPROM, an MNOS, and a flash memory. The present invention can also be applied to a DRAM as a volatile semiconductor memory under predetermined conditions.

Figure 10:
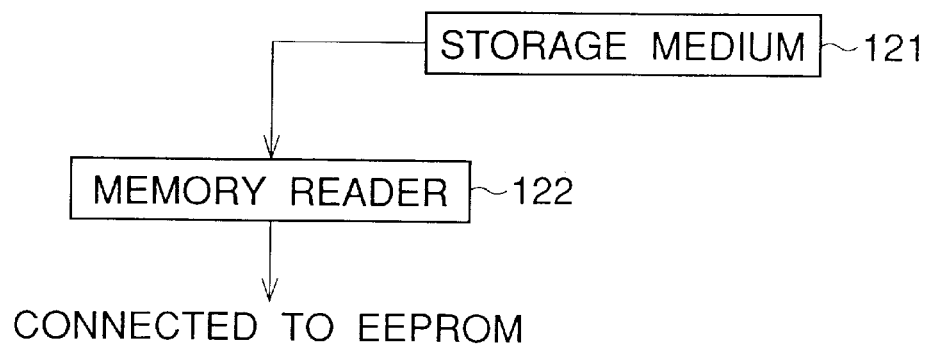
FIG. 10 is a block diagram showing a storage medium storing a method of using an EEPROM and a memory reader storing information of this storage medium in the third embodiment of the present invention.

The present invention includes program codes for operating, e.g., a common EEPROM to realize the functions of the read method (use method) explained with reference to FIG. 9 in this embodiment, and means for supplying the program codes to a computer, e.g., a storage medium 121 storing the program codes as shown in FIG. 10.

If this is the case, a memory reader 122 reads out the program codes from the storage medium 121 loaded into this memory reader 122 and operates an EEPROM. As this storage medium 121 for storing the program codes, it is possible to use a floppy disk, a hard disk, an optical disk, a magnetooptical disk, a CD-ROM, a magnetic tape, a nonvolatile memory card, or a ROM.

Also, not only when the functions of this embodiment are realized by executing supplied program codes by a computer, but also when the program codes cooperate with an OS (Operating System) or some other application software running on the computer and realize the functions of this embodiment, the present invention includes these program codes.

Furthermore, the present invention also includes a system wherein, after supplied program codes are written in a function extension board of a computer or in a memory of a function extension unit connected to the computer, a CPU or the like incorporated into the function extension board or the function extension unit partially or entirely performs an actual process in accordance with instructions from the program codes and realizes the functions of this embodiment.

Fourth Embodiment

Figure 11:
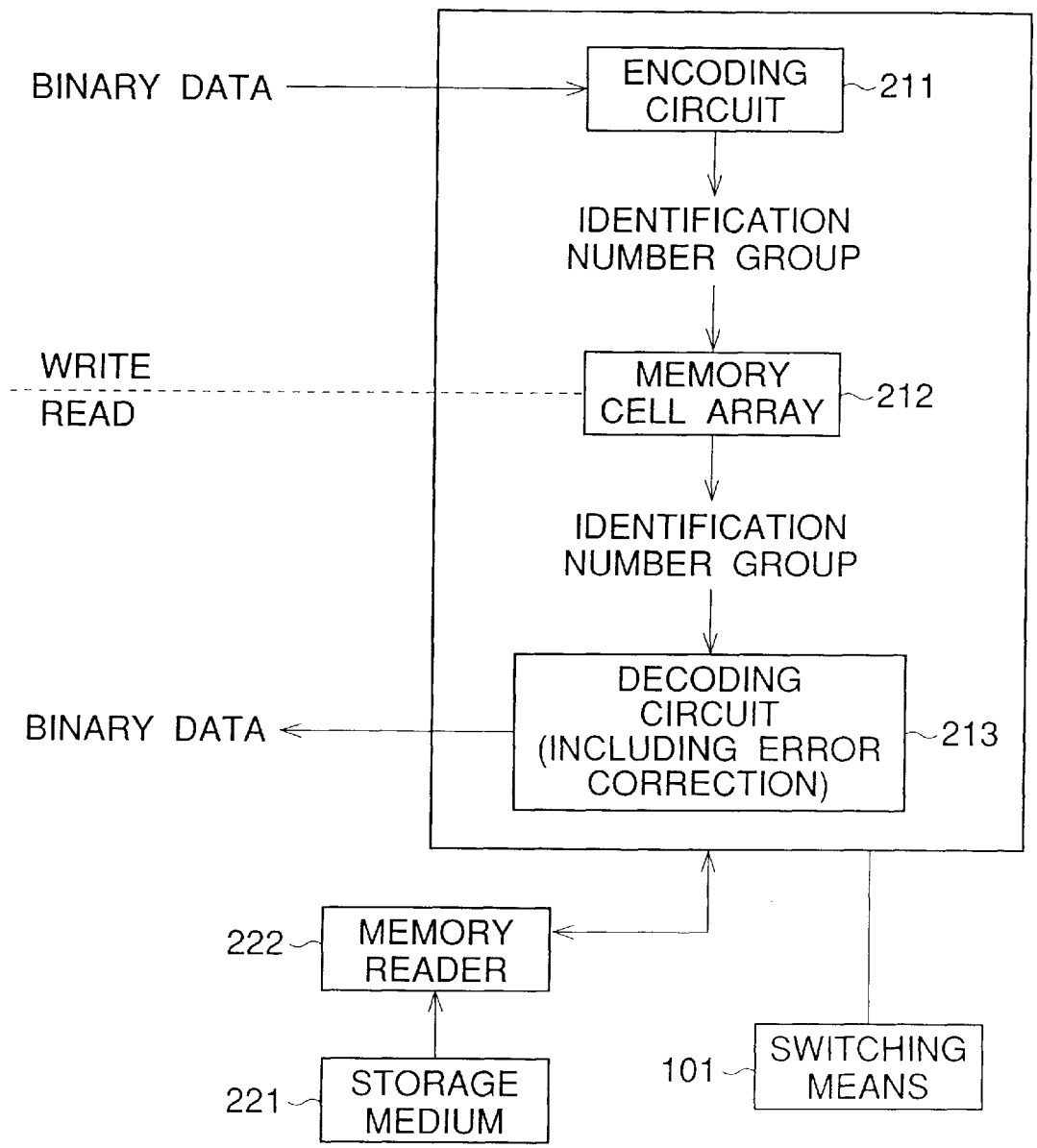
FIG. 11 is a block diagram showing an outline of the whole arrangement of a nonvolatile semiconductor memory according to the fourth to sixth embodiments of the present invention.
Figure 12:
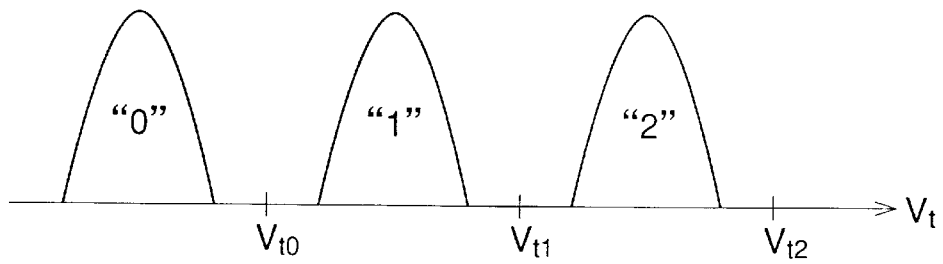
FIG. 12 is a graph showing the relationship between the data stored in a memory cell of an EEPROM according to the fourth and fifth embodiments of the present invention and the threshold value.
Figure 13:
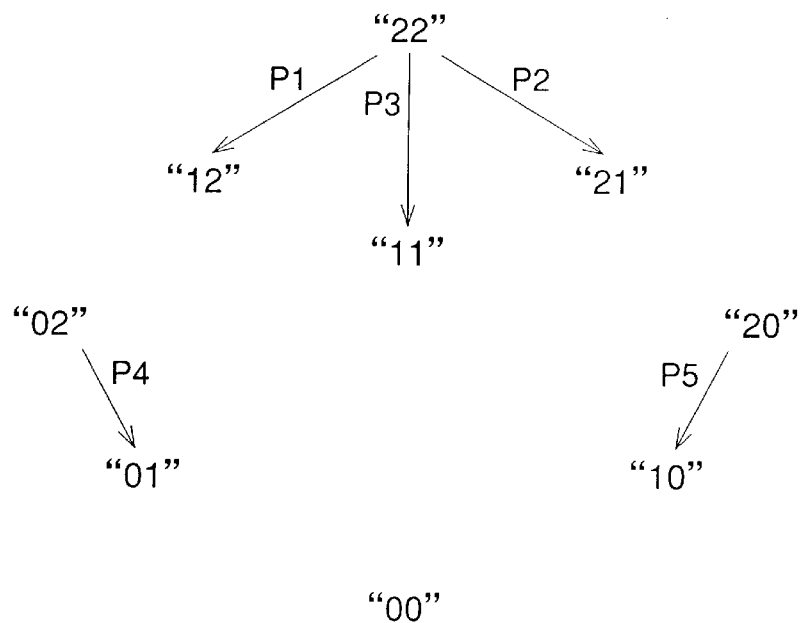
FIG. 13 is a schematic view showing the way an error occurs on the basis of transition probabilities in the fourth embodiment of the present invention.
Figure 14:
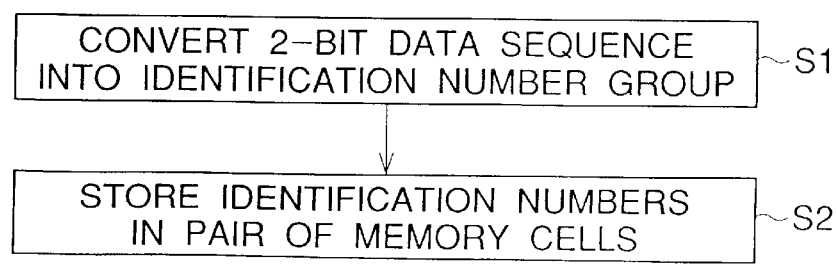
FIG. 14 is a flow chart showing a method of using the EEPROM in the fourth embodiment of the present invention.
Figure 15:
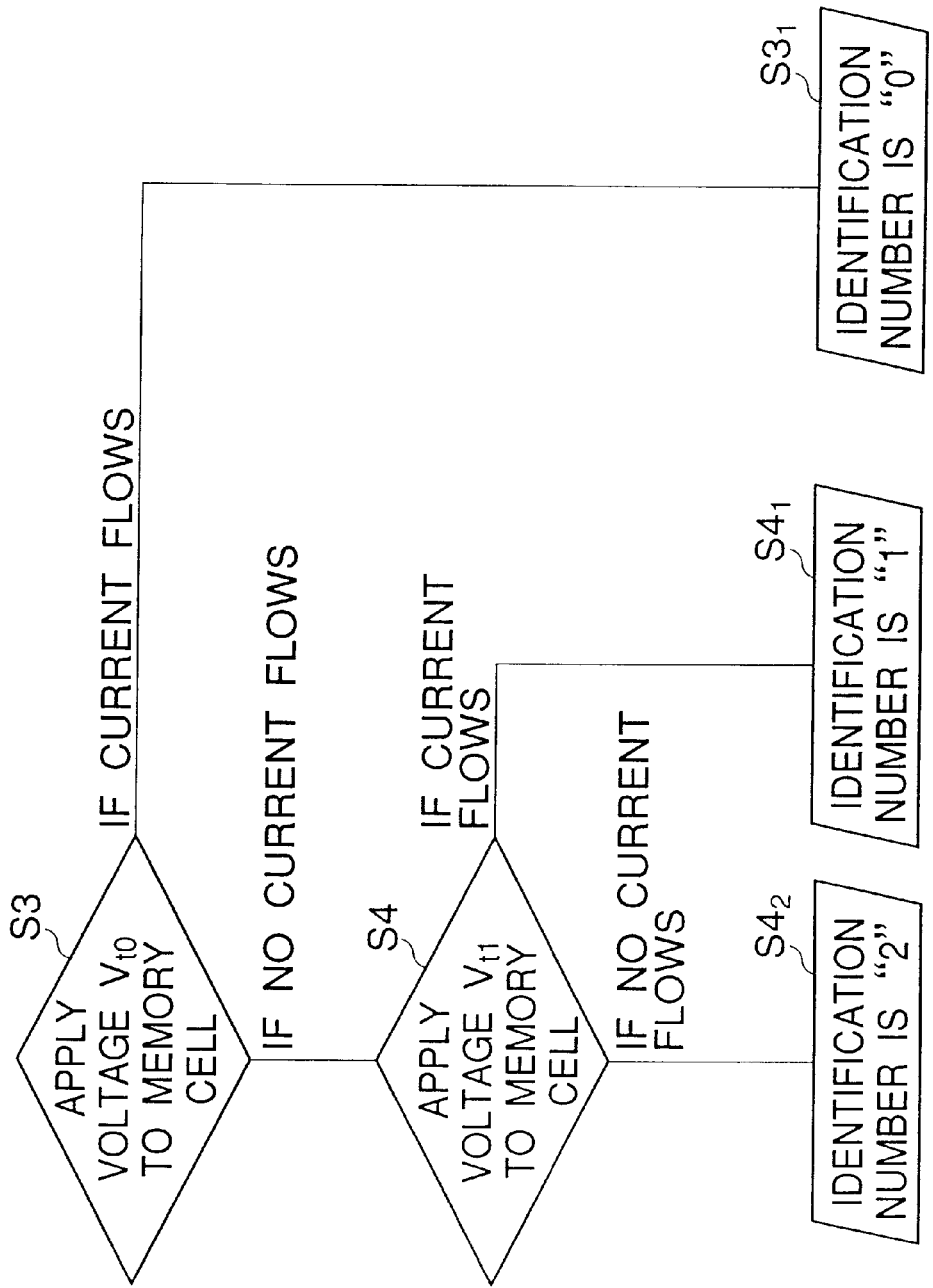
FIG. 15 is a continuation of FIG. 14 and shows the method of using the EEPROM in the fourth embodiment of the present invention.
Figure 16:
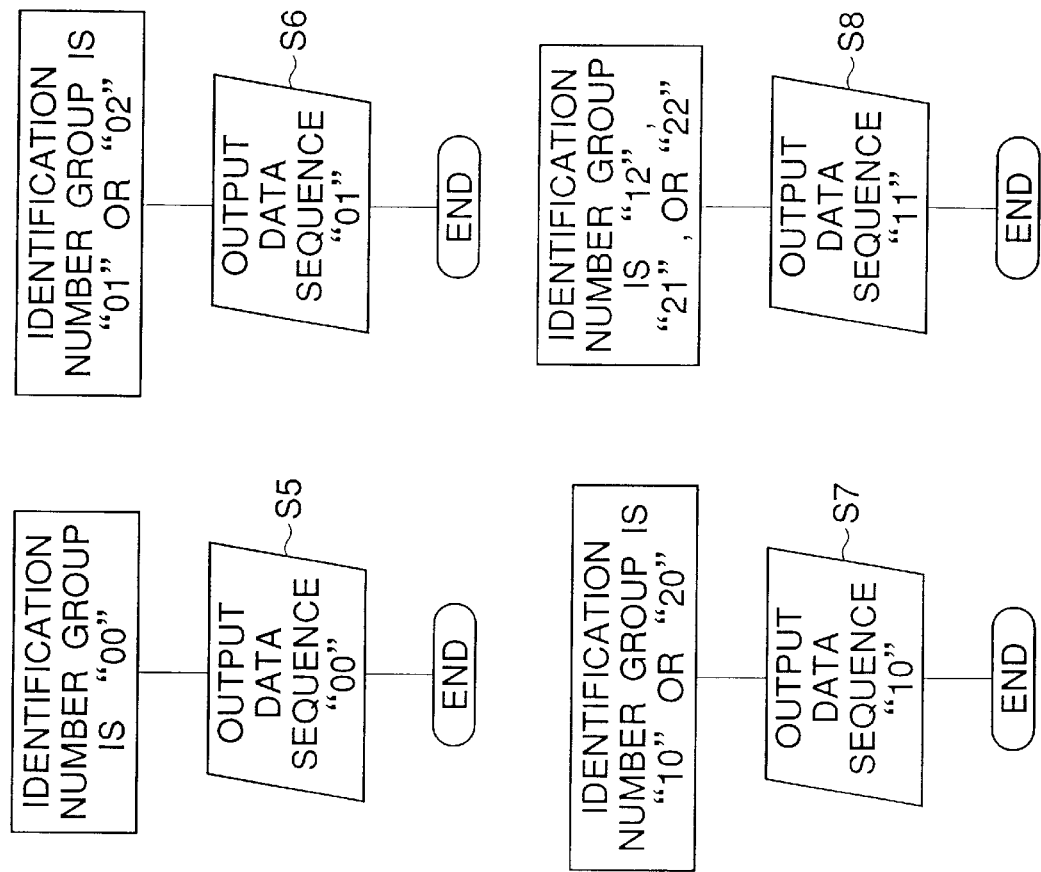
FIG. 16 is a continuation of FIG. 15, and shows the method of using the EEPROM in the fourth embodiment of the present invention.

The fourth embodiment of the present invention will be described below. In this fourth embodiment, an EEPROM as a nonvolatile semiconductor memory including memory cells each capable of storing three-level (three types of) information is used to write and read a data sequence containing four-level (two bits) information. FIG. 11 is a block diagram showing an outline of the whole arrangement of the EEPROM of the fourth embodiment. FIG. 12 is a graph showing the relationship between the data stored in a memory cell and the threshold voltage. FIG. 13 is a schematic view showing the way an error occurs on the basis of transition probabilities. FIGS. 14 to 16 are flow charts showing a method of using this EEPROM in order of steps.

As shown in FIG. 11, the EEPROM of the fourth embodiment includes an encoding circuit 211, a memory cell array 212, and a decoding circuit 213. The encoding circuit 211 converts binary data. In the memory cell array 212, a large number of memory cells for storing data converted by the encoding circuit 211 are arranged in a matrix manner. The decoding circuit 213 performs error correction, if an error occurs in data of a memory cell, and decodes and outputs the data.

Upon receiving binary data in which a large number of "0"s or "1"s repeat themselves, the encoding circuit 211 divides this binary data in units of two bits to form any of data sequences "00", "01", "10", and "11". The encoding circuit 211 assigns each of the two bits of this data sequence to "0" or "2" of three identification numbers "0", "1", and "2" and stores them in two memory cells. More specifically, as shown in Table 1 below, input data sequences "00", "01", "10", and "11" are converted into identification number groups "00", "02", "20", and "22", respectively.

TABLE 1

| | two bits binary data sequence | Three-level identification number group of two figures |
|---|---|---|
| 0 | 00 | 00 |
| 1 | 01 | 02 |
| 2 | 10 | 20 |
| 3 | 11 | 22 |

Each memory cell of the memory cell array 212 has the same structure as the memory cell of the first embodiment shown in FIG. 1. That is, on a p-type silicon semiconductor substrate 1, a source 3 and a drain 4 as a pair of impurity diffusion layers are formed by ion-implanting an n-type impurity such as phosphorus (P) or arsenic (As) into a surface region of an element active region 2 defined by an element isolation structure made from, e.g., a field oxide film. A floating gate electrode 5 as an electron capture layer is formed by patterning on a channel region C between the source 3 and the drain 4 with intervention of a tunnel oxide film 7. A control gate electrode 6 is formed by patterning on the floating gate electrode 5 with intervention of a dielectric film 8.

Data of three identification numbers "0", "1", and "2" can be written in and read out from each memory cell. In a write operation, only "0" and "2" of the three values are used. That is, when two identification numbers of an identification number group are to be stored in two memory cells in a write operation, data "0" or "2" is stored as an upper identification number in one memory cell, and data "0" or "2" is stored as a lower identification number in the other memory cell. In this manner one of identification number groups "00", "02", "20", and "22" is formed.

In a memory cell read operation, the decoding circuit 213 reads out identification number groups "00", "01", "02", "10", "20", "12", "21", and "22" by using three threshold voltages $V_{r0}$, $V_{r1}$, and $V_{r2}$. If the decoding circuit 213 determines that there is an error in data, the decoding circuit 213 corrects the data as will be described later and outputs the corrected data.

In each memory cell, as shown in FIG. 12, states wherein a threshold voltage $V_t$ is less than $V_{r0}$, $V_{r0}$ to less than $V_{r1}$, and $V_{r1}$ to less than $V_{r2}$ are defined as states "0", "1", and "2", respectively. In state "2", the largest amount of electric charge is stored in the floating gate electrode 5. In state "1", the second largest amount of electric charge is stored in the floating gate electrode 5. In state "0", basically no electric charge is stored in the floating gate electrode 5.

If a memory cell deteriorates after the EEPROM is used for long time periods, a data error sometimes occurs in this memory cell. The probability of a transition from a lower state wherein electric charge in the floating gate electrode 5 is reduced to an upper state wherein electric charge is stored therein is much smaller than the probability of a transition from the upper state wherein electric charge is stored in the floating gate electrode 5 to the lower state wherein electric charge therein is reduced. That is, the probability (second transition probability) of a transition of only one identification number from state "1" to state "2" or from state "0" to state "1" is negligibly small compared to the probability (first transition probability) of a transition of only one identification number from state "2" to state "1" or from state "1" to state "0". In addition, the probability (third transition probability) of a two-step transition of only one identification number from state "2" to state "0" is negligibly small compared to the first transition probability. Furthermore, the probability of a transition (fourth transition probability) of both identification numbers from state "2" to state "1" or from state "1" to state "0" is negligibly small compared to the first transition probability. Note that the probability that both identification numbers will change from "2" to "0" or one identification number will change from "2" to "0" while the other will change from "1" to "2" can naturally be ignored from the above consideration. In the fourth embodiment, error correction is performed for a readout data sequence by using this inherent property of nonvolatile semiconductor memories represented by an EEPROM.

More specifically, as shown in FIG. 13, assume that the written identification number group is "22" and this identification number group "22" changes for some reason. As the third transition probability is small, the probability of change into an identification number group "20", "02", "10", "01", or "00" upon reading can be ignored. Again as the fourth transition probability is small, probability P3 of change into an identification number group "11" upon reading is very small and negligible compared to probability P1 or P2 of change into an identification number group "12" or "21" upon reading due to the first transition probability. Accordingly, if a data error occurs when a written identification number group "22" is read out, only the probabilities P1 and P2 need to be considered. If the readout identification number group is "12" or "21", this identification number group has an error, and a correct identification number group is "22". Therefore, the decoding circuit 213 outputs an original correct data sequence "11" in accordance with the encoding rules of the encoding circuit 211.

Analogously, assume that the written identification number group is "02" and this identification number group "02" changes for some reason. Since the second to fourth transition probabilities are small, it is only necessary to consider probability P4 of change into an identification number group "01" due to the first transition probability. Accordingly, if the readout identification number group is "01", this identification number group has an error, and the correct identification number group is "02". Hence, the decoding circuit 213 outputs an original correct data sequence "01" in accordance with the encoding rules of the encoding circuit 211.

Similarly, assume that the written identification number group is "20" and this identification number group "20" changes for some reason. Since the second to fourth transition probabilities are small, it is only necessary to consider probability P5 of change into an identification number group "10" due to the first transition probability. Accordingly, if the readout identification number group is "10", this identification number group has an error, and the correct identification number group is "20". The decoding circuit 213 outputs an original correct data sequence "10" in accordance with the encoding rules of the encoding circuit 211.

If the written identification number group is "00", the probability of data error is negligibly small considering particularly the second transition probability. The decoding circuit 213 outputs an original correct data sequence "00" in accordance with the encoding rules of the encoding circuit 211.

The above decoding is summarized in Table 2 below.

TABLE 2

| | Three-level identification number group of two figures | two bits binary data sequence |
|---|---|---|
| 0 | 00 | 00 |
| 1 | 01 | 01 |
|   | 02 |   |
| 2 | 10 | 10 |
|   | 20 |   |
| 3 | 12 | 22 |
|   | 21 |   |
|   | 22 |   |

Methods (write and read methods) of using the EEPROM while performing error correction by using the above property will be described below with reference to FIGS. 14 to 16.

First, as shown in FIG. 14, the encoding circuit 211 divides input binary data in units of two bits to form any of data sequences "00", "01", "10", and "11", and converts the data sequence into a corresponding one of identification number groups "00", "02", "20", and "22" (step S1).

Next, of the converted identification number group (one of "0", "02", "20", and "22"), the encoding circuit 211 stores individual identification numbers in the respective corresponding memory cells (step S2). More specifically, to store "2", the encoding circuit 211 applies a predetermined (appropriate) voltage to the control gate electrode 6 of a memory cell so that its threshold voltage is the voltage $V_{t1}$ to less than the voltage $V_{t2}$. To store "0", the encoding circuit 211 applies a predetermined (appropriate) voltage to the control gate electrode 6 of a memory cell so that its threshold voltage is less than the voltage $V_{t0}$. The above steps S1 and S2 form an EEPROM write method.

An operation of reading out identification numbers stored in a pair of memory cells and outputting the readout numbers after converting them into binary data as shown in FIG. 15 will be described below. More specifically, the decoding circuit 213 selects a predetermined pair of memory cells from the memory cell array 212 and applies the voltage $V_{t0}$ to the control gate electrode 6 of a memory cell corresponding to the upper identification number (step S2). If a current flows between the source 3 and the drain 4 in step S2, the decoding circuit 213 determines that the identification number stored in this memory cell is "0" (step $S3_1$). If no current flows between the source 3 and the drain 4 in step S2, the decoding circuit 213 applies the voltage $V_{t1}$ to the control gate electrode 6 (step S4). If a current flows between the source 3 and the drain 4 in step S4, the decoding circuit 213 determines that the identification number stored in the memory cell is "1" (step $S4_1$). If no current flows between the source 3 and the drain 4 in step S4, the decoding circuit 213 determines that the identification number stored in the memory cell is "2" (step $S4_2$).

A simpler method is to determine "1" or "2" as the identification number if no current flows in step S3 without performing step S4. This method is possible in the case of a three-level memory cell. That is, if a certain figure in original binary data is "1", the three-level identification number corresponds only to "1" or "2". The method uses this property.

Subsequently, the decoding circuit 213 similarly performs the operations in steps S3 and S4 described above for a memory cell corresponding to the lower identification number and determines the identification number stored in this memory cell. In this manner, the decoding circuit 213 forms an identification number group including the upper and lower identification numbers. It is of course also possible to first determine the lower identification number and then determine the upper identification number.

Next, as shown in FIG. 16, the decoding circuit 213 outputs the identification number group including the upper and lower identification numbers after decoding it into binary data. More specifically, if the identification number group is "00", the decoding circuit 213 directly outputs this "00" as a correct data sequence (step S5). If the identification number group is "01" or "02", the decoding circuit 213 determines "02" as the original identification number group in accordance with the aforementioned rules, and outputs "01" as a correct data sequence (step S6). If the identification number group is "10" or "20", the decoding circuit 213 determines "20" as the original identification number group in accordance with the aforementioned rules, and outputs "10" as a correct data sequence (step S7). If the identification number group is any of "12", "21", and "22", the decoding circuit 213 determines "22" as the original identification number group in accordance with the aforementioned rules, and outputs "11" as a correct data sequence (step S8).

In the EEPROM of the fourth embodiment as described above, in writing and reading out a data sequence including four-level information, an input data sequence is converted into an identification number group in accordance with the aforementioned assignment rules and read out by taking account only of the first transition probability. In this manner, it is possible to simply and accurately perform error correction and obtain a correct data sequence with high probability. Consequently, error correction can be efficiently and accurately performed.

Fifth Embodiment

Figure 17:
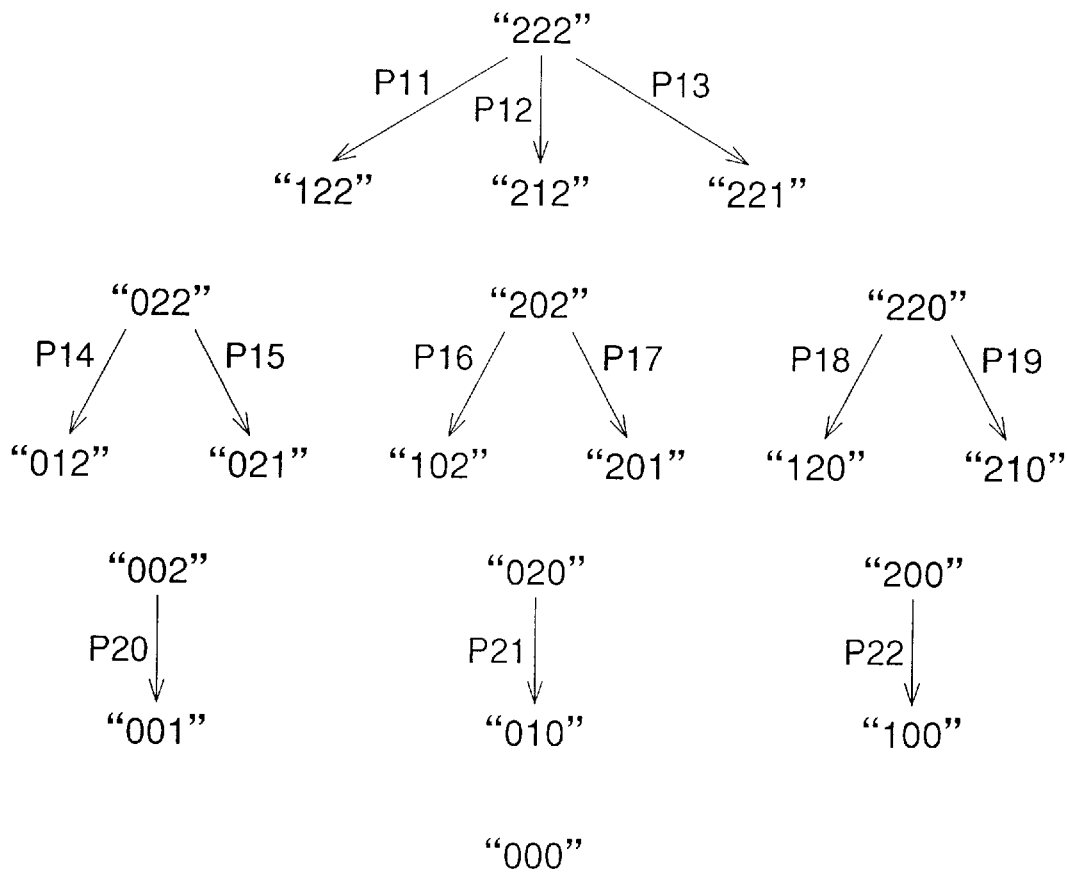
FIG. 17 is a schematic view showing the way an error occurs on the basis of transition probabilities in the fifth embodiment of the present invention.
Figure 18:
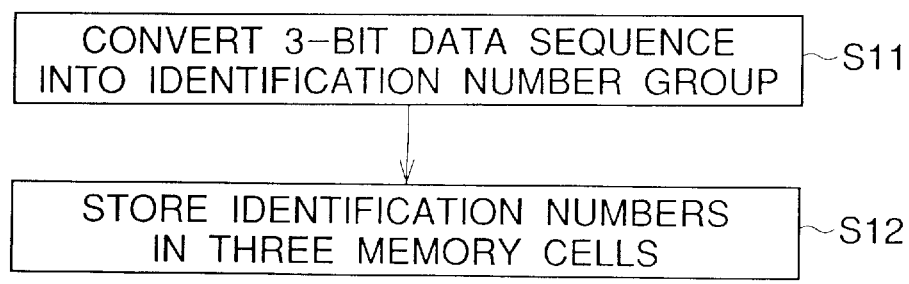
FIG. 18 is a flow chart showing a method of using the EEPROM in the fifth embodiment of the present invention.
Figure 19:
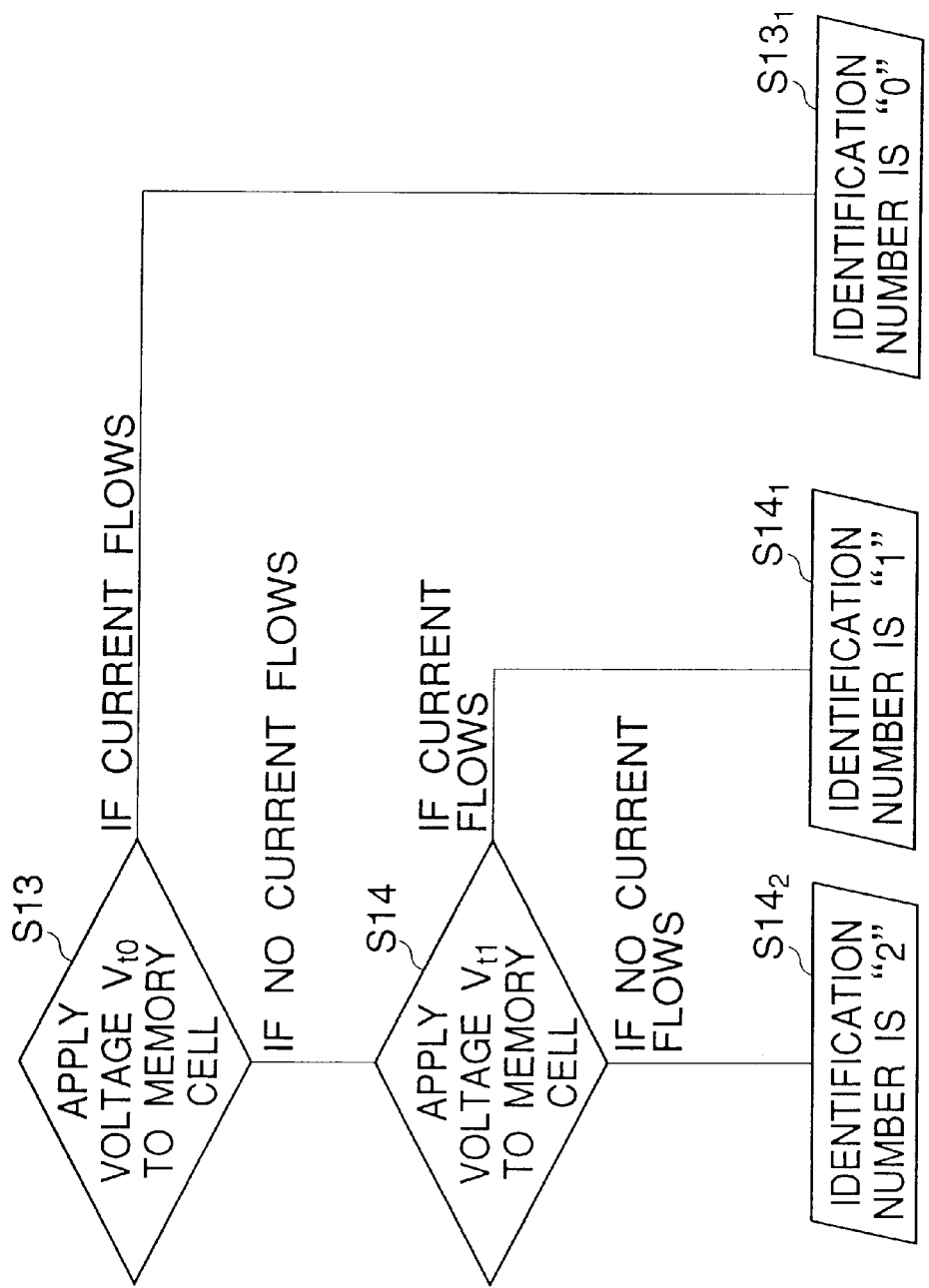
FIG. 19 is a flow chart, following FIG. 18, showing the method of using the EEPROM in the fifth embodiment of the present invention.
Figure 20:
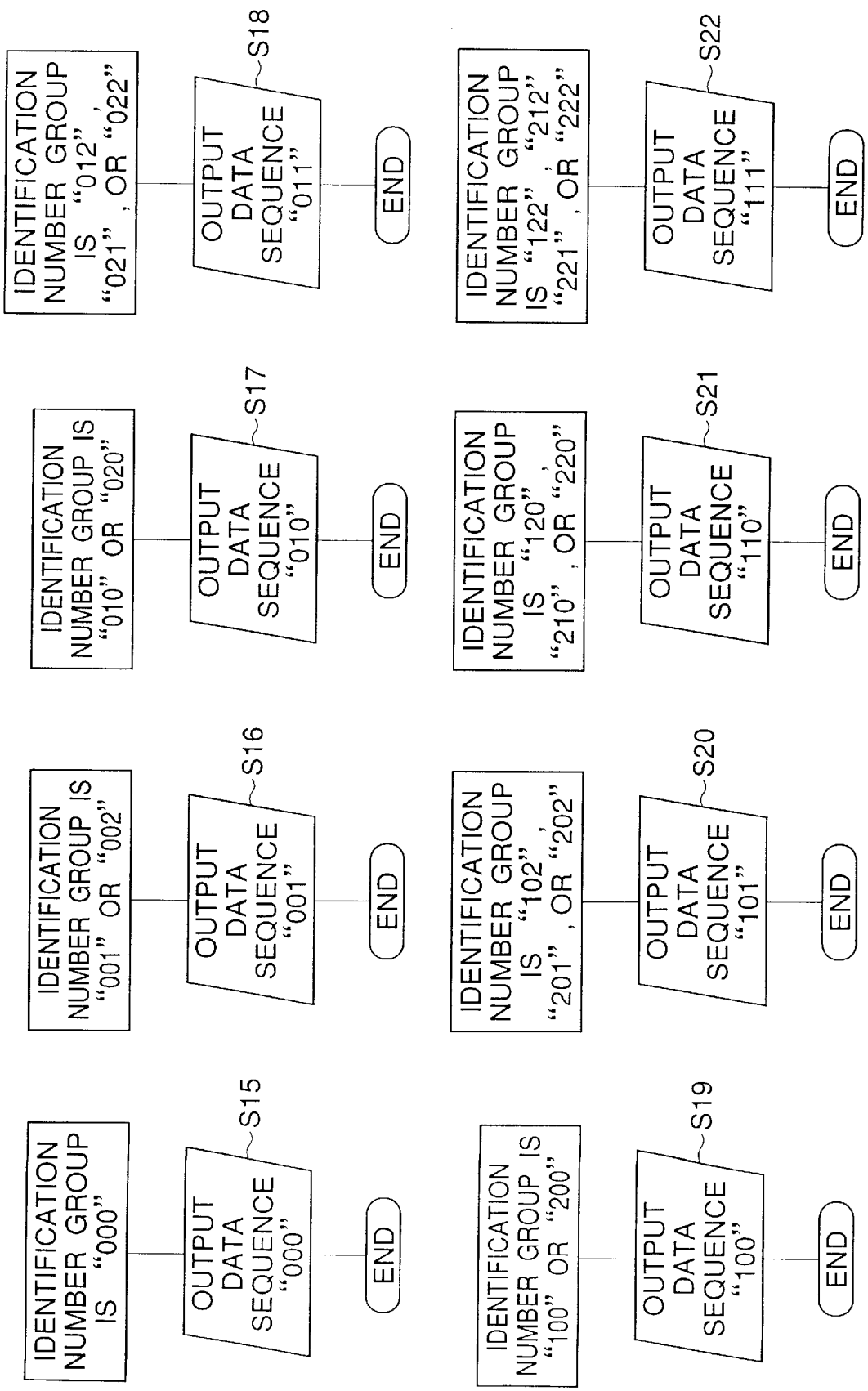
FIG. 20 is a flow chart, following FIG. 19, showing the method of using the EEPROM in the fifth embodiment of the present invention.

The fifth embodiment of the present invention will be described below. In this fifth embodiment, an EEPROM as a nonvolatile semiconductor memory including memory cells each capable of storing three-level (three types or) information is used to write and read a data sequence containing eight-level (three bits) information. An outline of the whole arrangement of the EEPROM of the fifth embodiment is the same as in FIG. 11. The major components of a memory cell of this EEPROM are the same as in FIG. 1. The relationship between the data stored in a memory cell and the threshold voltage is the same as in FIG. 12. FIG. 17 is a schematic view showing the way an error occurs on the basis of transition probabilities. FIGS. 18 to 20 are flow charts showing a method of using this EEPROM in order of steps.

Similar to the EEPROM of the fourth embodiment, this EEPROM includes an encoding circuit 211, a memory cell array 212, and a decoding circuit 213. The encoding circuit 211 converts binary data. In the memory cell array 212, a large number of memory cells for storing data converted by the encoding circuit 211 are arranged in a matrix manner. The decoding circuit 213 performs error correction, if an error occurs in data of a memory cell, and decodes and outputs the data.

Upon receiving binary data in which a large number of "0"s or "1"s run, the encoding circuit 211 divides this binary data in units of three bits to form any of data sequences "000", "001", "010", "011", "100", "101", "110", and "111". The encoding circuit 211 assigns each of the three bits of this data sequence to one of three identification numbers "0", "1", and "2" and stores them in three memory cells. More specifically, as shown in Table 3 below, input data sequences "000", "001", "010", "011", "100", "101", "110", or "111" are converted into identification number groups "000", "002", "020", "022", "200", "202", "220", and "222", respectively.

TABLE 3

| | three bits binary data sequence | Three-level identification number group of three figures |
| --- | --- | --- |
| 0 | 000 | 000 |
| 1 | 001 | 002 |
| 2 | 010 | 020 |
| 3 | 011 | 022 |
| 4 | 100 | 200 |
| 5 | 101 | 202 |
| 6 | 110 | 220 |
| 7 | 111 | 222 |

Data of three identification numbers "0", "1", and "2" can be written in and read out from each memory cell. In a write operation, only "0" and "2" of the three values are used. That is, when three identification numbers forming an identification number group are to be stored in three memory cells in a write operation, data "0" or "2" is stored as an upper identification number in a first memory cell, and data "0" or "2" is stored as middle and lower identification numbers in second and third memory cells. In this manner one of identification number groups "000", "002", "020", "022", "200", "202", "220", and "222" is written.

In a memory cell read operation, the decoding circuit 213 reads out identification number groups "000", "001", "002", "010", "020", "012", "021 ", "022", "100", "200", "102", "201", "202", "120", "210", "220", "122", "212", "221", and "222" by using three threshold voltages $V_{r0}$, $V_{r1}$, and $V_{r2}$. If the decoding circuit 213 determines that there is an error in data, the decoding circuit 213 corrects the data as will be described later and outputs the corrected data.

In each memory cell, as in the fourth embodiment, states wherein a threshold voltage $V_t$ is less than $V_{r0}$, $V_{r0}$ to less than $V_{r1}$, and $V_{r1}$ to less than $V_{r2}$ are defined as states "0", "1", and "2", respectively. In state "2", the largest amount of electric charge is stored in a floating gate electrode 5. In state "1", the second largest amount of electric charge is stored in the floating gate electrode 5. In state "0", basically no electric charge is stored in the floating gate electrode 5.

If a memory cell deteriorates after the EEPROM is used for long time periods, a data error sometimes occurs in this memory cell. The probability of a transition from a lower state wherein electric charge in the floating gate electrode 5 is reduced to an upper state wherein electric charge is stored therein is much smaller than the probability of a transition from the upper state wherein electric charge is stored in the floating gate electrode 5 to the lower state wherein electric charge therein is reduced. That is, the probability (second transition probability) of a transition of only one identification number from state "1" to state "2" or from state "0" to state "1" is negligibly small compared to the probability (first transition probability) of a transition of only one identification number from state "2" to state "1" or from state "1" to state "0". In addition, the probability (third transition probability) of a two-step transition of only one identification number from state "2" to state "0" is negligibly small compared to the first transition probability. Furthermore, the probability of a transition (fourth transition probability) of two or more identification numbers from state "2" to state "1" or from state "1" to state "0" is negligibly small compared to the first transition probability. Note that the probability that two or more identification numbers will change from "2" to "0" or one identification number will change from "2" to "0" while another identification number will change from "1" to "2" can naturally be ignored from the above consideration. In the fifth embodiment, error correction is performed for a readout data sequence by using this inherent property of nonvolatile semiconductor memories represented by an EEPROM.

More specifically, as shown in FIG. 17, assume that the written identification number group is "222" and this identification number group "222" changes for some reason. Because the third transition probability is small, the probability of change into an identification number group "220", "202", or "022" upon reading can be ignored. Because the fourth transition probability is small, the probability of change into "211", "112", "121", or "111" upon reading can also be ignored. Furthermore, as both the third and fourth transition probabilities are small, the probability of change into "200", "020", "002", or "000" can be ignored. That is, only probabilities P11, P12, and P13 of changes into "122", "212", and "221" due to the first transition probability need to be considered. If the readout identification number group changes into any of "200", "020", and "002", this identification number group has an error, and the correct identification number group is "222". Therefore, the decoding circuit 213 outputs an original correct data sequence "111" in accordance with the encoding rules of the encoding circuit 211.

Analogously, assume that the written identification number group is "022" and this identification number group "022" changes for some reason. Since the second to fourth transition probabilities are small, it is only necessary to consider probabilities P14 and P15 of changes into identification number groups "012" and "021" due to the first transition probability. Accordingly, if the readout identification number group is "012" or "021", this identification number group has an error, and the correct identification number group is "022". The decoding circuit 213 outputs an original correct data sequence "011" in accordance with the encoding rules of the encoding circuit 211.

Similarly, assume that the written identification number group is "202" and this identification number group "20" changes for some reason. Since the second to fourth transition probabilities are small, it is only necessary to consider probabilities P16 and P17 of changes into identification number groups "102" and "201" due to the first transition probability. Accordingly, if the readout identification number group is "102" or "201", this identification number group has an error, and the correct identification number group is "202". The decoding circuit 213 outputs an original correct data sequence "101" in accordance with the encoding rules of the encoding circuit 211.

Likewise, assume that the written identification number group is "220" and this identification number group "220" changes for some reason. Since the second to fourth transition probabilities are small, it is only necessary to consider probabilities P18 and P19 of changes into identification number groups "120" and "210" due to the first transition probability. Accordingly, if the readout identification number group is "120" or "210", this identification number group has an error, and the correct identification number group is "220". The decoding circuit 213 outputs an original correct data sequence "110" in accordance with the encoding rules of the encoding circuit 211.

Assume also that the written identification number group is "002" and this identification number group "002" changes for some reason. Since the second to fourth transition probabilities are small, it is only necessary to consider probability P20 of change into an identification number group "001" due to the first transition probability. Accordingly, if the readout identification number group is "001", this identification number group has an error, and the correct identification number group is "002". The decoding circuit 213 outputs an original correct data sequence "001" in accordance with the encoding rules of the encoding circuit 211.

Similarly, assume that the written identification number group is "020" and this identification number group "020" changes for some reason. Since the second to fourth transition probabilities are small, it is only necessary to consider probability P21 of change into an identification number group "010" due to the first transition probability. Accordingly, if the readout identification number group is "010", this identification number group has an error, and the correct identification number group is "020". The decoding circuit 213 outputs an original correct data sequence "010" in accordance with the encoding rules of the encoding circuit 211.

Analogously, assume that the written identification number group is "200" and this identification number group "200" changes for some reason. Since the second to fourth transition probabilities are small, it is only necessary to consider probability P22 of change into an identification number group "100" due to the first transition probability. Accordingly, if the readout identification number group is "100", this identification number group has an error, and the correct identification number group is "200". The decoding circuit 213 outputs an original correct data sequence "100" in accordance with the encoding rules of the encoding circuit 211.

If the written identification number group is "000", the probability of data error is negligibly small considering particularly the second transition probability. Therefore, the decoding circuit 213 outputs an original correct data sequence "000" in accordance with the encoding rules of the encoding circuit 211.

The above decoding is summarized in Table 4 below.

TABLE 4

|   | Three-level identification number group of three figures | three bits binary data sequence |
| --- | --- | --- |
| 0 | 000 | 000 |
| 1 | 001 | 001 |
|   | 002 |   |
| 2 | 010 | 010 |
|   | 020 |   |
| 3 | 012 | 011 |
|   | 021 |   |
|   | 022 |   |
| 4 | 100 | 100 |
|   | 200 |   |

TABLE 4-continued

| | Three-level identification number group of three figures | three bits binary data sequence |
|---|---|---|
| 5 | 102<br>201<br>202 | 101 |
| 6 | 120<br>210<br>220 | 110 |
| 7 | 122<br>212<br>221<br>222 | 111 |

Methods (write and read methods) of using the EEPROM while performing error correction by using the above property will be described below with reference to FIGS. 18 to 20.

First, as shown in FIG. 18, the encoding circuit 211 breaks up input binary data in units of two bits to form any of data sequences "000", "001", "010", "011", "100", "101", "110", and "111", and converts the data sequence into a corresponding one of identification number groups "000", "002", "020", "022", "200", "202", "220", and "222" (step S11).

Next, of the converted identification number group (one of "000", "002", "020", "022", "200", "202", "220", and "222"), the encoding circuit 211 stores individual identification numbers in the respective corresponding memory cells (step S12). More specifically, to store "2", the encoding circuit 211 applies a predetermined voltage to a control gate electrode 6 of a memory cell so that its threshold voltage is the voltage $V_{r1}$ to less than the voltage $V_{r2}$. To store "0", the encoding circuit 211 applies a predetermined voltage to the control gate electrode 6 of a memory cell so that its threshold voltage is less than the voltage $V_{r0}$. The above steps S11 and S12 form an EEPROM write method.

An operation of reading out identification numbers stored in a set of memory cells and outputting the readout numbers after converting them into binary data as shown in FIG. 19 will be described below. More specifically, the decoding circuit 213 selects a predetermined set of three memory cells from the memory cell array 212 and applies the voltage $V_{r0}$ to the control gate electrode 6 of a memory cell corresponding to the upper identification number (step S13). If a current flows between a source 3 and a drain 4 in step S13, the decoding circuit 213 determines that the identification number stored in this memory cell is "0" (step S13₁). If no current flows between the source 3 and the drain 4 in step S13, the decoding circuit 213 applies the voltage $V_{r1}$ to the control gate electrode 6 (step S14). If a current flows between the source 3 and the drain 4 in step S14, the decoding circuit 213 determines that the identification number stored in the memory cell is "1" (step S14₁). If no current flows between the source 3 and the drain 4 in step S14, the decoding circuit 213 determines that the identification number stored in the memory cell is "2" (step S14₂).

Subsequently, the decoding circuit 213 similarly performs the operations in steps S13 and S14 described above for memory cells corresponding to the middle and lower identification numbers and determines the identification numbers stored in these memory cells. In this manner, the decoding circuit 213 forms an identification number group including the high, middle, and lower identification numbers. It is of course also possible to first determine the lower identification number and then determine the middle and upper identification numbers.

Next, as shown in FIG. 20, the decoding circuit 213 outputs the identification number group including the upper, middle, and lower identification numbers after decoding it into binary data. More specifically, if the identification number group is "000", the decoding circuit 213 directly outputs this "000" as a correct data sequence (step S15). If the identification number group is "001" or "002", the decoding circuit 213 determines "002" as the original identification number group in accordance with the aforementioned rules, and outputs "001" as a correct data sequence (step S16). If the identification number group is "010" or "020", the decoding circuit 213 determines "020" as the original identification number group in accordance with the aforementioned rules, and outputs "010" as a correct data sequence (step S17). If the identification number group is any of "012", "021", and "022", the decoding circuit 213 determines "022" as the original identification number group in accordance with the aforementioned rules, and outputs "011" as a correct data sequence (step S18). If the identification number group is "100" or "200", the decoding circuit 213 determines "200" as the original identification number group in accordance with the aforementioned rules, and outputs "100" as a correct data sequence (step S19). If the identification number group is any of "102", "201", and "202", the decoding circuit 213 determines "202" as the original identification number group in accordance with the aforementioned rules, and outputs "101" as a correct data sequence (step S20). If the identification number group is any of "110", "210", and "220", the decoding circuit 213 determines "220" as the original identification number group in accordance with the aforementioned rules, and outputs "110" as a correct data sequence (step S21). If the identification number group is any of "122", "212", "221", and "222", the decoding circuit 213 determines "222" as the original identification number group in accordance with the aforementioned rules, and outputs "111" as a correct data sequence (step S22).

In the EEPROM of the fifth embodiment as described above, in writing and reading out a data sequence including eight-level information, an input data sequence is converted into an identification number group in accordance with the aforementioned assignment rules and read out by taking account only of the first transition probability. In this manner, it is possible to simply and accurately perform error correction and obtain a correct data sequence with high probability. Consequently, error correction can be efficiently and accurately performed.

Sixth Embodiment

Figure 21:
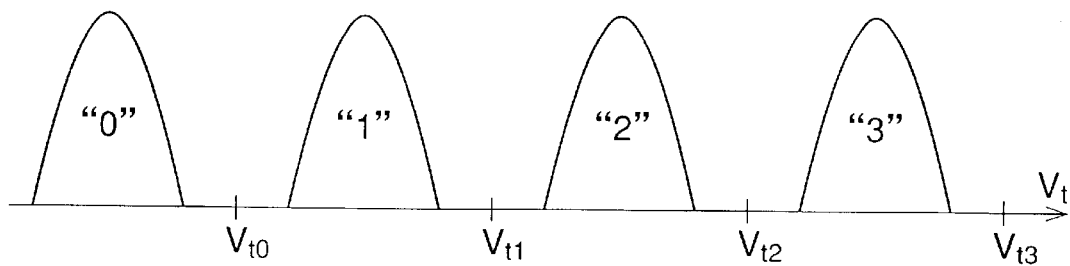
FIG. 21 is a graph showing the relationship between the data stored in a memory cell of an EEPROM according to the sixth embodiment of the present invention and the threshold value.
Figure 22:
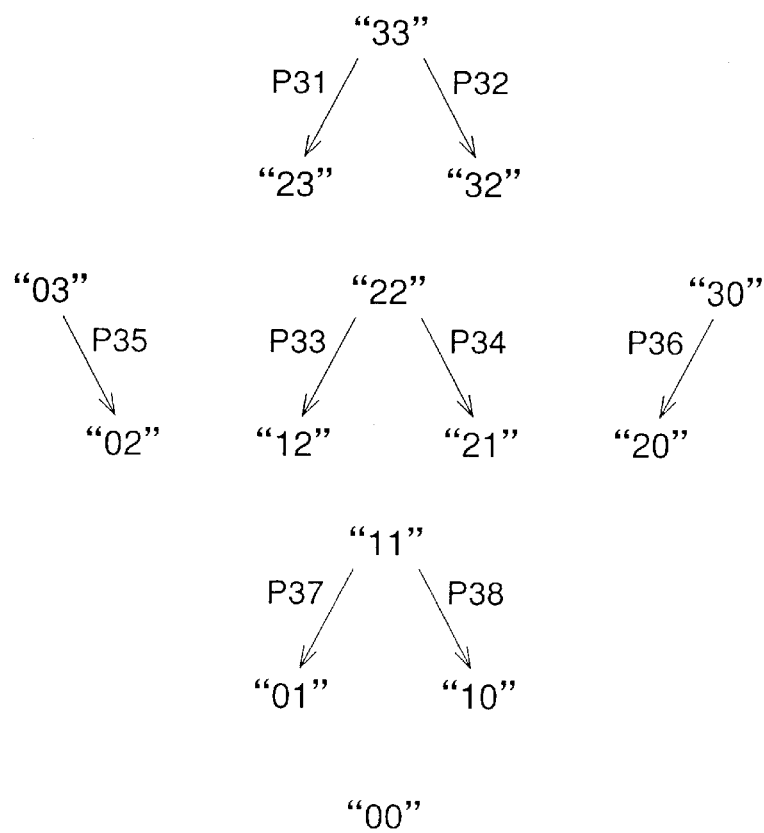
FIG. 22 is a schematic view showing the way an error occurs on the basis of transition probabilities in the sixth embodiment of the present invention.
Figure 23:
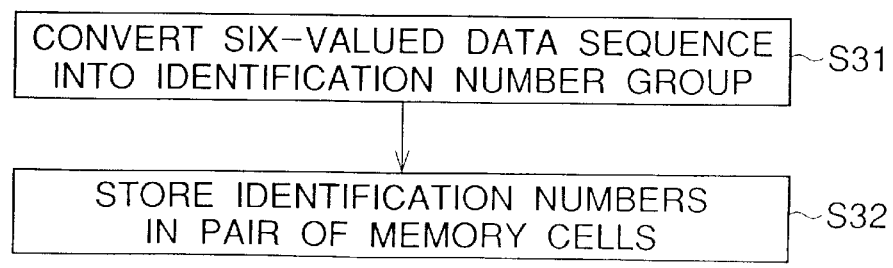
FIG. 23 is a flow chart showing a method of using the EEPROM in the sixth embodiment of the present invention.
Figure 24:
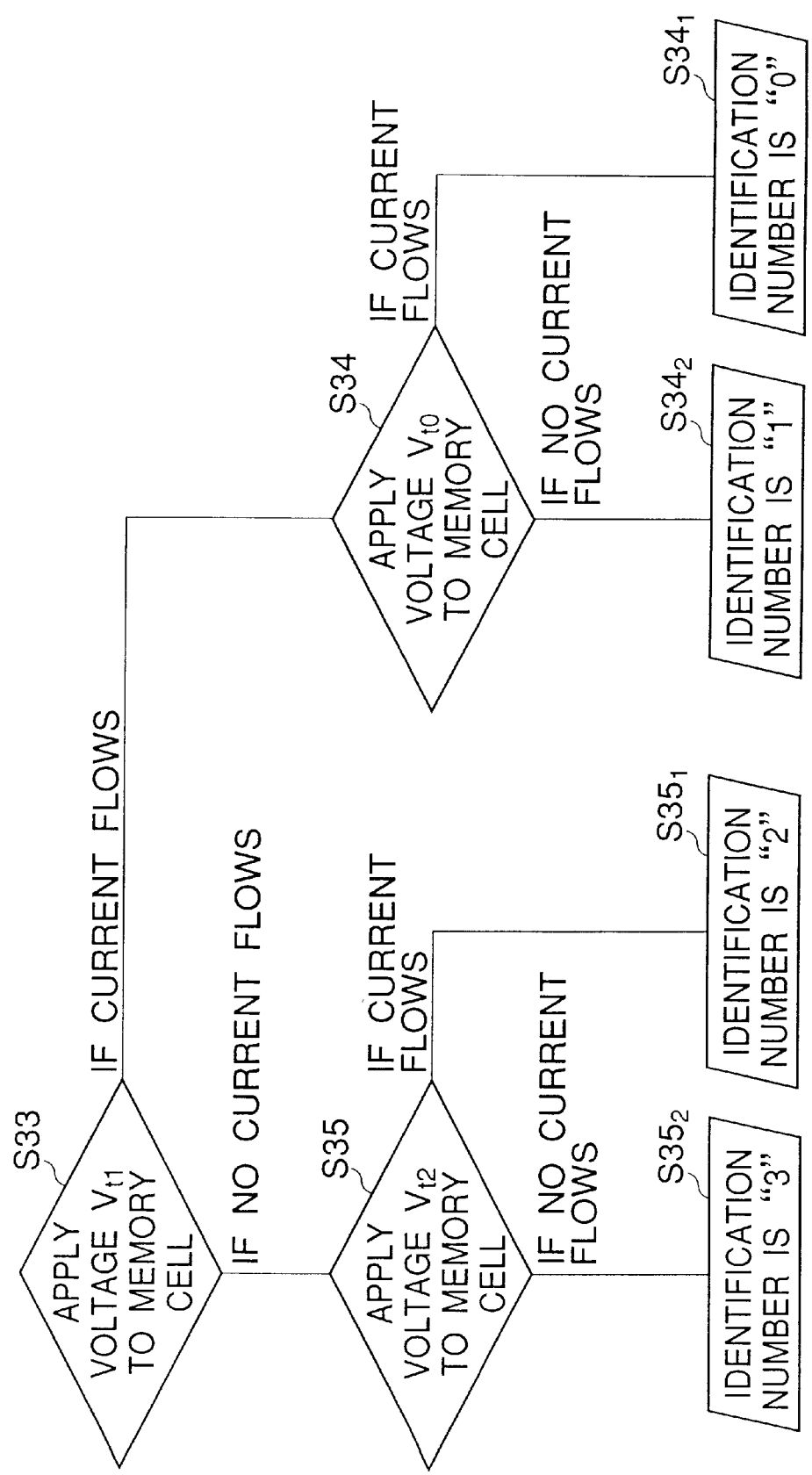
FIG. 24 is a continuation of FIG. 23, and shows the method of using the EEPROM in the sixth embodiment of the present invention.
Figure 25:
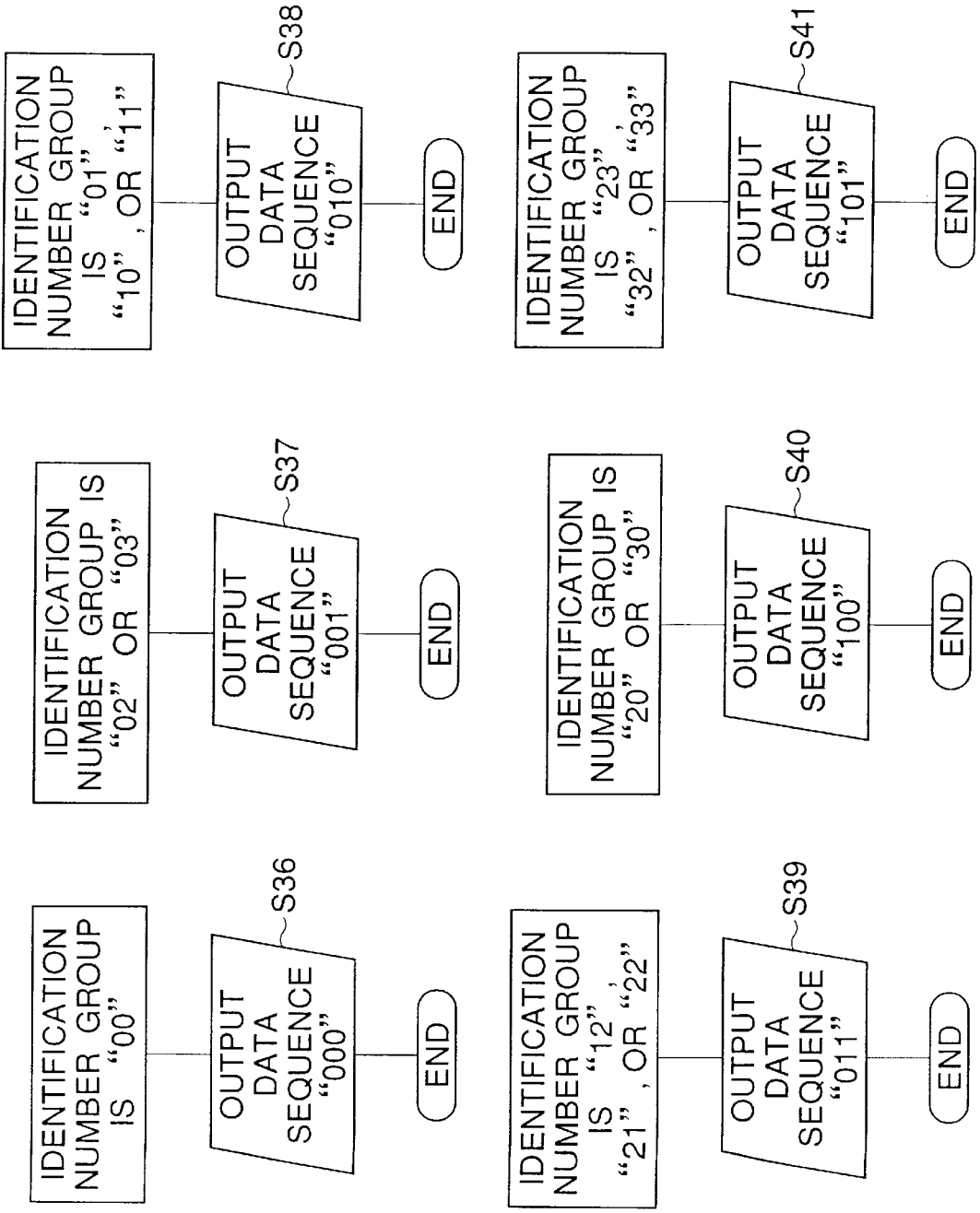
FIG. 25 is a continuation of FIG. 24, and shows the method of using the EEPROM in the sixth embodiment of the present invention.

The sixth embodiment of the present invention will be described below. In this sixth embodiment, an EEPROM as a nonvolatile semiconductor memory including memory cells each capable of storing four-level (four types of) information is used to write and read a data sequence containing six-level information. An outline of the whole arrangement of the EEPROM of the sixth embodiment is the same as in FIG. 11. The major components of a memory cell of this EEPROM are the same as in FIG. 1. FIG. 21 is a graph showing the relationship between the data stored in a memory cell and the threshold voltage. FIG. 22 is a schematic view showing the way an error occurs on the basis of transition probabilities. FIGS. 23 to 25 are flow charts showing a method of using this EEPROM in order of steps.

Similar to the EEPROM of the fourth embodiment, this EEPROM includes an encoding circuit 211, a memory cell array 212, and a decoding circuit 213. The encoding circuit 211 converts binary data. In the memory cell array 212, a large number of memory cells for storing data converted by the encoding circuit 211 are arranged in a matrix manner. The decoding circuit 213 performs error correction, if an error occurs in data of a memory cell, and decodes and outputs the data.

Upon receiving binary data in which a large number of "0"s or "1"s repeat themselves, the encoding circuit 211 divides this binary data in units of three bits to form any of data sequences "000", "001", "010", "011", "100", and "101". The encoding circuit 211 assigns this data sequence to an identification number group of two figures using four identification numbers "0", "1", "2", and "3" and stores the identification number group in two memory cells. More specifically, as shown in Table 5 below, input data sequences "000", "001", "010", "011", "100", and "101" are converted into identification number groups "00", "03", "11", "22", "30", and "33", respectively.

TABLE 5

| | Six-level binary data sequence | Four-level identification number group of two figures |
|---|---|---|
| 0 | 000 | 00 |
| 1 | 001 | 03 |
| 2 | 010 | 11 |
| 3 | 011 | 22 |
| 4 | 100 | 30 |
| 5 | 101 | 33 |

Data of four identification numbers "0", "1", "2", and "3" can be written in and read out from each memory cell. In a write operation, these four values are used. That is, when four identification numbers forming an identification number group are to be stored in two memory cells in a write operation, data "0", "1", "2", or "3" is stored as an upper identification number in a first memory cell. Similarly, data "0", "1", "2", or "3" is stored as a lower identification number in a second memory cell. In this manner one of identification number groups "00", "03", "11", "22", "30", and "33" is written.

In a memory cell read operation, the decoding circuit 213 reads out identification number groups "00", "02", "03", "01", "10", "11", "12", "21", "22", "20", "30", "23", "32", and "33" by using four threshold voltages $V_{r0}$, $V_{r1}$, $V_{r2}$, and $V_{r3}$. If the decoding circuit 213 determines that there is an error in data, the decoding circuit 213 corrects the data as will be described later and outputs the corrected data.

In each memory cell, as shown in FIG. 21, states wherein a threshold voltage $V_t$ is less than $V_{r0}$, $V_{r0}$ to less than $V_{r1}$, $V_{r1}$ to less than $V_{r2}$, and $V_{r2}$ to less than $V_{r3}$ are defined as states "0", "1", "2", and "3", respectively. In state "3", the largest amount of electric charge is stored in a floating gate electrode 5. In state "2", the second largest amount of electric charge is stored in the floating gate electrode 5. In state "1", the third largest amount of electric charge is stored in the floating gate electrode 5. In state "0", basically no electric charge is stored in the floating gate electrode 5.

If a memory cell deteriorates after the EEPROM is used for long time periods, a data error sometimes occurs in this memory cell. The probability of a transition from a lower state wherein electric charge in the floating gate electrode 5 is reduced to an upper state wherein electric charge is stored therein is much smaller than the probability of a transition from the upper state wherein electric charge is stored in the floating gate electrode 5 to the lower state wherein electric charge therein is reduced. That is, the probability (second transition probability) of a transition of only one identification number from state "2" to state "3", from state "1" to state "2", or from state "0" to state "1" is negligibly small compared to the probability (first transition probability) of a transition of only one identification number from state "3" to state "2", from state "2" to state "1", or from state "1" to state "0". In addition, the probability (third transition probability) of a two-step transition of only one identification number from state "3" to state "1" or from state "2" to state "0" is negligibly small compared to the first transition probability. Furthermore, the probability of a transition (fourth transition probability) of both identification numbers from state "3" to state "2", from state "2" to state "1", or from state "1" to state "0" is negligibly small compared to the first transition probability. Note that the probability that both identification numbers will change from "2" to "0" or from "3" to "0" or one identification number will change from "3" to "1" while the other will change from "1" to "2" can naturally be ignored from the above consideration. In the sixth embodiment, error correction is performed for a readout data sequence by using this inherent property of nonvolatile semiconductor memories represented by an EEPROM.

More specifically, as shown in FIG. 22, assume that the written identification number group is "33" and this identification number group "33" changes for some reason. As the third transition probability is small, the probability of change into an identification number group "31" or "13" upon reading can be ignored. As the fourth transition probability is small, the probability of change into "22" can also be ignored. Furthermore, as both the third and fourth transition probabilities are small, the probability of change into an identification number group "21", "12", "11", "10", "01", or "00" can be ignored. That is, only probabilities P31 and P32 of changes into "23" and "32" due to the first transition probability need to be considered. If the readout identification number group changes into "23" or "32", this identification number group has an error, and the correct identification number group is "33". Therefore, the decoding circuit 213 outputs an original correct data sequence "101" in accordance with the encoding rules of the encoding circuit 211.

Analogously, assume that the written identification number group is "22" and this identification number group "22" changes for some reason. Since the second to fourth transition probabilities are small, it is only necessary to consider probabilities P33 and P34 of changes into identification number groups "12" and "21" due to the first transition probability. Accordingly, if the readout identification number group is "12" or "21", this identification number group has an error, and the correct identification number group is "22". The decoding circuit 213 outputs an original correct data sequence "011" in accordance with the encoding rules of the encoding circuit 211.

Similarly, assume that the written identification number group is "03" and this identification number group "03" changes for some reason. Since the second to fourth transition probabilities are small, it is only necessary to consider probability P35 of change into an identification number group "02" due to the first transition probability. Accordingly, if the readout identification number group is "02", this identification number group has an error, and the correct identification number group is "03". The decoding circuit 213 outputs an original correct data sequence "001" in accordance with the encoding rules of the encoding circuit 211.

Likewise, assume that the written identification number group is "30" and this identification number group "30"

changes for some reason. Since the second to fourth transition probabilities are small, it is only necessary to consider probability P36 of change into the identification number group "20" due to the first transition probability. Accordingly, if the readout identification number group is "20", this identification number group has an error, and the correct identification number group is "30". The decoding circuit 213 outputs an original correct data sequence "100" in accordance with the encoding rules of the encoding circuit 211.

Assume also that the written identification number group is "11" and this identification number group "11" changes for some reason. Since the second to fourth transition probabilities are small, it is only necessary to consider probabilities P37 and P38 of changes into the identification number groups "01" and "10" due to the first transition probability. Accordingly, if the readout identification number group is "01" or "10", this identification number group has an error, and the correct identification number group is "11". The decoding circuit 213 outputs an original correct data sequence "010" in accordance with the encoding rules of the encoding circuit 211.

If the written identification number group is "00", the probability of data error is negligibly small considering particularly the second transition probability. Therefore, the encoding circuit 213 outputs an original correct data sequence "000" in accordance with the encoding rules of the encoding circuit 211.

The above decoding is summarized in Table 6 below.

TABLE 6

| | Four-level identification number group of two figures | Six-level binary data sequence |
| --- | --- | --- |
| 0 | 00 | 000 |
| 1 | 02 | 001 |
|   | 03 |   |
| 2 | 01 | 010 |
|   | 10 |   |
|   | 11 |   |
| 3 | 12 | 011 |
|   | 21 |   |
|   | 22 |   |
| 4 | 20 | 100 |
|   | 30 |   |
| 5 | 23 | 101 |
|   | 32 |   |
|   | 33 |   |

Methods (write and read methods) of using the EEPROM while performing error correction by using the above property will be described below with reference to FIGS. 23 to 25.

First, as shown in FIG. 23, the encoding circuit 211 divides input binary data in units of two bits to form any of data sequences "000", "001", "010", "011", "100", and "101", and converts the data sequence into a corresponding one of identification number groups "00", "03", "11", "22", "30", and "33" (step S31).

Next, of the converted identification number group (one of "00", "03", "11", "22", "30", and "33"), the encoding circuit 211 stores individual identification numbers in the respective corresponding memory cells (step S32). More specifically, to store "3", the encoding circuit 211 applies a predetermined voltage to a control gate electrode 6 of a memory cell so that its threshold voltage is the voltage $V_{t2}$ to less than the voltage $V_{t3}$. To store "2", the encoding circuit 211 applies a predetermined voltage to the control gate electrode 6 of a memory cell so that its threshold voltage is the voltage $V_{t1}$ to less than the voltage $V_{t2}$. To store "0", the encoding circuit 211 applies a predetermined voltage to the control gate electrode 6 of a memory cell so that its threshold voltage is less than the voltage $V_{t0}$. The above steps S31 and S32 form an EEPROM write method.

An operation of reading out identification numbers stored in a pair of memory cells and outputting the readout numbers after converting them into binary data as shown in FIG. 24 will be described below. More specifically, the decoding circuit 213 selects a predetermined pair of memory cells from the memory cell array 212, applies the voltage $V_{t1}$ to the control gate electrode 6 of a memory cell corresponding to the upper identification number, and checks whether a current flows (step S33).

If a current flows between a source 3 and a drain 4 in step S33, the decoding circuit 213 further applies the voltage $V_{t0}$ to the control gate electrode 6 (step S34). If a current flows between the source 3 and the drain 4 in step S34, the decoding circuit 213 determines that the identification number stored in this memory cell is "0" (step S34₁). If no current flows, the decoding circuit 213 determines that the identification number stored in the memory cell is "1" (step S34₂).

On the other hand, if no current flows between the source 3 and the drain 4 in step S33, the decoding circuit 213 further applies the voltage $V_{t2}$ to the control gate electrode 6 (step S35). If a current flows between the source 3 and the drain 4 in step S35, the decoding circuit 213 determines that the identification number stored in the memory cell is "2" (step S35₁). If no current flows, the decoding circuit 213 determines that the identification number stored in the memory cell is "3" (step S35₂).

Subsequently, the decoding circuit 213 similarly performs the operations in steps S33 to S35 described above for a memory cell corresponding to the lower identification number and determines the identification number stored in this memory cell. In this manner, the decoding circuit 213 forms an identification number group including the upper and lower identification numbers. It is of course also possible to first determine the lower identification number and then the upper identification number.

Next, as shown in FIG. 25, the decoding circuit 213 outputs the identification number group including the upper and lower identification numbers after decoding it into binary data. More specifically, if the identification number group is "00", the decoding circuit 213 directly outputs "000" as a correct data sequence (step S36). If the identification number group is "02" or "03", the decoding circuit 213 determines "03" as the original identification number group in accordance with the aforementioned rules, and outputs "001" as a correct data sequence (step S37). If the identification number group is any of "01", "10", and "11", the decoding circuit 213 determines "11" as the original identification number group in accordance with the aforementioned rules, and outputs "010" as a correct data sequence (step S38). If the identification number group is any of "12", "21", and "22", the decoding circuit 213 determines "22" as the original identification number group in accordance with the aforementioned rules, and outputs "011" as a correct data sequence (step S39). If the identification number group is "20" or "30", the decoding circuit 213 determines "30" as the original identification number group in accordance with the aforementioned rules, and outputs "100" as a correct data sequence (step S40). If the identification number group is any of "23", "32", and "33", the decoding circuit 213 determines "33" as the original identification number group in accordance with the aforementioned rules, and outputs "101" as a correct data sequence (step S41).

Note that combinations other than shown in Tables 1 to 6 can also be used as the state assignments between data sequences and identification number groups.

In the EEPROM of the sixth embodiment as described above, in writing and reading out a data sequence including six-level information, an input data sequence is converted into an identification number group in accordance with the aforementioned assignment rules and read out by taking account only of the first transition probability. In this manner, it is possible to simply and accurately perform error correction and obtain a correct data sequence with high probability. Consequently, error correction can be efficiently and accurately performed.

Modification

Figure 26:
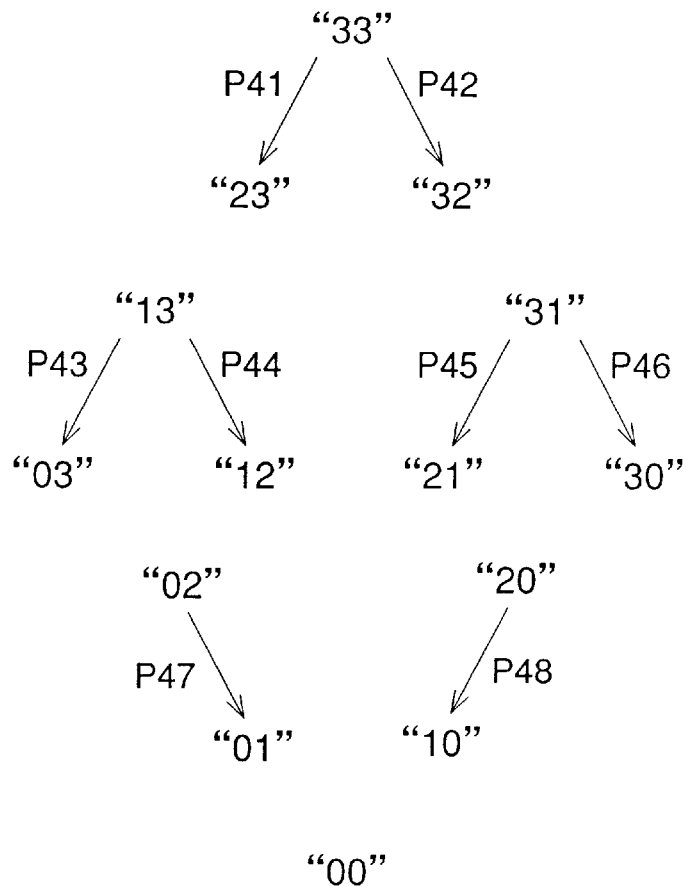
FIG. 26 is a schematic view showing the way an error occurs on the basis of transition probabilities in a modification of the sixth embodiment of the present invention.
Figure 27:
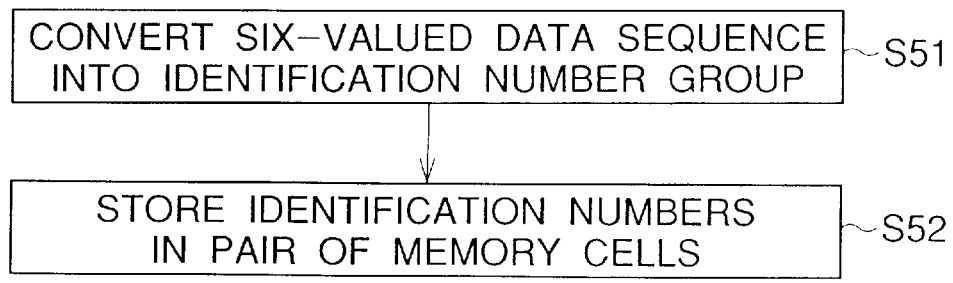
FIG. 27 is a flow chart showing a method of using the EEPROM in the modification of the sixth embodiment of the present invention.
Figure 28:
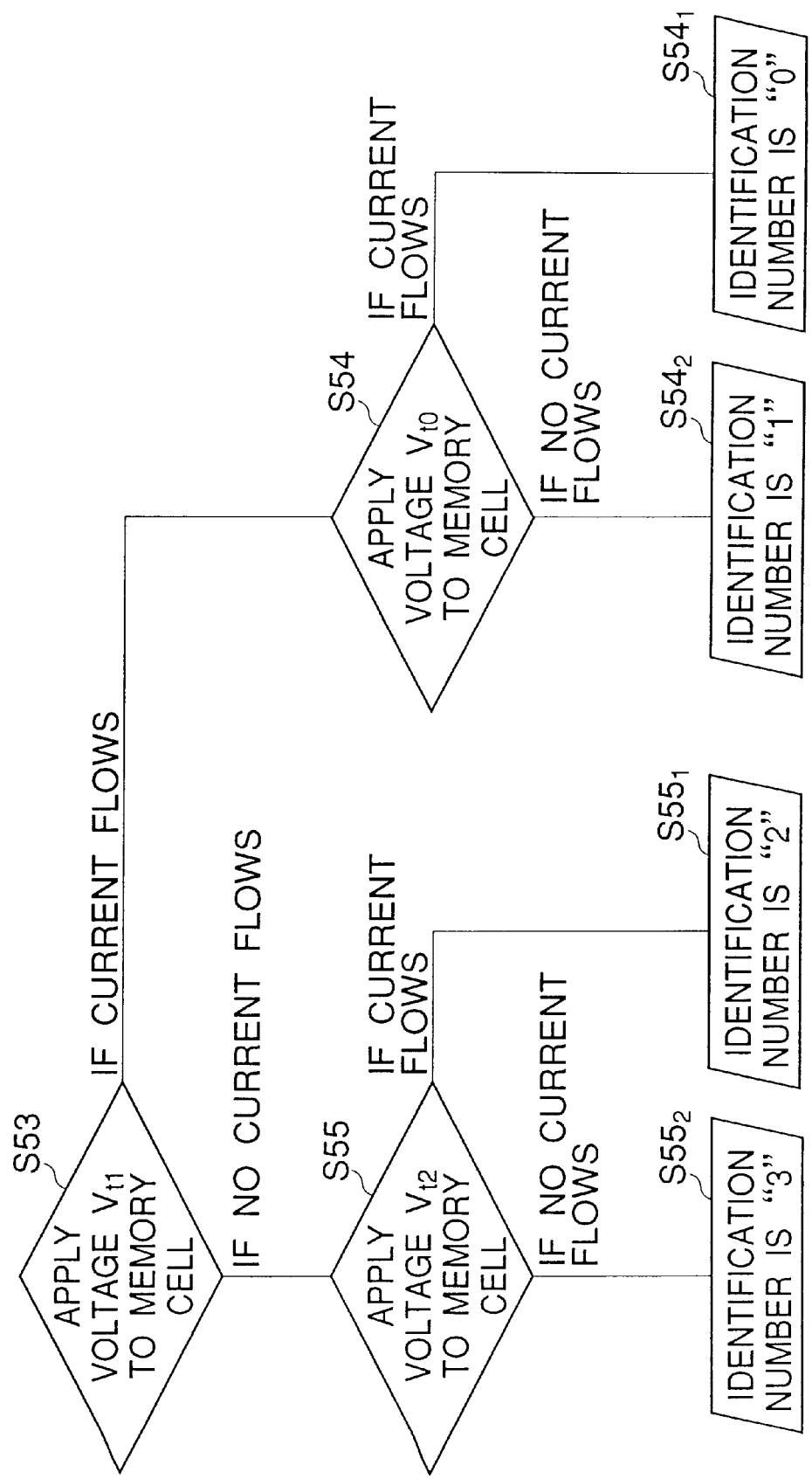
FIG. 28 is a continuation of FIG. 27, and shows the method of using the EEPROM in the modification of the sixth embodiment of the present invention.
Figure 29:
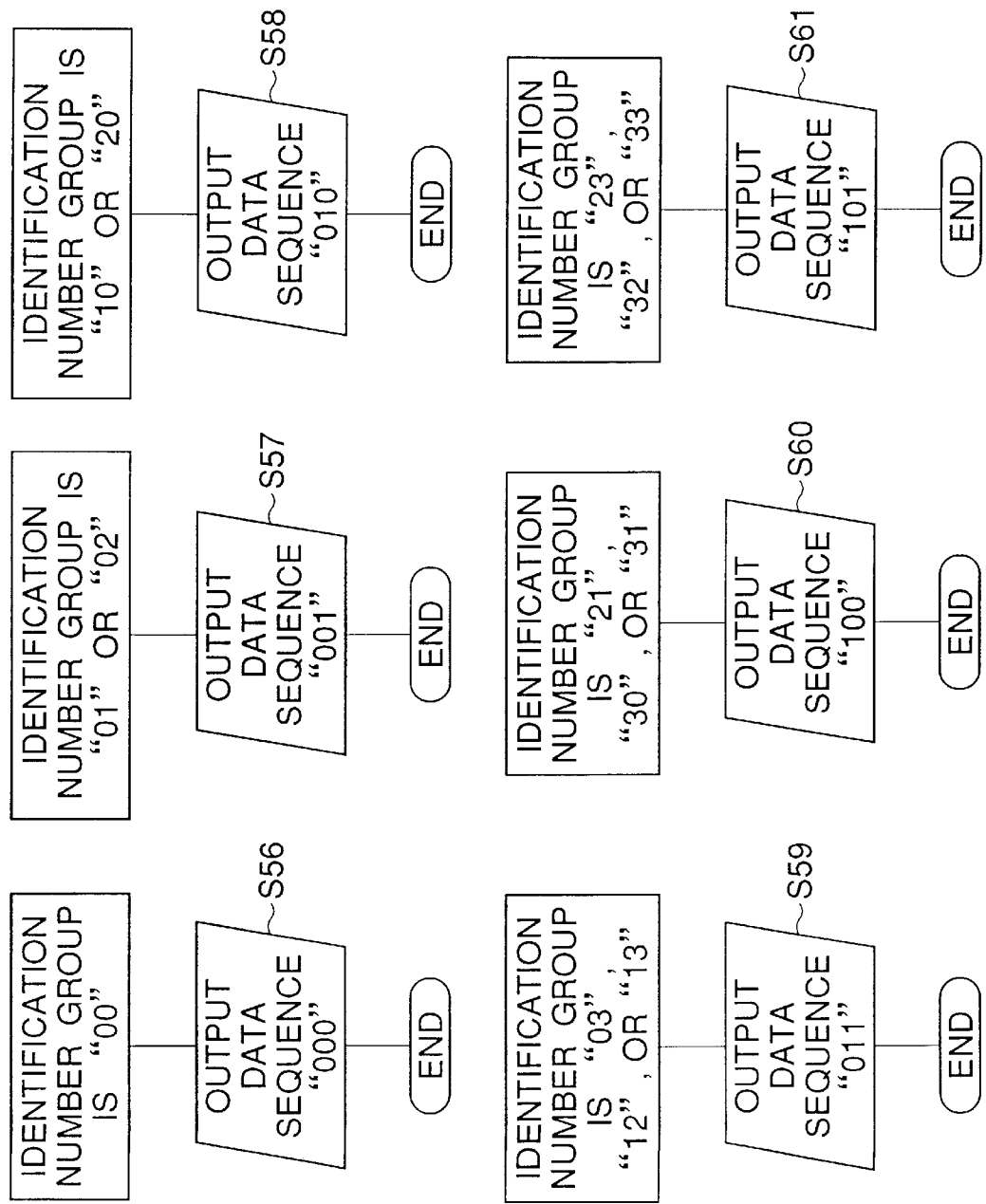
FIG. 29 is a continuation of FIG. 28, and shows the method of using the EEPROM in the modification of the sixth embodiment of the present invention.

A modification of the EEPROM of the sixth embodiment will be described below. An EEPROM of this modification has nearly the same arrangement as that of the sixth embodiment except for identification number groups assigned to data sequences. An outline of the whole arrangement of this EEPROM and the major components of a memory cell of the EEPROM are almost identical with those of the sixth embodiment. FIG. 26 is a schematic view showing the way an error occurs on the basis of transition probabilities. FIGS. 27 to 29 are flow charts showing a method of using this EEPROM in order of steps.

Upon receiving binary data formed from a large number of "0"s or "1"s, the encoding circuit 211 breaks up this binary data in units of three bits to form any of data sequences "000", "001", "010", "011", "100", and "101". The encoding circuit 211 assigns this data sequence to an identification number group of two figures using four identification numbers "0", "1", "2", and "3" and stores the identification number group in two memory cells. More specifically, as shown in Table 7 below, input data sequences "000", "001", "010", "011", "100", and "101" are converted into identification number groups "00", "20", "13", "31", and "33", respectively.

TABLE 7

|   | Six-level binary data sequence | Three-level identification number group of three figures |
| --- | --- | --- |
| 0 | 000 | 00 |
| 1 | 001 | 02 |
| 2 | 010 | 20 |
| 3 | 011 | 13 |
| 4 | 100 | 31 |
| 5 | 101 | 33 |

Error correction is performed as follows. As shown in FIG. 26, assume that the written identification number group is "33" and this identification number group "33" changes for some reason. As the third transition probability is small, the probability of change into an identification number group "31" or "13" upon reading can be ignored. As the fourth transition probability is small, the probability of change into "22" can also be ignored. Furthermore, since both the third and fourth transition probabilities are small, the probability of change into an identification number group "21", "12", "11", "10", "01", or "00" can be ignored. That is, only probabilities P41 and P42 of changes into "23" and "32" due to the first transition probability need to be considered. If the readout identification number group changes into "23" or "32", this identification number group has an error, and the correct identification number group is "33". Hence, the decoding circuit 213 outputs an original correct data sequence "101" in accordance with the encoding rules of the encoding circuit 211.

Analogously, assume that the written identification number group is "13" and this identification number group "13" changes for some reason. Since the second to fourth transition probabilities are small, it is only necessary to consider probabilities P43 and P44 of changes into identification number groups "03" and "12" due to the first transition probability. Accordingly, if the readout identification number group is "03" or "12", this identification number group has an error, and the correct identification number group is "13". The decoding circuit 213 outputs an original correct data sequence "011" in accordance with the encoding rules of the encoding circuit 211.

Similarly, assume that the written identification number group is "31" and this identification number group "31" changes for some reason. Since the second to fourth transition probabilities are small, it is only necessary to consider probabilities P45 and P46 of changes into identification number groups "21" and "30" due to the first transition probability. Accordingly, if the readout identification number group is "21" or "30", this identification number group has an error, and the correct identification number group is "31". The decoding circuit 213 outputs an original correct data sequence "100" in accordance with the encoding rules of the encoding circuit 211.

Likewise, assume that the written identification number group is "02" and this identification number group "02" changes for some reason. Since the second to fourth transition probabilities are small, it is only necessary to consider probability P47 of change into an identification number group "01" due to the first transition probability. Accordingly, if the readout identification number group is "01", this identification number group has an error, and the correct identification number group is "02". The decoding circuit 213 outputs an original correct data sequence "001" in accordance with the encoding rules of the encoding circuit 211.

Assume also that the written identification number group is "20" and this identification number group "20" changes for some reason. Since the second to fourth transition probabilities are small, it is only necessary to consider probability P48 of change into an identification number group "10" due to the first transition probability. Accordingly, if the readout identification number group is "10", this identification number group has an error, and the correct identification number group is "20". The decoding circuit 213 outputs an original correct data sequence "010" in accordance with the encoding rules of the encoding circuit 211.

If the written identification number group is "00", the probability of data error is negligibly small considering particularly the second transition probability. Therefore, the decoding circuit 213 outputs an original correct data sequence "000" in accordance with the encoding rules of the encoding circuit 211.

The above decoding is summarized in Table 8 below.

TABLE 8

| Four-level identification number group of two figures | | Six-level binary data sequence |
|---|---|---|
| 0 | 00 | 000 |
| 1 | 01 | 001 |
|   | 02 |   |
| 2 | 10 | 010 |
|   | 20 |   |
| 3 | 03 | 011 |
|   | 12 |   |
|   | 13 |   |
| 4 | 21 | 100 |
|   | 30 |   |
|   | 31 |   |
| 5 | 23 | 101 |
|   | 32 |   |
|   | 33 |   |

Methods (write and read methods) of using the EEPROM while performing error correction by using the above property will be described below with reference to FIGS. 27 to 29.

First, as shown in FIG. 27, the encoding circuit 211 divides input binary data in units of two bits to form any of data sequences "000", "001", "010", "011", "100", and "101", and converts the data sequence into a corresponding one of identification number groups "00", "02", "20", "13", "31", and "33" (step S51).

Next, of the converted identification number group (one of "00", "02", "20", "13", "31", and "33"), the encoding circuit 211 stores individual identification numbers in the respective corresponding memory cells (step S52). More specifically, to store "3", the encoding circuit 211 applies a predetermined voltage to the control gate electrode 6 of a memory cell so that its threshold voltage is the voltage $V_{r2}$ to less than the voltage $V_{r3}$. To store "2", the encoding circuit 211 applies a predetermined voltage to the control gate electrode 6 of a memory cell so that its threshold voltage is the voltage $V_{r1}$ to less than the voltage $V_{r2}$. To store "0", the encoding circuit 211 applies a predetermined voltage to the control gate electrode 6 of a memory cell so that its threshold voltage is less than the voltage $V_{r0}$. The above steps S51 and S52 form an EEPROM write method.

An operation of reading out identification numbers stored in a pair of memory cells and outputting the readout numbers after converting them into binary data as shown in FIG. 28 will be described below. More specifically, the decoding circuit 213 selects a predetermined pair of memory cells from the memory cell array 212, applies the voltage $V_{r1}$ to the control gate electrode 6 of a memory cell corresponding to the upper identification number, and checks whether a current flows (step S53)

If a current flows between the source 3 and the drain 4 in step S53, the decoding circuit 213 further applies the voltage $V_{r0}$ to the control gate electrode 6 (step S54). If a current flows between the source 3 and the drain 4 in step S54, the decoding circuit 213 determines that the identification number stored in this memory cell is "0" (step S54₁). If no current flows, the decoding circuit 213 determines that the identification number stored in the memory cell is "1" (step S54₂).

On the other hand, if no current flows between the source 3 and the drain 4 in step S53, the decoding circuit 213 further applies the voltage $V_{r2}$ to the control gate electrode 6 (step S55). If a current flows between the source 3 and the drain 4 in step S55, the decoding circuit 213 determines that the identification number stored in the memory cell is "2" (step S55₁). If no current flows, the decoding circuit 213 determines that the identification number stored in the memory cell is "3" (step S55₂).

Subsequently, the decoding circuit 213 similarly performs the operations in steps S53 to S55 described above for a memory cell corresponding to the lower identification number and determines the identification number stored in this memory cell. In this manner, the decoding circuit 213 forms an identification number group including the upper and lower identification numbers. It is of course also possible to first determine the lower identification number and then the upper identification number.

Next, as shown in FIG. 29, the decoding circuit 213 outputs the identification number group including the upper and lower identification numbers after decoding it into binary data. More specifically, if the identification number group is "00", the decoding circuit 213 directly outputs "000" as a correct data sequence (step S56). If the identification number group is "01" or "02", the decoding circuit 213 determines "02" as the original identification number group in accordance with the aforementioned rules, and outputs "001" as a correct data sequence (step S57). If the identification number group is "10" or "20", the decoding circuit 213 determines "20" as the original identification number group in accordance with the aforementioned rules, and outputs "010" as a correct data sequence (step S58). If the identification number group is any of "03", "12", and "13", the decoding circuit 213 determines "13" as the original identification number group in accordance with the aforementioned rules, and outputs "011" as a correct data sequence (step S59). If the identification number group is any of "21", "30", and "31", the decoding circuit 213 determines "31" as the original identification number group in accordance with the aforementioned rules, and outputs "100" as a correct data sequence (step S60). If the identification number group is any of "23", "32", and "33", the decoding circuit 213 regards the original identification number group as "33" in accordance with the aforementioned rules, and outputs "101" as a correct data sequence (step S61).

In the EEPROM of the modification of the sixth embodiment as described above, in writing and reading out a data sequence including six-level information, an input data sequence is converted into an identification number group in accordance with the aforementioned assignment rules and read out by taking account only of the first transition probability. In this manner, it is possible to simply and accurately perform error correction and obtain a correct data sequence with high probability. Consequently, error correction can be efficiently and accurately performed.

Note that this embodiment has been explained by taking an EEPROM as an example of a nonvolatile semiconductor memory. However, the present invention is not limited to this embodiment. That is, the present invention is applicable to any device having a charge storage layer. Examples are an EPROM, an MNOS, and a flash memory. The present invention can also be applied to a DRAM as a volatile semiconductor memory under predetermined conditions.

Note also that this EEPROM of the fourth to sixth embodiments and the modification includes a switching means 101 as shown in FIG. 11. This switching means 101 is used to switch between a case wherein a fixed number of memory cells (e.g., half) making up the memory cell array 212 are used for parity bits for error correction and a case wherein all of the memory cells 10 are used for common information bits. That is, it is sometimes necessary to attach importance to the accuracy of information even at the sacrifice of the storage capacity to some extent. Conversely, the storage capacity must be fully utilized in some instances. The switching means 101 achieves such various purposes of the EEPROM.

The present invention includes program codes for operating, e.g., a common EEPROM to realize the functions of the use methods explained with reference to FIGS. 14 to 16, 18 to 20, 23 to 25, and 27 to 29 in the fourth to sixth embodiments and the modification, and means for supplying the program codes to a computer, e.g., a storage medium 221 storing the program codes as shown in FIG. 11.

If this is the case, a memory reader 222 reads out the program codes from the storage medium 221 incorporated into this memory reader 222 and operates an EEPROM. As this storage medium 221 for storing the program codes, it is possible to use a floppy disk, a hard disk, an optical disk, magnetooptical disk, a CD-ROM, a magnetic tape, a nonvolatile memory card, or a ROM.

Also, not only when the functions of each embodiment are realized by executing supplied program codes by a computer, but also when the program codes cooperate with an OS (Operating System) or some other application software running on the computer and realize the functions of each embodiment, the present invention includes these program codes.

Furthermore, the present invention also includes a system wherein, after supplied program codes are written in a function extension board of a computer or in a memory of a function extension unit connected to the computer, a CPU or the like incorporated into the function extension board or the function extension unit partially or entirely performs an actual process in accordance with designations from the program codes and realizes the functions of each embodiment.

Seventh Embodiment

Figure 30:
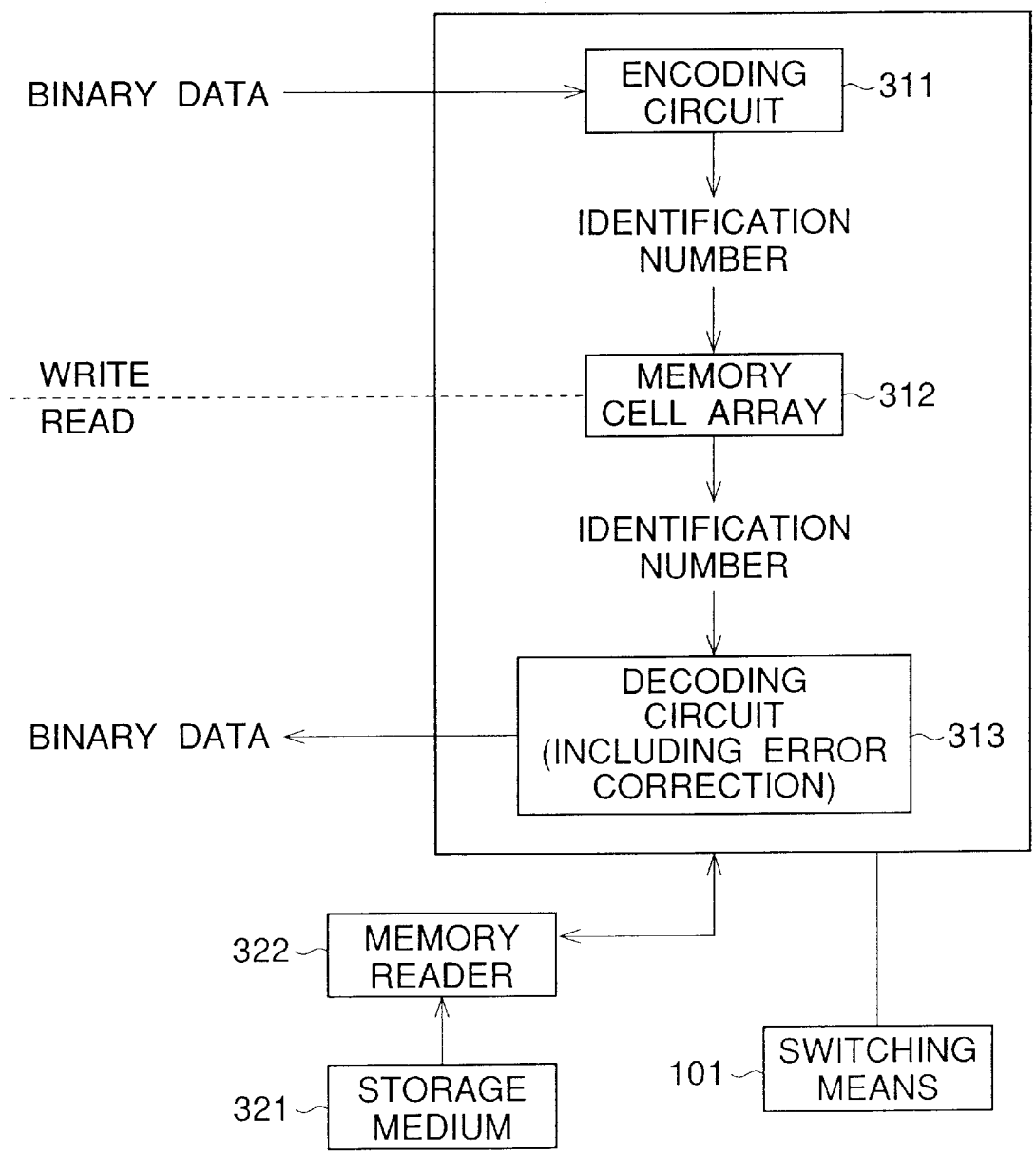
FIG. 30 is a block diagram showing an outline of the whole arrangement of a nonvolatile semiconductor memory according to the seventh and eighth embodiments of the present invention.
Figure 31:
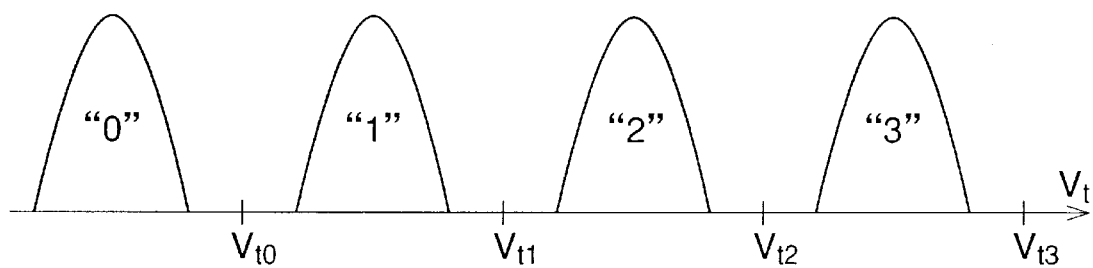
FIG. 31 is a graph showing the relationship between the data stored in a memory cell of an EEPROM according to the seventh embodiment of the present invention and the threshold value.
Figure 32:
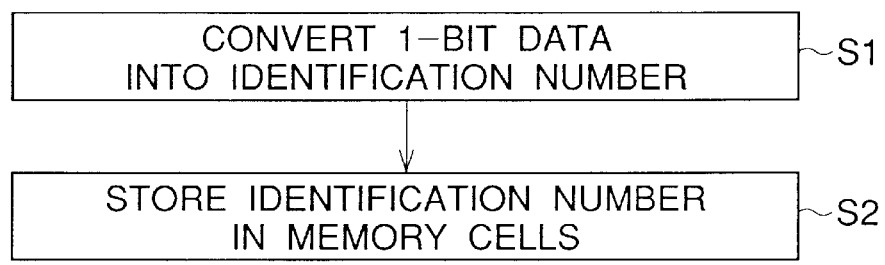
FIG. 32 is a flow chart showing a method of using the EEPROM in the seventh embodiment of the present invention.
Figure 33:
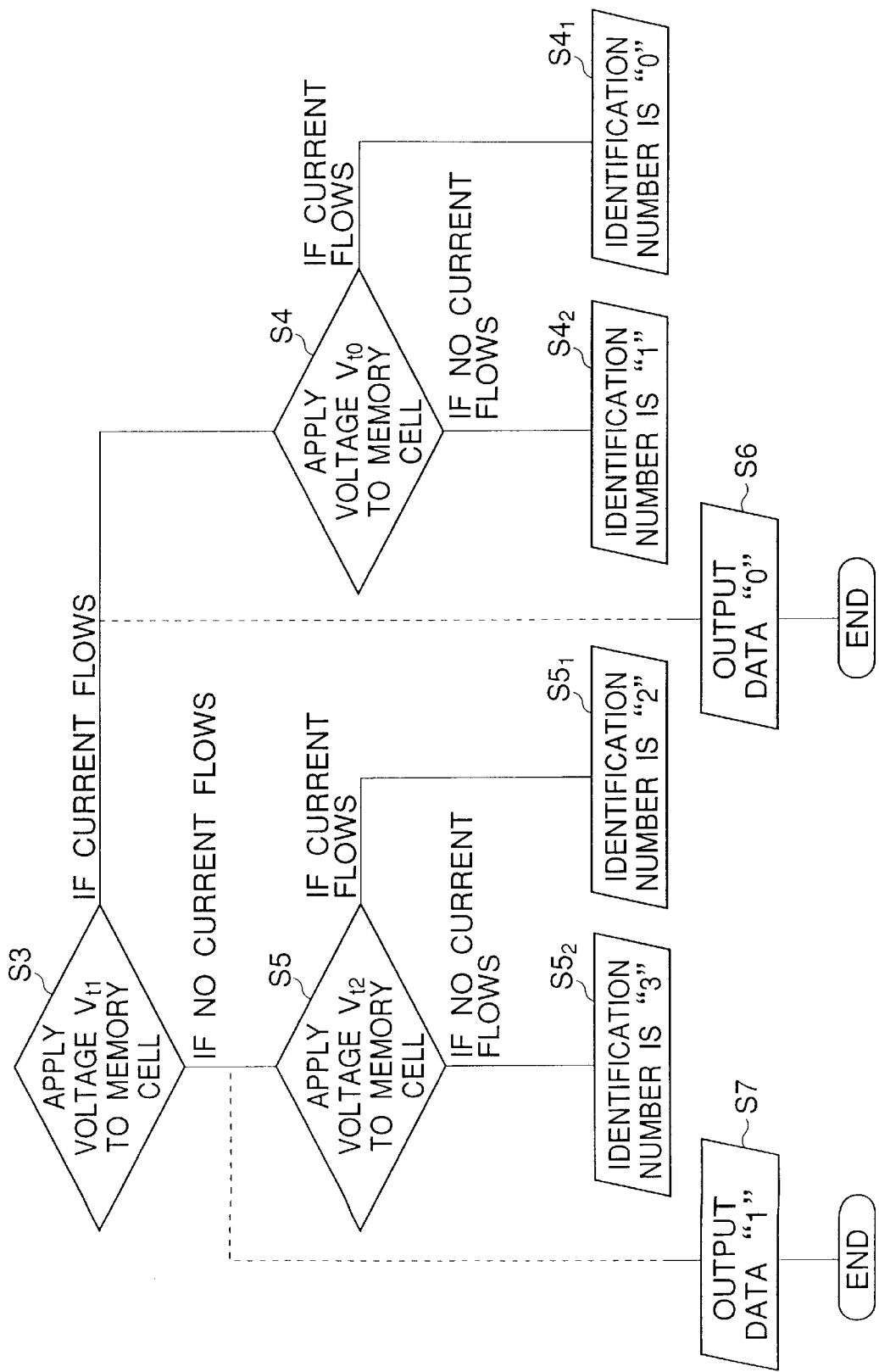
FIG. 33 is a continuation of FIG. 32, and shows the method of using the EEPROM in the seventh embodiment of the present invention.
Figure 34:
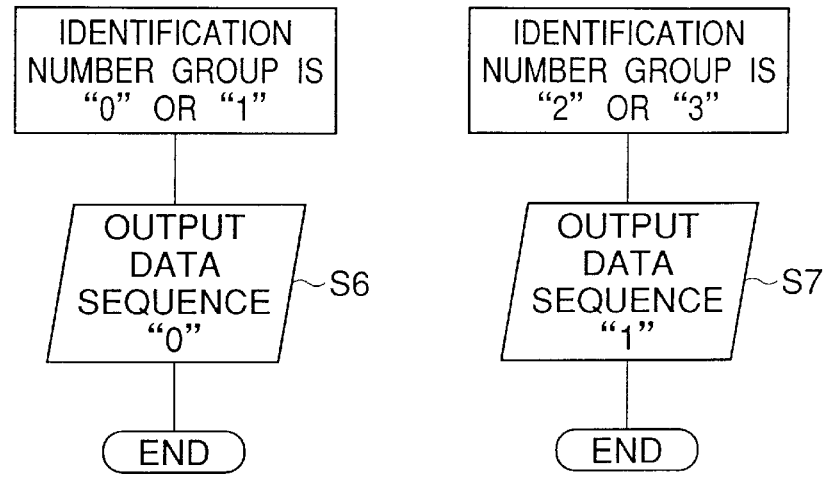
FIG. 34 is a continuation of FIG. 33, and shows the method of using the EEPROM in the seventh embodiment of the present invention.

The seventh embodiment of the present invention will be described below. In this seventh embodiment, an EEPROM as a nonvolatile semiconductor memory including memory cells each capable of storing four-level (four types of) information is used to write and read data containing four-level (1-bit) information. FIG. 30 is a block diagram showing an outline of the whole arrangement of the EEPROM of the fourth embodiment. FIG. 31 is a graph showing the relationship between the data stored in a memory cell and the threshold voltage. FIGS. 32 to 34 are flow charts showing a method of using this EEPROM in order of steps.

As shown in FIG. 30, the EEPROM of the seventh embodiment includes an encoding circuit 311, a memory cell array 312, and a decoding circuit 313. The encoding circuit 311 converts binary data. In the memory cell array 312, a large number of memory cells for storing data converted by the encoding circuit 311 are arranged in a matrix manner. The decoding circuit 313 performs error correction, if an error occurs in data of a memory cell, and decodes and outputs the data.

Upon receiving binary data in which a large number of "0"s or "1"s run, the encoding circuit 311 divides this binary data in units of bits to form data "0" or "1". The encoding circuit 311 assigns the data to "1" or "3" of four identification numbers "0", "1", "2", and "3" and stores it in one memory cell. More specifically, as shown in Table 9 below, input data "0" and "1" are converted into identification numbers "1" and "3", respectively.

TABLE 9

| 1-bit binary data | Four-level identification number |
|---|---|
| 0 | 1 |
| 1 | 3 |

Each memory cell of the memory cell array 312 has the same structure as the memory cell of the first embodiment shown in FIG. 1. That is, on a p-type silicon semiconductor substrate 1, a source 3 and a drain 4 as a pair of impurity diffusion layers are formed by ion-implanting an n-type impurity such as phosphorus (P) or arsenic (As) into a surface region of an element active region 2 defined by an element isolation structure made from, e.g., a field oxide film. A floating gate electrode 5 as an electron capture layer is formed by patterning on a channel region C between the source 3 and the drain 4 via a tunnel oxide film 7. A control gate electrode 6 is formed by patterning on the floating gate electrode 5 via a dielectric film 8.

Four identification numbers "0", "1", "2", and "3" can be written in and read out from each memory cell. In a write operation, only "1" and "3" of the four values are used. That is, in a write operation, an identification number converted by the encoding circuit 311 is stored in one corresponding memory cell.

In a memory cell read operation, the decoding circuit 313 reads out identification numbers "0", "1", "2", and "3" by using four threshold voltages $V_{t0}$, $V_{t1}$, $V_{t2}$, and $V_{t3}$. If the decoding circuit 313 determines that there is an error in data, the decoding circuit 313 corrects the data as will be described later and outputs the corrected data.

In each memory cell, as shown in FIG. 31, states wherein a threshold voltage $V_t$ is less than $V_{t0}$, $V_{t0}$ to less than $V_{t1}$, $V_{t1}$ to less than $V_{t2}$, and $V_{t2}$ to less than $V_{t3}$ are defined as states "0", "1", "2", and "3", respectively. In state "3", the largest amount of electric charge is stored in the floating gate electrode 5. In state "2", the second largest amount of electric charge is stored in the floating gate electrode 5. In state "1", the third largest amount of electric charge is stored in the floating gate electrode 5. In state "0", basically no electric charge is stored in the floating gate electrode 5.

If a memory cell deteriorates after the EEPROM is used for long time periods, a data error sometimes occurs in this memory cell. The probability of a transition from a lower state wherein electric charge in the floating gate electrode 5 is reduced to an upper state wherein electric charge is stored therein is much smaller than the probability of a transition from the upper state wherein electric charge is stored in the floating gate electrode 5 to the lower state wherein electric charge therein is reduced. That is, the probability (second transition probability) of a transition of an identification number from state "1" to state "2" is negligibly small compared to the probability (first transition probability) of a transition of an identification number from state "3" to state "2" or from state "1" to state "0". In addition, the probability (third transition probability) of a two-step transition of an identification number from state "3" to state "1" is negligibly small compared to the first transition probability. Note that the probability that an identification number will change from "3" to "0" or from "1" to "3" can naturally be ignored in the light of the above explanation. In the seventh embodiment, error correction is performed for readout data by using this inherent property of nonvolatile semiconductor memories represented by an EEPROM.

More specifically, assume that the written identification number is "3" and this identification number "3" changes for some reason. Since the third transition probability is small, the probability of change into an identification number "1" or "0" upon reading can be ignored. Accordingly, only probability P1 of change into an identification number "2" upon reading due to the first transition probability need to be considered. If the readout identification number is "2", this identification number has an error, and the correct identification number is "3". Therefore, the decoding circuit 313 outputs original correct data "1" in accordance with the encoding rules of the encoding circuit 311.

Analogously, assume that the written identification number is "1" and this identification number "1" changes for some reason. Since the second transition probability is small, it is only necessary to consider probability P2 of change into an identification number "0" due to the first transition probability. Accordingly, if the readout identification number is "0", this identification number has an error, and the correct identification number is "1". The decoding circuit 313 outputs original correct data "0" in accordance with the encoding rules of the encoding circuit 311.

The above decoding is summarized in Table 10 below.

TABLE 10

| Four-level identification number | 1-bit binary data |
|---|---|
| 0 | 0 |
| 1 | |
| 2 | 1 |
| 3 | |

Methods (write and read methods) of using the EEPROM while performing error correction by using the above property will be described below with reference to FIGS. 32 to 34.

First, as shown in FIG. 32, the encoding circuit 311 divides input binary data in units of bits to form data "0" or "1", and converts the data into an identification number "1" or "3" (step S1).

Next, the encoding circuit 311 stores the converted identification number in a corresponding memory cell (step S2). More specifically, to store "3", the encoding circuit 311 applies a voltage to the control gate electrode 6 of a memory cell so that its threshold voltage $V_t$ is the voltage $V_{t2}$ to less than the voltage $V_{t3}$. To store "1", the encoding circuit 311 applies a voltage to the control gate electrode 6 of a memory cell so that its threshold voltage $V_t$ is less than the voltage $V_{t1}$. The above steps S1 and S2 form an EEPROM write method.

An operation of reading out an identification number stored in a memory cell and outputting the readout number after converting it into binary data as shown in FIG. 33 will be described below. More specifically, the decoding circuit 313 selects a predetermined memory cell from the memory cell array 312 and applies the voltage $V_{t1}$ to the control gate electrode 6 of the memory cell to check whether a current flows (step S2).

If a current flows between the source 3 and the drain 4 in step S2, the decoding circuit 313 further applies the voltage $V_{t0}$ to the control gate electrode 6 (step S4). If a current flows between the source 3 and the drain 4 in step S4, the decoding circuit 313 determines that the identification number stored in this memory cell is "0" (step S4$_1$). If no current flows, the decoding circuit 313 determines that the identification number stored in the memory cell is "1" (step S4$_2$)

On the other hand, if no current flows between the source 3 and the drain 4 in step S3, the decoding circuit 313 further applies the voltage $V_{t2}$ to the control gate electrode 6 (step S5). If a current flows between the source 3 and the drain 4 in step S5, the decoding circuit 313 determines that the identification number stored in the memory cell is "2" (step S5$_1$). If no current flows, the decoding circuit 313 determines that the identification number stored in the memory cell is "3" (step S5$_2$).

Next, as shown in FIG. 34, the decoding circuit 313 outputs the identification number after decoding it into binary data. More specifically, if the identification number is "0", the decoding circuit 313 determines "1" as the original identification number in accordance with the aforementioned rules, and outputs "0" as correct data (step S6). If the identification number is "1", this identification number has no data error, so the decoding circuit 313 outputs "0" as correct data (step S6). If the identification number is "2", the decoding circuit 313 determines "3" as the original identification number in accordance with the aforementioned rules, and outputs "1" as correct data (step S7). If the identification number is "3", this identification number has no data error, so the decoding circuit 313 outputs "1" as correct data (step S7).

A simpler method can also be used in reading out, converting, and outputting an identification number stored in a memory cell. That is, as indicated by the broken lines in FIG. 33, if a current flows in step S3, "0" is determined as the original data and output (step S6). If no current flows in step S3, "1" is determined as the original data and output (step S7).

In the EEPROM of the seventh embodiment as described above, in writing and reading out two-level (1-bit) data, a multi-level memory cell capable of storing four-level (two bits) data is used to convert input data into an identification number in accordance with the aforementioned assignment rules. In a read operation, only the first transition probability is taken into consideration. In this manner, it is possible to simply and accurately perform error correction and obtain correct data with high probability. This essentially amounts to adding one redundancy bit to one information bit. Consequently, error correction can be efficiently and accurately performed in an EEPROM having a memory cell array formed by multi-level memory cells.

Additionally, only one two bits, multi-level memory cell need to be used to store one 1-bit data in an error correctable state. Therefore, it is well possible to further increase the capacity of a device.

Eighth Embodiment

Figure 35:
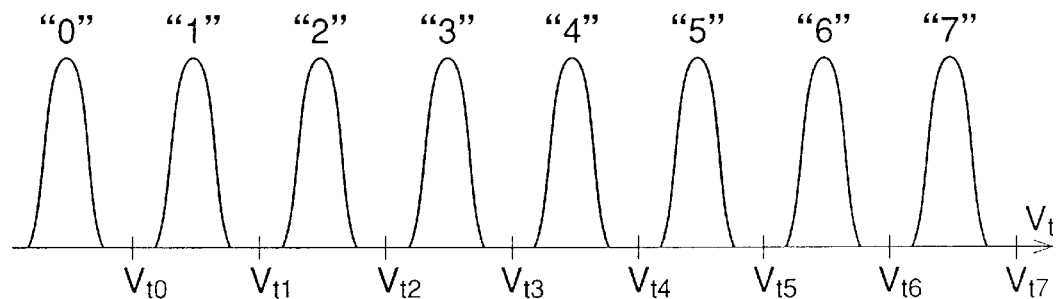
FIG. 35 is a graph showing the relationship between the data stored in a memory cell of an EEPROM according to the eighth embodiment of the present invention and the threshold value.
Figure 36:
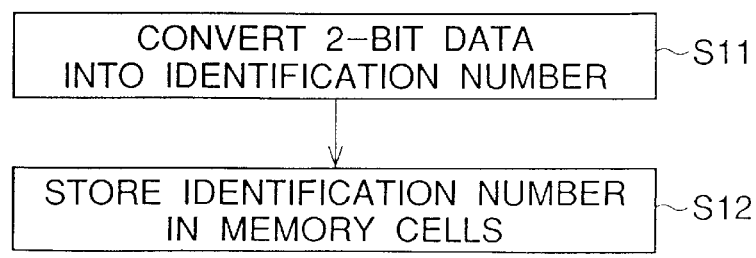
FIG. 36 is a flow chart showing a method of using the EEPROM in the eighth embodiment of the present invention.
Figure 37:
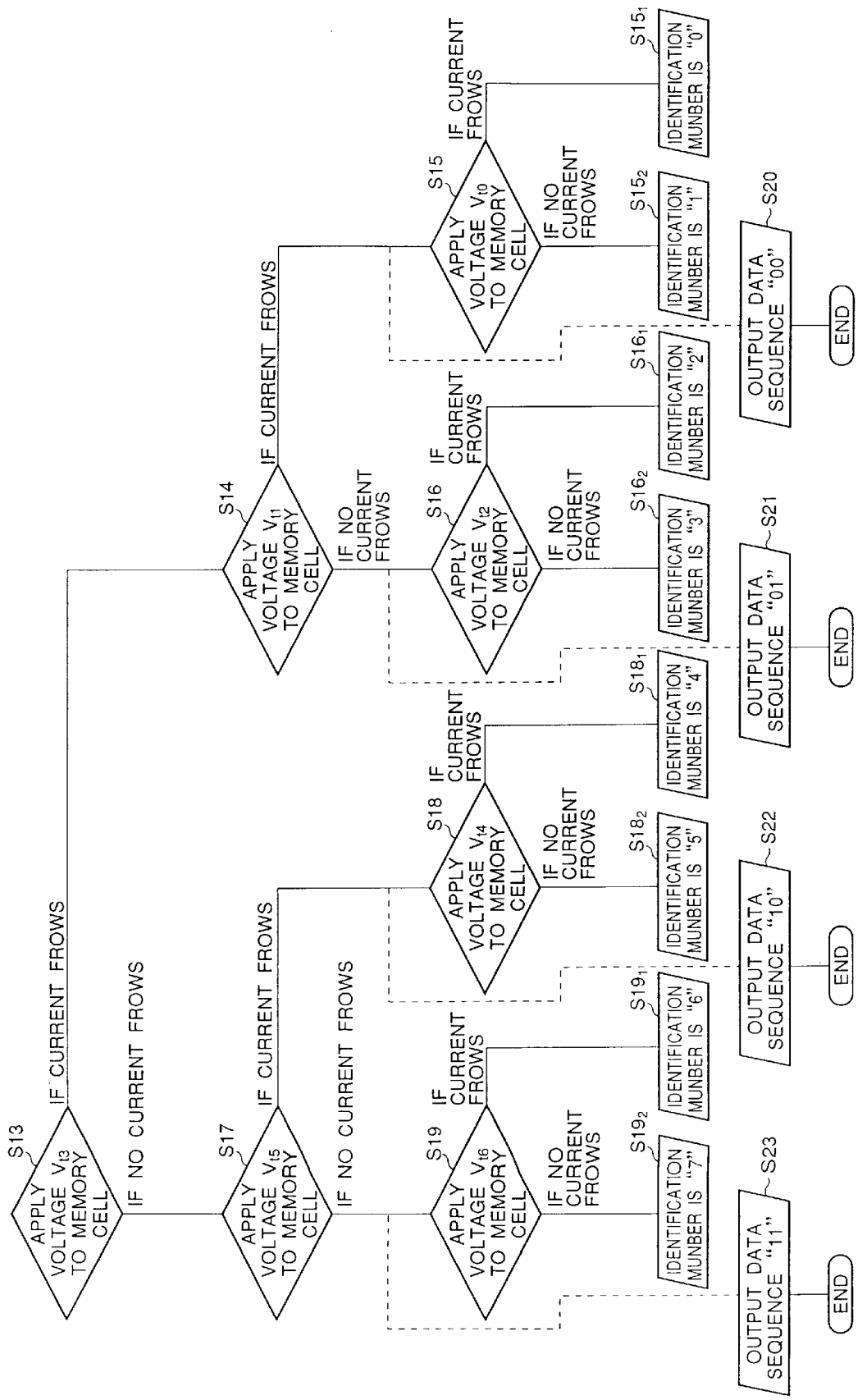
FIG. 37 is a continuation of FIG. 36, and shows the method of using the EEPROM in the eighth embodiment of the present invention.

The eighth embodiment of the present invention will be described below. In this eighth embodiment, an EEPROM as a nonvolatile semiconductor memory including memory cells each capable of storing eight-level (eight types of) information is used to write and read data containing four-level (two bits) information. An outline of the whole arrangement of the EEPROM of the eighth embodiment is the same as in FIG. 30. The main parts of a memory cell of this EEPROM are the same as in FIG. 1. FIG. 35 is a graph showing the relationship between the data stored in a memory cell and the threshold voltage. FIGS. 36 to 38 are flow charts showing a method of using this EEPROM in order of steps.

Similar to the EEPROM of the seventh embodiment, this EEPROM includes an encoding circuit 311, a memory cell array 312, and a decoding circuit 313. The encoding circuit 311 converts binary data. In the memory cell array 312, a large number of memory cells for storing data converted by the encoding circuit 311 are arranged in a matrix manner. The decoding circuit 313 performs error correction, if an error occurs in data of a memory cell, and decodes and outputs the data.

Upon receiving binary data in which a large number of "0"s or "1"s repeat themselves, the encoding circuit 311 divides this binary data in units of two bits to form any of data "00", "01", "10", and "11". The encoding circuit 311 assigns the data to "1", "3", "5", or "7" of eight identification numbers "0", "1", "2", "3", "4", "5", "6", and "7" and stores it in one memory cell. More specifically, as shown in Table 11 below, input data "00", "01", "10", and "11" are converted into identification numbers "1", "3", "5", and "7", respectively.

TABLE 11

|   | two bits binary data | Eight-level identification number |
|---|---|---|
| 0 | 00 | 1 |
| 1 | 01 | 3 |
| 2 | 10 | 5 |
| 3 | 11 | 7 |

Eight identification numbers "0", "1", "2", "3", "4", "5", "6", and "7" can be written in and read out from each memory cell. In a write operation, only "1", "3", "5", and "7" of the eight values are used. That is, in a write operation, an identification number converted by the encoding circuit 311 is stored in one corresponding memory cell.

In a memory cell read operation, the decoding circuit 313 reads out identification numbers "0", "1", "2", "3", "4", "5", "6", and "7" by using eight threshold voltages $V_{t0}$, $V_{t1}$, $V_{t2}$, $V_{t3}$, $V_{t4}$, $V_{t5}$, $V_{t6}$, and $V_{t7}$. If the decoding circuit 313 determines that there is an error in data, the decoding circuit 313 corrects the data as will be described later and outputs the corrected data.

In each memory cell, as shown in FIG. 35, states wherein a threshold voltage $V_t$ is less than $V_{t0}$, $V_{t0}$ to less than $V_{t1}$, $V_{t1}$ to less than $V_{t2}$, $V_{t2}$ to less than $V_{t3}$, $V_{t3}$ to less than $V_{t4}$, $V_4$ to less than $V_{t5}$, $V_{t5}$ to less than $V_{t6}$, and $V_{t6}$ to less than $V_7$ are defined as states "0", "1", "2", "3", "4", "5", "6", and "7", respectively. In state "7", the largest amount of electric charge is stored in a floating gate electrode 5. The stored electric charge gradually decreases from state "6" to state "1". Instate "0", basically no electric charge is stored in the floating gate electrode 5.

If a memory cell deteriorates after the EEPROM is used for long time periods, a data error sometimes occurs in this memory cell. The probability of a transition from a lower state wherein electric charge in the floating gate electrode 5 is reduced to an upper state wherein electric charge is stored therein is much smaller than the probability of a transition from the upper state wherein electric charge is stored in the floating gate electrode 5 to the lower state wherein electric charge therein is reduced. That is, the probability (second transition probability) of a transition of an identification number from state "5" to state "6", from state "3" to state "4", or from state "1" to state "2" is negligibly small compared to the probability (first transition probability) of a transition of an identification number from state "7" to "6", from state "5" to state "4", from state "3" to state "2", or from state "1" to state "0". In addition, the probability (third transition probability) of a two-step transition of an identification number from state "7" to state "5", from state "5" to state "3", or from state "3" to state "1" is negligibly small compared to the first transition probability. Note that the probability that an identification number will change from "7" to "4" or from "1" to "3" can naturally be ignored from the above consideration. In the eighth embodiment, error correction is performed for readout data by using this inherent property of nonvolatile semiconductor memories represented by an EEPROM.

More specifically, assume that the written identification number is "7" and this identification number "7" changes for some reason. When the property that the third transition probability is small is taken into consideration, the probability of change of the identification number into "5" or less upon reading can be ignored. Accordingly, only probability P11 of change of the identification number into "6" upon reading due to the first transition probability need to be considered. If the readout identification number is "6", this identification number has an error, and the correct identification number is "7". Therefore, the decoding circuit 313 outputs original correct data "11" in accordance with the encoding rules of the encoding circuit 311.

Analogously, assume that the written identification number is "5" and this identification number "5" changes for some reason. Since the second and third transition probabilities are small, it is only necessary to consider probability P12 of change into an identification number "4" due to the first transition probability. Accordingly, if the readout identification number is "4", this identification number has an error, and the correct identification number is "5". The decoding circuit 313 outputs original correct data "10" in accordance with the encoding rules of the encoding circuit 311.

Similarly, assume that the written identification number is "3" and this identification number "3" changes for some reason. Since the second and third transition probabilities are small, it is only necessary to consider probability P13 of change into an identification number "2" due to the first transition probability. Accordingly, if the readout identification number is "2", this identification number has an error, and the correct identification number is "3". The decoding circuit 313 outputs original correct data "01" in accordance with the encoding rules of the encoding circuit 311.

Likewise, assume that the written identification number is "1" and this identification number "1" changes for some reason. Since the second transition probability is small, it is only necessary to consider probability P14 of change into an identification number "0" due to the first transition probability. Accordingly, if the readout identification number is "0", this identification number has an error, and the correct identification number is "1". The decoding circuit 313 outputs original correct data "00" in accordance with the encoding rules of the encoding circuit 311.

The above decoding is summarized in Table 12 below.

TABLE 12

|   | Eight-level identification number | two bits binary data |
|---|---|---|
| 0 | 0 | 00 |
|   | 1 |    |
| 1 | 2 | 01 |
|   | 3 |    |
| 2 | 4 | 10 |
|   | 5 |    |
| 3 | 6 | 11 |
|   | 7 |    |

Methods (write and read methods) of using the EEPROM while performing error correction by using the above property will be described below with reference to FIGS. 36 to 38.

First, as shown in FIG. 36, the encoding circuit 311 divides input binary data in units of two bits to form any of data "00", "01", "10", and "11" and converts the data into a corresponding one of identification numbers "1", "3", "5", and "7" (step S11).

Next, the encoding circuit 311 stores the converted identification number in a corresponding memory cell (step S12). More specifically, to store "7", the encoding circuit 311 applies a voltage to a control gate electrode 6 of a memory cell so that its threshold voltage $V_t$ is the voltage $V_{t6}$ to less than the voltage $V_{t7}$. To store "5", the encoding circuit 311 applies a voltage is the control gate electrode 6 of a memory cell so that its threshold voltage $V_t$ is $V_{t4}$ to less than the voltage $V_{t5}$. To store "3", the encoding circuit 311 applies a voltage to the control gate electrode 6 of a memory cell so that its threshold voltage $V_t$ is the voltage $V_{t2}$ to less than the voltage $V_{t3}$. To store "1", the encoding circuit 311 applies a voltage to the control gate electrode 6 of a memory cell so that its threshold voltage $V_t$ is $V_{t0}$ to less than the voltage $V_{t1}$. The above steps S11 and S12 form an EEPROM write method.

An operation of reading out an identification number stored in a memory cell and outputting the readout number after converting it into binary data as shown in FIG. 37 will be described below. More specifically, the decoding circuit 313 selects a predetermined memory cell from the memory cell array 312 and applies the voltage $V_{t3}$ to the control gate electrode 6 of the memory cell to check whether a current flows (step S13).

If a current flows between a source 3 and a drain 4 in step S13, the decoding circuit 313 further applies the voltage $V_{t1}$ to the control gate electrode 6 (step S14). If a current flows between the source 3 and the drain 4 in step S14, the decoding circuit 313 further applies the voltage $V_{t0}$ to the control gate electrode 6 (step S15). If a current flows between the source and the drain in step S15, the decoding circuit 313 determines that the identification number stored in this memory cell is "0" (step S15$_1$). If no current flows, the decoding circuit 313 determines that the identification number stored in the memory cell is "1" (step S15$_2$).

If no current flows between the source 3 and the drain 4 in step S14, the decoding circuit 313 further applies the voltage $V_{t2}$ to the control gate electrode 6 (step S16). If a current flows between the source 3 and the drain 4 in step S16, the decoding circuit 313 determines that the identification number stored in the memory cell is "2" (step S16$_1$). If no current flows, the decoding circuit 313 determines that the identification number stored in the memory cell is "3" (step S16$_2$).

On the other hand, if no current flows between the source 3 and the drain 4 in step S13, the decoding circuit 313 further applies the voltage $V_{t5}$ to the control gate electrode 6 (step S17). If a current flows between the source 3 and the drain 4 in step S17, the decoding circuit 313 further applies the voltage $V_{t4}$ to the control gate electrode 6 (step S18). If a current flows between the source 3 and the drain 4 in step S18, the decoding circuit 313 determines that the identification number stored in the memory cell is "4" (step S18$_1$). If no current flows, the decoding circuit 313 determines that the identification number stored in the memory cell is "5" (step S18$_2$).

If no current flows between the source 3 and the drain 4 in step S17, the decoding circuit 313 further applies the voltage $V_{t6}$ to the control gate electrode 6 (step S19). If a current flows between the source 3 and the drain 4 in step S19, the decoding circuit 313 determines that the identification number stored in the memory cell is "6" (step S19$_1$). If no current flows, the decoding circuit 313 determines that the identification number stored in the memory cell is "7" (step S19$_2$).

Next, as shown in FIG. 38, the decoding circuit 313 outputs the identification number after decoding it into binary data. More specifically, if the identification number is "0", the decoding circuit 313 determines "1" as the original identification number in accordance with the aforementioned rules, and outputs "00" as correct data (step S20). If the identification number is "1", this identification number has no data error, so the decoding circuit 313 outputs "00" as correct data (step S20). If the identification number is "2", the decoding circuit 313 determines "3" as the original identification number in accordance with the aforementioned rules, and outputs "01" as a correct data sequence (step S21). If the identification number is "3", this identification number has no data error, so the decoding circuit 313 outputs "01" as correct data (step S21).

If the identification number is "4", the decoding circuit 313 determines "5" as the original identification number in accordance with the aforementioned rules, and outputs "10" as correct data (step S22). If the identification number is "5", this identification number has no data error, so the decoding circuit 313 outputs "10" as correct data (step S22). If the identification number is "6", the decoding circuit 313 determines "7" as the original identification number in accordance with the aforementioned rules, and outputs "11" as a correct data sequence (step S23). If the identification number is "7", this identification number has no data error, so the decoding circuit 313 outputs "11" as correct data (step S23).

A simpler method can also be used in reading out, converting, and outputting an identification number stored in a memory cell. That is, as indicated by the broken lines in FIG. 37, if a current flows in step S14, "00" is determined as the original data and output (step S20). If no current flows in step S14, "01" is determined as the original data and output (step S21). Also, if a current flows in step S17, "10" is regarded as the original data and output (step S22). If no current flows in step S17, "11" is determined as the original data and output (step S23).

In the EEPROM of the eighth embodiment as described above, in writing and reading out four-level (two bits) data, a multi-level memory cell capable of storing eight-level (three bits) data is used to convert input data into an identification number in accordance with the aforementioned assignment rules. In a read operation, only the first transition probability is taken into consideration. In this manner, it is possible to simply and accurately perform error correction and obtain correct data with high probability. This essentially amounts to adding one redundancy bit to two information bits. Consequently, error correction can be efficiently and accurately performed in an EEPROM having a memory cell array made up of multi-level memory cells.

Additionally, only one three bits, multi-level memory cell need to be used to store one two bits data in an error correctable state. Therefore, it is well possible to further increase the capacity of a device.

Note that the seventh and eighth embodiments have been explained by taking an EEPROM as an example of a nonvolatile semiconductor memory. However, the present invention is not limited to these embodiments. That is, the present invention is applicable to any device having a storage electrode layer. Examples are an EPROM, an MNOS, and a flash memory. The present invention can also be applied to a DRAM as a volatile semiconductor memory under predetermined conditions.

Note also that input binary data need not be divided in units of bits or two bits as in the seventh and eighth embodiments. In principle, N-bit (N is an integer of 1 or more) data can be stored by using an (N+1)-bit, multi-level memory. Accordingly, the present invention is equivalent to adding one redundancy bit to N information bits.

The EEPROM of the seventh and eighth embodiments includes a switching means 101 as shown in FIG. 11. This switching means 101 is used to switch between a case wherein a fixed number of memory cells (e.g., half) making up the memory cell array 212 are used for parity bits for error correction and a case wherein all of the memory cells 10 are used for common information bits. That is, it is sometimes necessary to attach importance to the accuracy of information even at the sacrifice of the storage capacity to some extent. Conversely, the storage capacity must be fully utilized in some instances. The switching means 101 achieves such various purposes of the EEPROM.

The present invention includes program codes for operating, e.g., a common EEPROM to realize the functions of the use methods explained with reference to FIGS. 32 to 34 and 36 to 38 in the seventh and eighth embodiments, and means for supplying the program codes to a computer, e.g., a storage medium 321 storing the program codes as shown in FIG. 30.

If this is the case, a memory reader 322 reads out the program codes from the storage medium 321 and operates an EEPROM. As this storage medium 321 for storing the program codes, it is possible to use a floppy disk, a hard disk, an optical disk, a magnetooptical disk, a CD-ROM, a magnetic tape, a nonvolatile memory card, or a ROM.

Also, not only when the functions of each embodiment are realized by executing supplied program codes by a computer, but also when the program codes cooperate with an OS (Operating System) or some other application software running on the computer and realize the functions of each embodiment, the present invention includes these program codes.

Furthermore, the present invention also includes a system wherein, after supplied program codes are written in a function extension board of a computer or in a memory of a function extension unit connected to the computer, a CPU or the like incorporated into the function extension board or the function extension unit partially or entirely performs an actual process in accordance with instructions from the program codes and realizes the functions of each embodiment.

What is claimed is:

1. A semiconductor memory comprising a plurality of memory cells having a charge storage layer, a gate electrode, and a source/drain to change a charge storage state step by step in said charge storage layer by applying a predetermined voltage to at least said gate electrode and said source/drain, identification numbers defined in a one-to-one correspondence with the storage states being written and read out by checking a charge storage state in said charge storage layer, comprising:

encoding means for converting input data sequences into at least alternate predetermined ones of identification numbers more than a possible number of data sequences;

storage means having said memory cells arranged in a matrix manner to store the identification numbers in corresponding memory cells; and decoding means for detecting an identification number stored in a selected predetermined memory cell, reading out the identification number from said memory cell by performing error correction, if an error occurs in the identification number, assuming that the error has occurred due to a first transition from an upper state in which electric charge is stored in said charge storage layer to a lower state in which electric charge is emitted therefrom by using a property that a probability of a second transition from the lower state in which electric charge is emitted from said charge storage layer to the upper state in which electric charge is stored therein is negligibly small compared to a probability of the first transition, decoding the identification number into the data sequence on the basis of the conversion, and outputting the data sequence.

2. A semiconductor memory comprising:

converting means for forming a data sequence by adding a redundancy bit identical with an information bit having a predetermined number to the information bit;

storage means in which a plurality of memory cells each including a charge storage layer and a gate electrode are arranged in a matrix manner and bits forming the data sequence are stored in corresponding memory cells; and correcting means for selecting predetermined memory cells from said storage means, detecting the bits stored in said memory cells to form the data sequence, calculating ORs of corresponding bits of the information bit and the redundancy bit of the data sequence to reconstruct a data sequence by using a property that a probability of a second transition from a state in which electric charge is emitted from said charge storage layer to a state in which electric charge is stored therein is negligibly small compared to a probability of a first transition from the state in which electric charge is stored in said charge storage layer to the state in which electric charge is emitted therefrom, and outputting the reconstructed data sequence assuming that the reconstructed data sequence is equal to the information bit.

3. A nonvolatile semiconductor device comprising:

multi-level nonvolatile memory cells each settable at a threshold level selected at least among a first, a second and a third threshold levels, said multi-level nonvolatile memory cell comprising a control gate, charge storage layer and source/drain, said charge storage layer being capable of storing electric charges, said threshold levels and said electric charges having relations:

first charges corresponding to said first threshold level, second charges corresponding to said second threshold level, third charges corresponding to said third threshold level, said third charges being larger than the second charges, and said first charges being smaller than the second charges, the probability of transition from said second charges to said third charges being smaller than the probability of transition from said third charges to said second charges, and the probability of transition from said first charges to said second charges being smaller than the probability of transition from said second charges to said first charges, said device further comprising:

setting means for setting said multi-level nonvolatile memory cell at a predetermined threshold level and means for identifying said threshold level in order of higher probability of transition when said threshold level set by said setting means has transferred to another threshold level.

* * * * *